United States Patent
Kusumoto

(10) Patent No.: US 10,109,667 B2
(45) Date of Patent: Oct. 23, 2018

(54) IMAGING DEVICE, MODULE, AND ELECTRONIC DEVICE

(71) Applicant: Semiconductor Energy Laboratory Co., Ltd., Atsugi-shi, Kanagawa-ken (JP)

(72) Inventor: Naoto Kusumoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/279,735

(22) Filed: Sep. 29, 2016

(65) Prior Publication Data

US 2017/0104025 A1    Apr. 13, 2017

(30) Foreign Application Priority Data

Oct. 9, 2015 (JP) ................. 2015-201066

(51) Int. Cl.
*H01L 27/146* (2006.01)
*H04N 5/225* (2006.01)
(Continued)

(52) U.S. Cl.
CPC .... *H01L 27/14641* (2013.01); *H01L 27/1461* (2013.01); *H01L 27/14616* (2013.01);
(Continued)

(58) Field of Classification Search
CPC .... H01L 27/14643–27/14647; H01L 29/7869; H01L 29/78693; H04N 5/374–5/37457
See application file for complete search history.

(56) References Cited

U.S. PATENT DOCUMENTS 7,674,650 B2    3/2010 Akimoto et al.
8,378,391 B2    2/2013 Koyama et al.
(Continued)

FOREIGN PATENT DOCUMENTS

JP    2007-096055 A    4/2007
JP    2007-123861 A    5/2007
JP    2011-119711 A    6/2011

OTHER PUBLICATIONS

Funatsu.R et al., "133Mpixel 60fps CMOS Image Sensor with 32-Column Shared High-Speed Column-Parallel SAE ADCs", ISSCC 2015 (Digest of Technical Papers, IEEE International Solid-State Circuits Conference), Feb. 23, 2015, pp. 112-113.

(Continued)

*Primary Examiner* — Daniel Shook
(74) *Attorney, Agent, or Firm* — Fish & Richardson P.C.

(57) ABSTRACT

An imaging device that has a structure where a transistor is used in common by a plurality of pixels and is capable of imaging with a global shutter system is provided. A transistor that resets the potential of a charge detection portion, a transistor that outputs a signal corresponding to the potential of the charge detection portion, and a transistor that selects a pixel are used in common by the plurality of pixels. A transistor is provided between a power supply line and a photoelectric conversion element. Exposure is performed by turning on the transistor. Imaging data is retained in a charge retention portion by turning off the transistor.

20 Claims, 55 Drawing Sheets

(51) Int. Cl.
*H04N 5/232* (2006.01)
*H01L 29/786* (2006.01)
*H01L 31/0272* (2006.01)

(52) U.S. Cl.
CPC .. *H01L 27/14643* (2013.01); *H01L 27/14692* (2013.01); *H04N 5/2253* (2013.01); *H04N 5/2254* (2013.01); *H04N 5/23293* (2013.01); *H01L 29/7869* (2013.01); *H01L 31/0272* (2013.01)

(56) References Cited

U.S. PATENT DOCUMENTS

| | | | |
|---|---|---|---|
| 8,461,590 B2 | 6/2013 | Tamura et al. | |
| 8,586,905 B2 | 11/2013 | Kurokawa | |
| 8,654,231 B2 | 2/2014 | Kurokawa et al. | |
| 8,674,972 B2 | 3/2014 | Kurokawa et al. | |
| 8,698,782 B2 | 4/2014 | Kurokawa | |
| 8,766,338 B2 | 7/2014 | Kurokawa et al. | |
| 8,836,626 B2 | 9/2014 | Ikeda | |
| 8,872,120 B2 | 10/2014 | Kurokawa et al. | |
| 8,952,313 B2 | 2/2015 | Tamura | |
| 9,055,245 B2 | 6/2015 | Kozuma | |
| 2011/0176038 A1 | 7/2011 | Kurokawa et al. | |
| 2011/0198483 A1 | 8/2011 | Kurokawa | |
| 2011/0215323 A1 | 9/2011 | Kurokawa et al. | |
| 2011/0220889 A1 | 9/2011 | Kurokawa et al. | |
| 2011/0221723 A1 | 9/2011 | Kurokawa et al. | |
| 2012/0002090 A1 | 1/2012 | Aoki et al. | |
| 2012/0056861 A1 | 3/2012 | Kurokawa et al. | |
| 2012/0146027 A1 | 6/2012 | Tamura et al. | |
| 2012/0162167 A1 | 6/2012 | Kurokawa | |
| 2012/0182791 A1 | 7/2012 | Koyama et al. | |
| 2012/0327281 A1 | 12/2012 | Mabuchi | |
| 2013/0015326 A1 | 1/2013 | Tamura | |
| 2013/0016035 A1 | 1/2013 | Ikeda | |
| 2013/0075594 A1 | 3/2013 | Kozuma | |
| 2013/0299888 A1 | 11/2013 | Kurokawa et al. | |
| 2013/0321366 A1 | 12/2013 | Kozuma et al. | |
| 2014/0027768 A1 | 1/2014 | Kurokawa | |
| 2014/0054466 A1 | 2/2014 | Kurokawa et al. | |
| 2014/0211056 A1 | 7/2014 | Fan | |
| 2014/0267864 A1 | 9/2014 | Kurokawa et al. | |
| 2014/0361296 A1 | 12/2014 | Ikeda | |
| 2015/0028335 A1 | 1/2015 | Kurokawa et al. | |
| 2015/0079728 A1 | 3/2015 | Yamazaki | |
| 2015/0129944 A1 | 5/2015 | Kurokawa et al. | |
| 2015/0145006 A1 | 5/2015 | Tamura | |
| 2015/0236061 A1 | 8/2015 | Kurokawa | |
| 2015/0279896 A1 | 10/2015 | Kurokawa et al. | |
| 2015/0296162 A1 | 10/2015 | Kurokawa et al. | |
| 2015/0334321 A1 | 11/2015 | Kozuma | |
| 2015/0340392 A1 | 11/2015 | Ikeda | |
| 2015/0357476 A1 | 12/2015 | Kurokawa et al. | |
| 2016/0021319 A1 | 1/2016 | Okamoto et al. | |
| 2016/0064443 A1 | 3/2016 | Inoue et al. | |
| 2016/0064444 A1* | 3/2016 | Inoue | H01L 29/7869 257/43 |
| 2016/0118426 A1 | 4/2016 | Kurokawa et al. | |
| 2016/0126275 A1 | 5/2016 | Kurokawa | |
| 2016/0165159 A1 | 6/2016 | Hseih et al. | |
| 2016/0307949 A1* | 10/2016 | Madurawe | H04N 5/3698 |
| 2017/0013214 A1 | 1/2017 | Ohmaru | |
| 2017/0069673 A1 | 3/2017 | Ikeda | |
| 2017/0084649 A1 | 3/2017 | Ohmaru et al. | |

OTHER PUBLICATIONS

Matsuzawa.T et al., "Development of an Amorphous Selenium-Based Photodetector Driven by a Diamond Cold Cathode", Sensors, Oct. 11, 2013, vol. 13, No. 10, pp. 13744-13778.

* cited by examiner

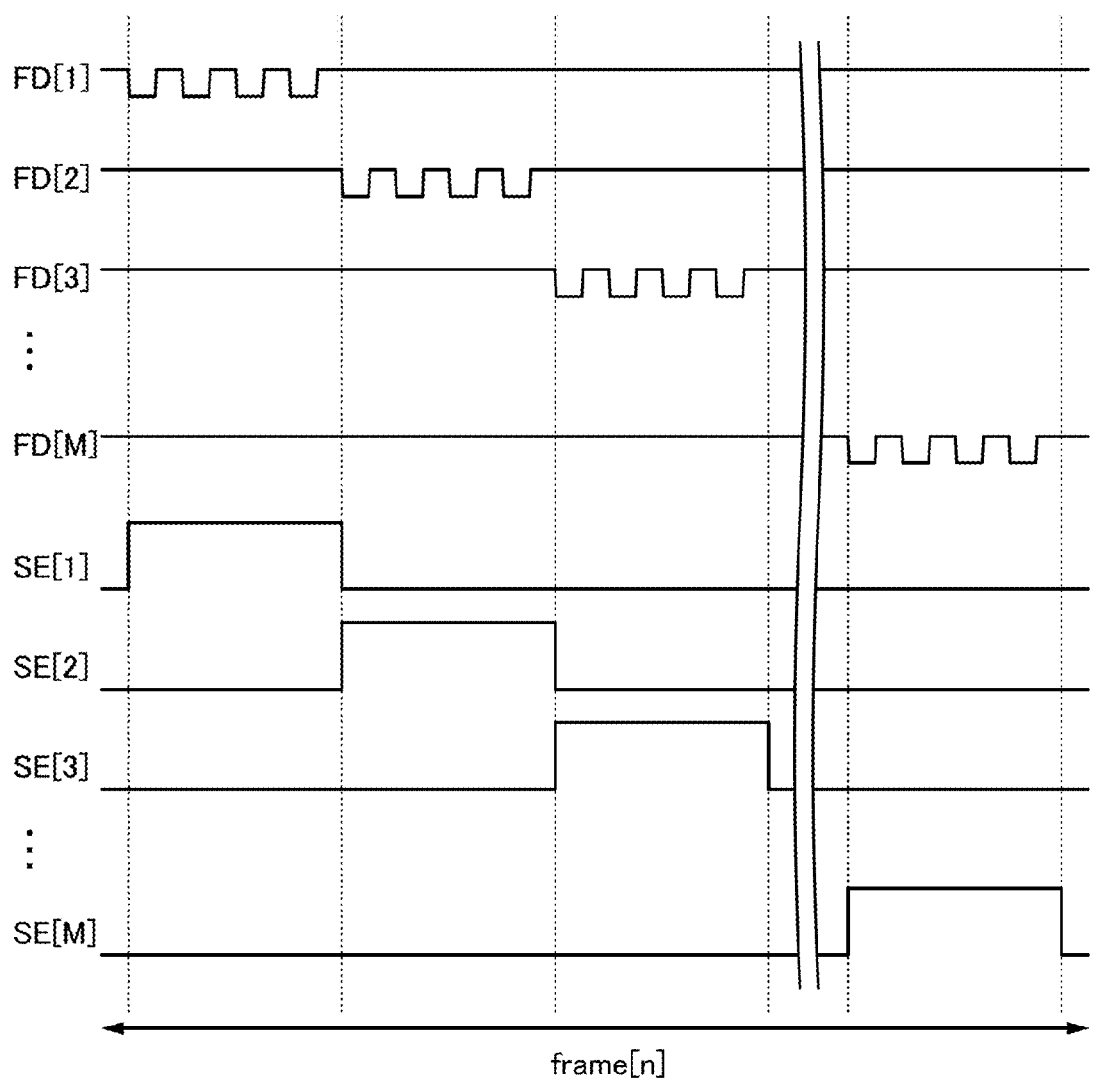

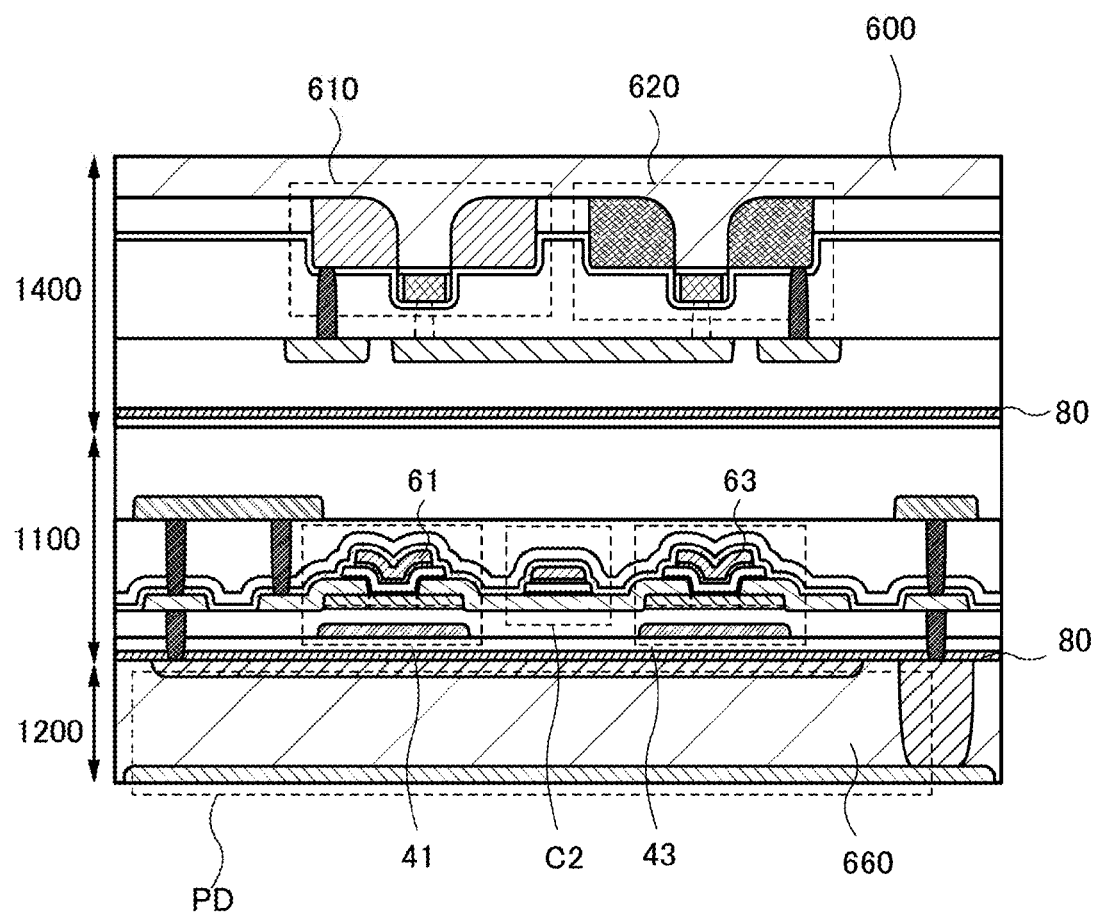

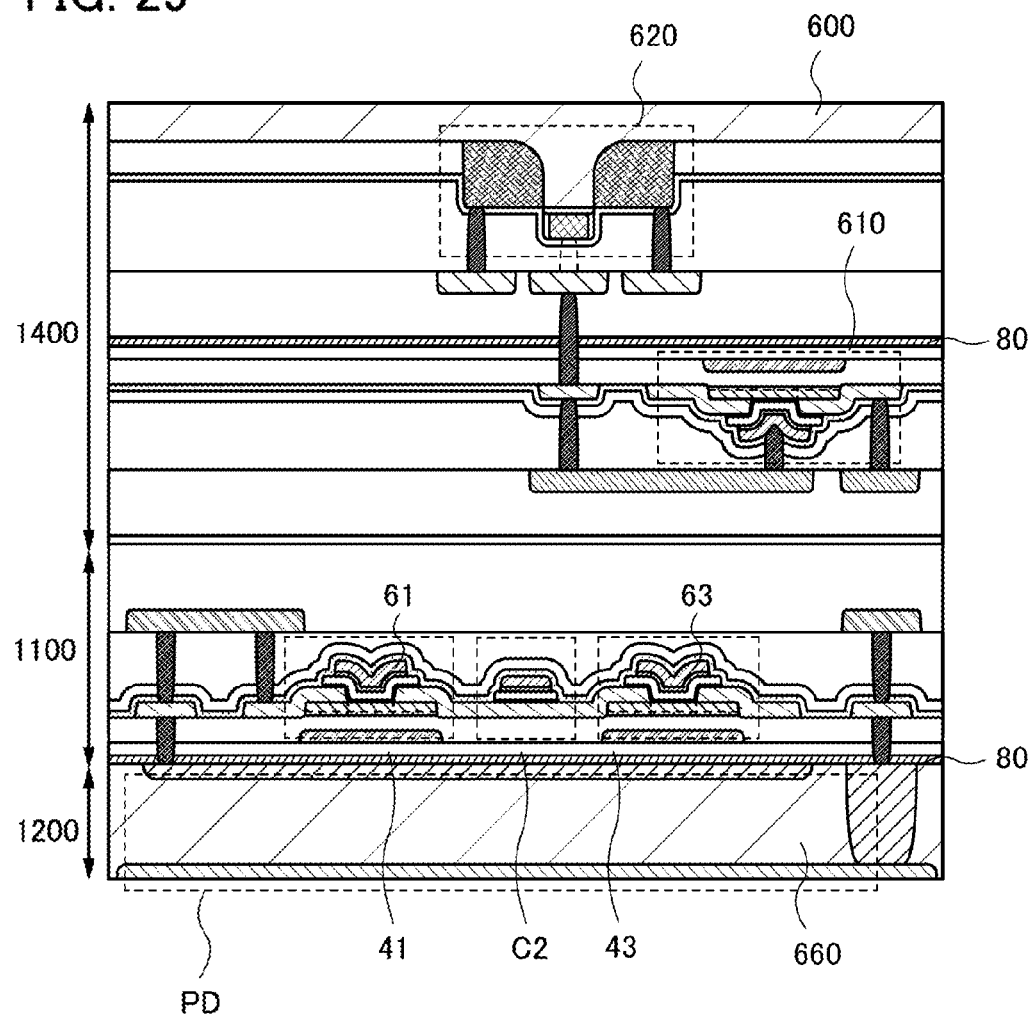

FIG. 33A1
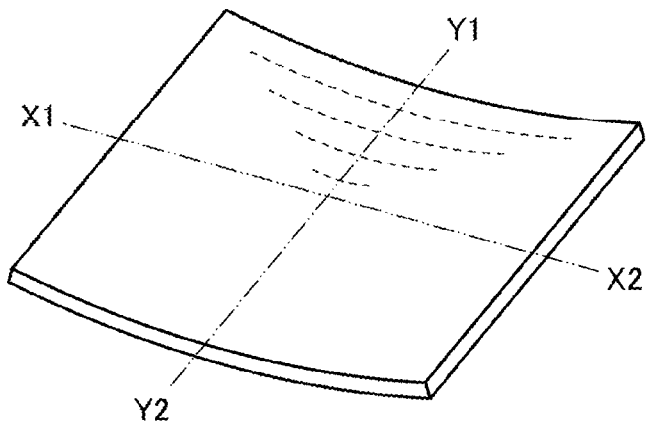
FIG. 33A2
FIG. 33A3
FIG. 33B1
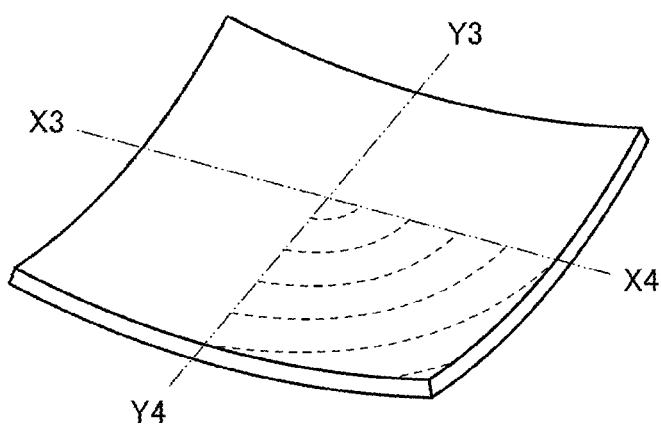
FIG. 33B2
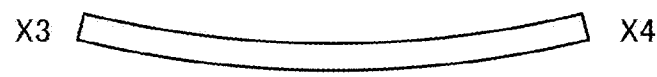
FIG. 33B3
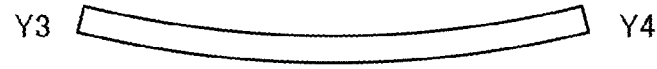

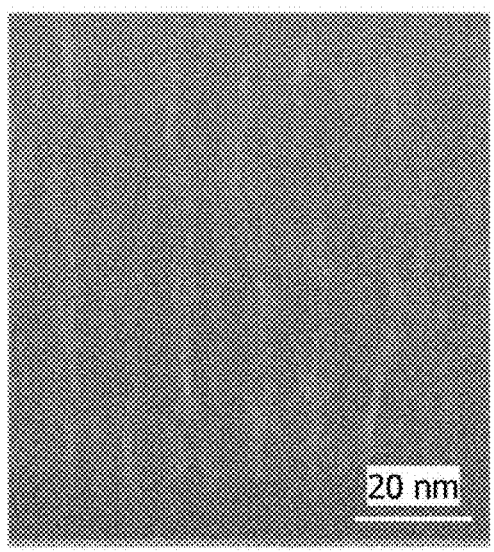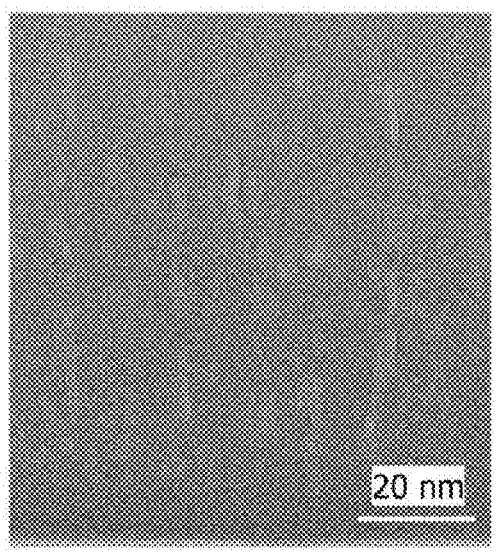

IMAGING DEVICE, MODULE, AND ELECTRONIC DEVICE

BACKGROUND OF THE INVENTION

1. Field of the Invention

One embodiment of the present invention relates to an imaging device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a storage device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

An oxide semiconductor has attracted attention as a semiconductor material applicable to the transistor. For example, a technique for forming a transistor using zinc oxide or an In—Ga—Zn-based oxide semiconductor as an oxide semiconductor is disclosed (see Patent Documents 1 and 2).

Patent Document 3 discloses an imaging device in which a transistor including an oxide semiconductor is used in part of a pixel circuit.

REFERENCE

Patent Document 1: Japanese Published Patent Application No. 2007-123861
Patent Document 2: Japanese Published Patent Application No. 2007-096055
Patent Document 3: Japanese Published Patent Application No. 2011-119711

SUMMARY OF THE INVENTION

CMOS image sensors have been incorporated in a variety of devices, and the increase in resolution has been required. A pixel array where pixels with reduced area are densely arranged is needed to obtain high-resolution images.

In the case where the pixel area is reduced, it is also effective to reduce not only a design rule but also the number of devices such as transistors. For example, some components included in a pixel circuit are used in common by a plurality of pixels.

An imaging device preferably employs a global shutter system capable of imaging of a fast moving object without distortion. However, in the global shutter system, imaging data are obtained in all the pixels at the same time and sequentially read; thus, the data need to be retained in a charge retention portion for a long time. In addition, it is necessary to provide a charge retention portion for each pixel. Therefore, when operation with the global shutter system is assumed, it is difficult to employ a circuit structure where a charge retention portion or the like is used in common by a plurality of pixels.

An object of one embodiment of the present invention is to provide an imaging device where a transistor can be used in common by a plurality of pixels. Another object of one embodiment of the present invention is to provide an imaging device where a wiring can be used in common by a plurality of pixels. Another object of one embodiment of the present invention is to provide an imaging device that has a structure where a transistor is used in common by a plurality of pixels and that is capable of imaging with a global shutter system. Another object of one embodiment of the present invention is to provide an imaging device capable of imaging with little noise. Another object of one embodiment of the present invention is to provide an imaging device that is suitable for high-speed operation. Another object of one embodiment of the present invention is to provide an imaging device with high resolution. Another object of one embodiment of the present invention is to provide a highly integrated imaging device. An object of one embodiment of the present invention is to provide an imaging device capable of imaging under a low illuminance condition. Another object of one embodiment of the present invention is to provide an imaging device that can be used in a wide temperature range. Another object of one embodiment of the present invention is to provide an imaging device with a high aperture ratio. Another object of one embodiment of the present invention is to provide an imaging device with high reliability. Another object of one embodiment of the present invention is to provide a novel imaging device or the like. Another object of one embodiment of the present invention is to provide a method for operating any of the imaging devices. Another object of one embodiment of the present invention is to provide a novel semiconductor device or the like.

The description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device where a transistor or the like can be used in common by a plurality of pixels.

One embodiment of the present invention is an imaging device that includes a first transistor, a second transistor, a third transistor, a fourth transistor, a fifth transistor, a photoelectric conversion element, a first capacitor, and a second capacitor. One electrode of the photoelectric conversion element is electrically connected to one of a source and a drain of the first transistor and one electrode of the first capacitor. The other electrode of the photoelectric conversion element is electrically connected to one of a source and a drain of the second transistor. The other of the source and the drain of the first transistor is electrically connected to one of a source and a drain of the third transistor, one electrode of the second capacitor, and a gate of the fourth transistor. One of a source and a drain of the fourth transistor is electrically connected to one of a source and a drain of the fifth transistor. The first transistor, the second transistor, and the third transistor each include an oxide semiconductor in a region where a channel is formed.

Another embodiment of the present invention is an imaging device that includes a first pixel and a second pixel. The first pixel includes a first transistor, a second transistor, a third transistor, a fourth transistor, a fifth transistor, a first photoelectric conversion element, a first capacitor, and a second capacitor. The second pixel includes a sixth transistor, a seventh transistor, the third transistor, the fourth transistor, the fifth transistor, a second photoelectric conversion element, a third capacitor, and the second capacitor. One electrode of the first photoelectric conversion element is electrically connected to one of a source and a drain of the first transistor and one electrode of the first capacitor. The other electrode of the first photoelectric conversion element is electrically connected to one of a source and a drain of the second transistor. The other of the source and the drain of the first transistor is electrically connected to one of a source and a drain of the third transistor, one electrode of the second capacitor, and a gate of the fourth transistor. One of a source and a drain of the fourth transistor is electrically connected to one of a source and a drain of the fifth transistor. One electrode of the second photoelectric conversion element is electrically connected to one of a source and a drain of the sixth transistor and one electrode of the third capacitor. The other electrode of the second photoelectric conversion element is electrically connected to one of a source and a drain of the seventh transistor. The other of the source and the drain of the sixth transistor is electrically connected to one of a source and a drain of the third transistor, the one electrode of the second capacitor, and the gate of the fourth transistor. The first transistor, the second transistor, the third transistor, the sixth transistor, and the seventh transistor each include an oxide semiconductor in a region where a channel is formed.

A gate of the second transistor can be electrically connected to a gate of the seventh transistor.

The oxide semiconductor preferably includes In, Zn, and M (M is Al, Ga, Y, or Sn). The fourth transistor and the fifth transistor may each include an oxide semiconductor in a region where a channel is formed.

The photoelectric conversion element can contain selenium or a compound containing selenium in a photoelectric conversion layer. For example, amorphous selenium or crystalline selenium can be used as selenium.

According to one embodiment of the present invention, an imaging device where a transistor can be used in common by a plurality of pixels can be provided. An imaging device where a wiring can be used in common by a plurality of pixels can be provided. An imaging device that has a structure where a transistor is used in common by a plurality of pixels and that is capable of imaging with a global shutter system can be provided. An imaging device capable of imaging with little noise can be provided. An imaging device that is suitable for high-speed operation can be provided. An imaging device with high resolution can be provided. A highly integrated imaging device can be provided. An imaging device capable of imaging under a low illuminance condition can be provided. An imaging device that can be used in a wide temperature range can be provided. An imaging device with a high aperture ratio can be provided. An imaging device with high reliability can be provided. A novel imaging device or the like can be provided. A method for operating any of the imaging devices can be provided. A novel semiconductor device or the like can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:

FIG. 11 is a timing chart illustrating operation of an imaging device;

FIG. 28 is a cross-sectional view illustrating an imaging device;

FIG. 29 is a cross-sectional view illustrating an imaging device;

FIGS. 33A1, 33A2, 33A3, 33B1, 33B2, and 33B3 illustrate a bent imaging device;

FIGS. 51A and 51B show cross-sectional TEM images of an a-like OS;

DETAILED DESCRIPTION OF THE INVENTION

Figure 1:
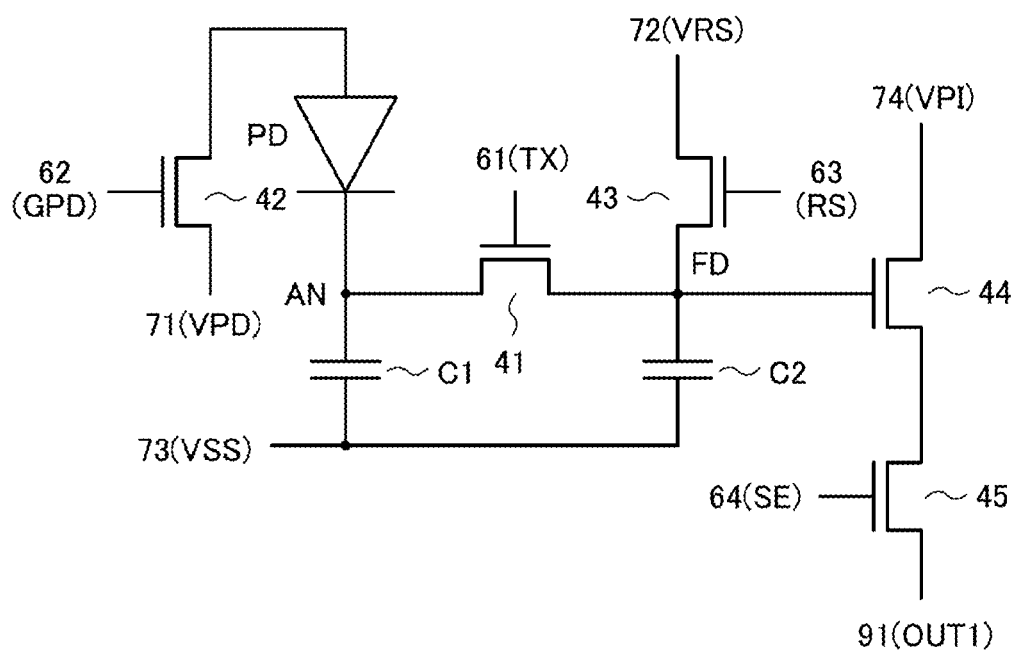
FIG. 1 is a circuit diagram illustrating a pixel.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Note that ordinal numbers such as "first" and "second" are used for convenience and do not denote the order of steps or the stacking order of layers. Therefore, for example, the term "first" can be replaced with the term "second," "third," or the like as appropriate. In addition, the ordinal numbers in this specification and the like do not correspond to the ordinal numbers which specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected."

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order." When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path." It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path." Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

Note that the terms "film" and "layer" can be interchanged with each other depending on circumstances or conditions. For example, the term "conductive layer" can be changed into the term "conductive film" in some cases. In addition, the term "insulating film" can be changed into the term "insulating layer" in some cases.

Note that in general, a potential (voltage) is relative and is determined depending on the amount relative to a certain potential. Therefore, even when the expression "ground", "GND", or the like is used, the potential is not necessarily 0 V. For example, the "ground potential" or "GND" might be defined using the lowest potential in a circuit as a reference. Alternatively, the "ground potential" or "GND" might be defined using an intermediate potential in a circuit as a reference. In those cases, a positive potential and a negative potential are set using the potential as a reference.

(Embodiment 1)

In this embodiment, an imaging device that is one embodiment of the present invention is described with reference to drawings.

One embodiment of the present invention relates to an imaging device that has a circuit structure where a transistor that resets the potential of a charge detection portion, a transistor that outputs a signal corresponding to the potential of the charge detection portion, and a transistor that selects a pixel are used in common by a plurality of pixels and that is capable of imaging with a global shutter system, and a method for driving the imaging device.

The number of transistors per pixel can be reduced, so that the pixel area can be reduced. In other words, pixels can be highly integrated to obtain high-resolution images.

In one embodiment of the present invention, a transistor is provided between a power supply line and a photoelectric conversion element. Exposure is performed by turning on the transistor. Imaging data is retained in a charge retention portion by turning off the transistor. Reading operation is performed by sequentially transferring the imaging data to a charge detection portion.

As some or all of the transistors used in the pixels in the imaging device, transistors each including an oxide semiconductor in a channel formation region can be used. The transistor has low off-state current and therefore facilitates construction of a memory for retaining data in the pixel.

FIG. 1 is a circuit diagram of a pixel 20 included in an imaging device in one embodiment of the present invention. Note that an example in which transistors are n-channel transistors is illustrated in FIG. 1 and the like; however, one embodiment of the present invention is not limited thereto, and some transistors may be replaced with p-channel transistors.

In the pixel 20, one electrode of a photoelectric conversion element PD is electrically connected to one of a source and a drain of a transistor 41 and one electrode of a capacitor C1. The other electrode of the photoelectric conversion element PD is electrically connected to one of a source and a drain of a transistor 42. The other of the source and the drain of the transistor 41 is electrically connected to one of a source and a drain of a transistor 43 and one electrode of a capacitor C2. The other of the source and the drain of the transistor 41 is electrically connected to a gate of a transistor 44. One of a source and a drain of the transistor 44 is electrically connected to one of a source and a drain of a transistor 45.

Here, a node AN to which the one electrode of the photoelectric conversion element PD, the one of the source and the drain of the transistor 41, and the one electrode of the capacitor C1 are connected is a charge retention portion. Furthermore, a node FD to which the other of the source and the drain of the transistor 41, the one of the source and the drain of the transistor 43, the gate of the transistor 44, and the one electrode of the capacitor C2 are connected is a charge detection portion.

Note that in one embodiment of the present invention, the potential of the node AN is changed by turning on the transistor 42; however, when the capacitance value of a wiring that connects the other electrode of the photoelectric conversion element PD to the transistor 42 is comparatively high, the potential of the node AN might be slightly changed even after turning off the transistor 42. Therefore, it is preferable that the capacitor C1 be provided on the one electrode side of the photoelectric conversion element PD so that the capacitance value of the node AN is much higher than the capacitance value of the wiring on the other electrode side of the photoelectric conversion element PD. Note that when the capacitance value of the wiring that connects the other electrode of the photoelectric conversion element PD to the transistor 42 is sufficiently low, the capacitor C1 may be omitted.

In FIG. 1, the other of the source and the drain of the transistor 42 is electrically connected to a wiring 71 (VPD). The other of the source and the drain of the transistor 43 is electrically connected to a wiring 72 (VRS). The other electrode of the capacitor C1 and the other electrode of the capacitor C2 are electrically connected to a wiring 73 (VSS). The other of the source and the drain of the transistor 44 is electrically connected to a wiring 74 (VPI). The other of the source and the drain of the transistor 45 is electrically connected to a wiring 91 (OUT1).

Note that connection between a component (e.g., a transistor or a capacitor) and a wiring in FIG. 1 is an example. Components might be electrically connected to different wirings, or a plurality of components might be electrically connected to the same wiring.

Figure 2A:
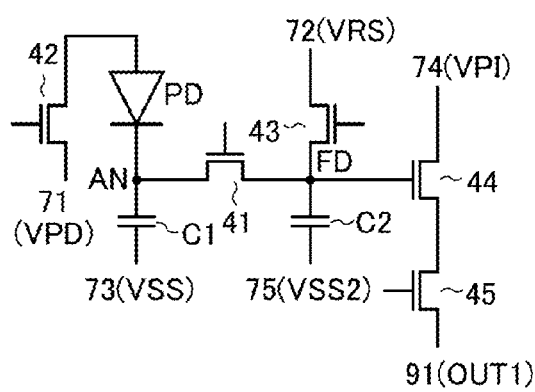
FIGS. 2A to 2F are circuit diagrams each illustrating a pixel.
Figure 2B:
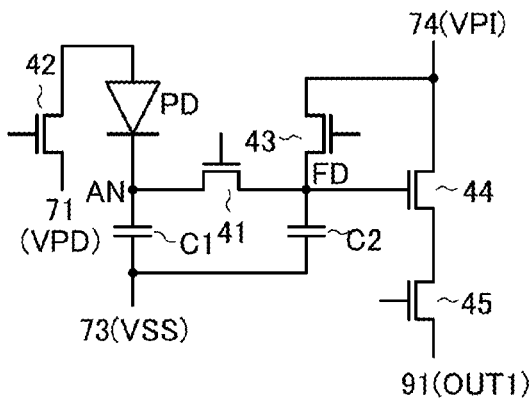
Figure 2C:
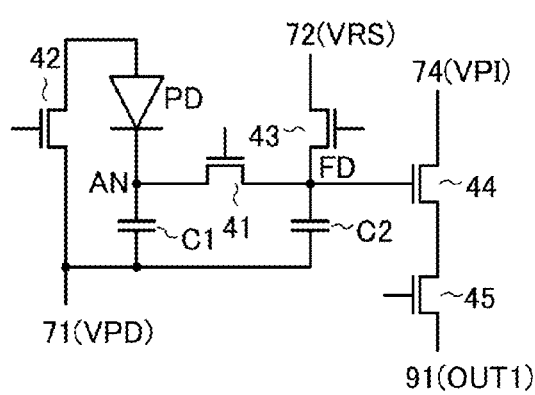
Figure 2D:
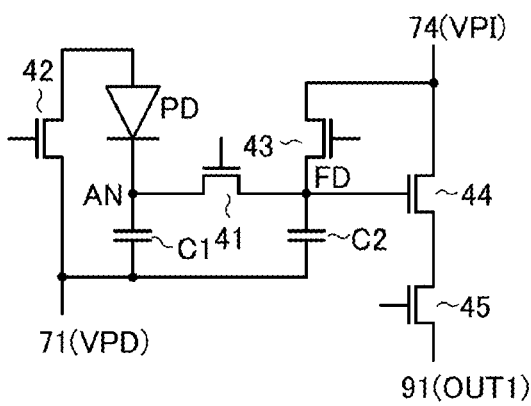
Figure 2E:
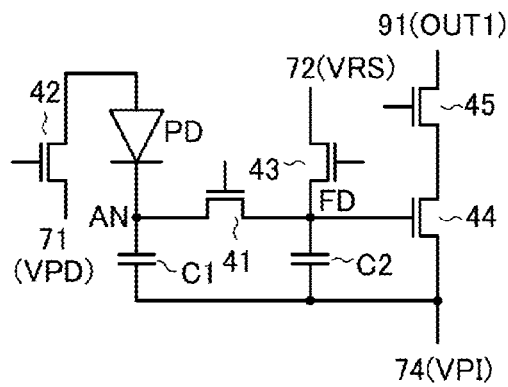
Figure 2F:
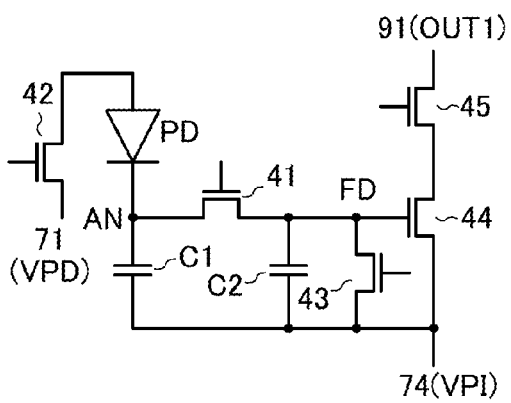

For example, as illustrated in FIG. 2A, the other electrode of the capacitor C1 may be electrically connected to the wiring 73 (VSS), and the other electrode of the capacitor C2 may be electrically connected to a wiring 75 (VSS2). As illustrated in FIG. 2B, the other of the source and the drain of the transistor 43 may be electrically connected to the wiring 74 (VPI). As illustrated in FIG. 2C, the other electrode of the capacitor C1 and the other electrode of the capacitor C2 may be electrically connected to the wiring 71 (VPD). As illustrated in FIG. 2D, the other of the source and the drain of the transistor 43 may be electrically connected to the wiring 74 (VPI), and the other electrode of the capacitor C1 and the other electrode of the capacitor C2 may be electrically connected to the wiring 71 (VPD). As illustrated in FIG. 2E, the other electrode of the capacitor C1 and the other electrode of the capacitor C2 may be electrically connected to the wiring 74 (VPI). As illustrated in FIG. 2F, the other electrode of the capacitor C1, the other electrode of the capacitor C2, and the other of the source and the drain of the transistor 43 may be electrically connected to the wiring 74 (VPI).

The wiring 71 (VPD), the wiring 72 (VRS), the wiring 73 (VSS), the wiring 74 (VPI), the wiring 75 (VSS2), and the wiring 77 (VRS2) can function as power supply lines. For example, the wiring 71 (VPD), the wiring 73 (VSS), and the wiring 75 (VSS2) can function as low potential power supply lines. The wiring 72 (VRS) and the wiring 74 (VPI) can function as high potential power supply lines.

A gate of the transistor 41 is electrically connected to a wiring 61 (TX). A gate of the transistor 42 is electrically connected to a wiring 62 (GPD). A gate of the transistor 43 is electrically connected to a wiring 63 (RS). A gate of the transistor 45 is electrically connected to a wiring 64 (SE).

The wiring 61 (TX), the wiring 62 (GPD), the wiring 63 (RS), and the wiring 64 (SE) can function as signal lines that control the on/off states of the transistors to which the wirings are connected. Note that the wiring 61 (TX) can be controlled row by row.

The transistor 41 can function as a transistor for transferring the potential of the node AN to the node FD. The transistor 42 can function as a transistor for holding the potential of the node AN. The transistor 43 can function as a transistor for resetting the potentials of the nodes AN and FD. The transistor 44 can function as a transistor for outputting a signal corresponding to the potential of the node FD. The transistor 45 can function as a transistor for selecting the pixel 20.

Note that the above structure of the pixel 20 is just an example, and some of the circuits, some of the transistors, some of the capacitors, some of the wirings, or the like might not be included. Alternatively, a circuit, a transistor, a capacitor, a wiring, or the like that is not included in the above structure might be included. Alternatively, connection between some wirings might be different from the above connection.

Figure 3A:
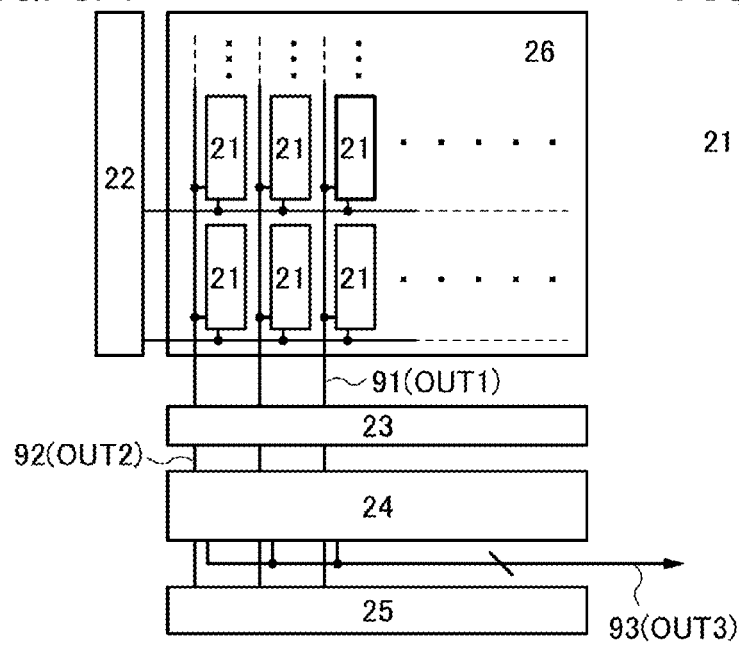
FIGS. 3A and 3B are block diagrams illustrating an imaging device.

FIG. 3A illustrates an imaging device in one embodiment of the present invention. The imaging device includes a pixel array 26 including pixel blocks 21 arranged in a matrix, a circuit 22 (row driver) having a function of driving the pixel blocks 21, a circuit 23 (CDS circuit) for performing correlated double sampling (CDS) on an output signal of the pixel block 21, a circuit 24 (e.g., an A/D converter) having a function of converting analog data output from the circuit 23 to digital data, and a circuit 25 (column driver) having a function of selecting and reading data converted in the circuit 24. Note that a structure without the circuit 23 can be employed.

Figure 3B:
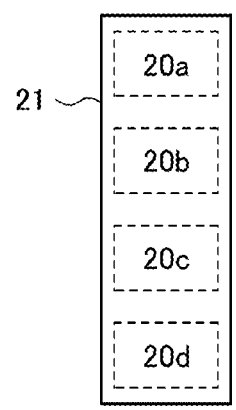

As illustrated in FIG. 3B, for example, the pixel block 21 can include a plurality of pixels 20 (pixels 20a, 20b, 20c, and 20d). Although a detailed structure will be described later, in the pixel block 21, some of the transistors are used in common by the plurality of pixels 20.

Figure 3C:
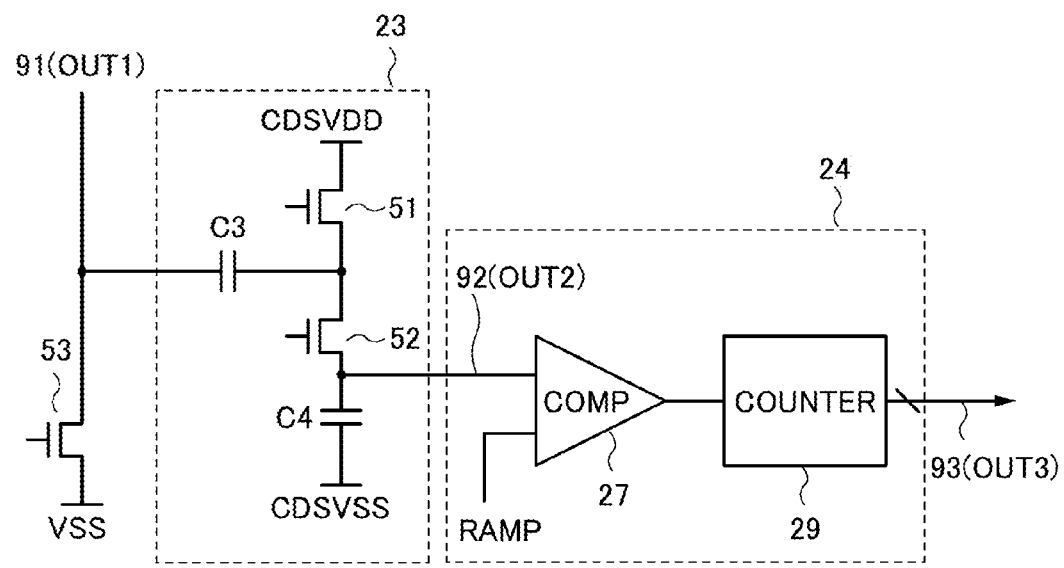
FIG. 3C illustrates a circuit diagram of a CDS circuit and a block diagram of an A/D converter.

FIG. 3C illustrates a circuit diagram of the circuit 23 and a block diagram of the circuit 24 that are connected to one column of the pixel block 21. The circuit 23 can include a transistor 51, a transistor 52, a capacitor C3, and a capacitor C4. Furthermore, the circuit 24 can include a comparator circuit 27 and a counter circuit 29.

Note that a transistor 53 functions as a current source circuit. The wiring 91 (OUT1) is electrically connected to one of a source and a drain of the transistor 53, and a power supply line is connected to the other of the source and the drain of the transistor 53. As the power supply line, a low-potential power supply line (VSS) can be used, for example. Bias voltage is always applied to a gate of the transistor 53.

In the circuit 23, one of a source and a drain of the transistor 51 is electrically connected to one of a source and a drain of the transistor 52 and one electrode of the capacitor C3. The one of the source and the drain of the transistor 52 is electrically connected to one electrode of the capacitor C4 and the wiring 92 (OUT2). The other of the source and the drain of the transistor 51 is electrically connected to a high-potential power supply line (CDSVDD) to which a reference potential is supplied, for example. The other electrode of the capacitor C4 is electrically connected to a low-potential power supply line (CDSVSS), for example.

An operation example of the circuit 23 when the circuit 23 is connected to the pixel 20 in FIG. 1 is described. First, the transistors 51 and 52 are turned on. Next, the potential of imaging data is output from the pixel block 21 to the wiring 91 (OUT1), and the reference potential (CDSVDD) is held in the wiring 92 (OUT2). Then, the transistor 51 is turned off and a reset potential (here, a potential higher than the potential of the imaging data, for example, a VDD potential) is output from the pixel block 21 to the wiring 91 (OUT1). At this time, the wiring 92 (OUT2) has a potential obtained by adding the absolute value of a difference between the potential of the imaging data and the reset potential to the reference potential (CDSVDD). Thus, a potential signal with little noise that is obtained by adding the net potential of the imaging data to the reference potential (CDSVDD) can be supplied to the circuit 24.

Note that when the reset potential is lower than the potential of the imaging data (e.g., a GND potential), the wiring 92 (OUT2) has a potential that is obtained by subtracting the absolute value of the difference between the potential of the imaging data and the reset potential from the reference potential (CDSVDD).

In the circuit 24, a signal potential that is input from the circuit 23 to the comparator circuit 27 and a reference potential (RAMP) that is swept to be increased or decreased are compared. Then, in accordance with the output of the comparator circuit 27, the counter circuit 29 operates to output a digital signal to a wiring 93 (OUT3).

Figure 4:
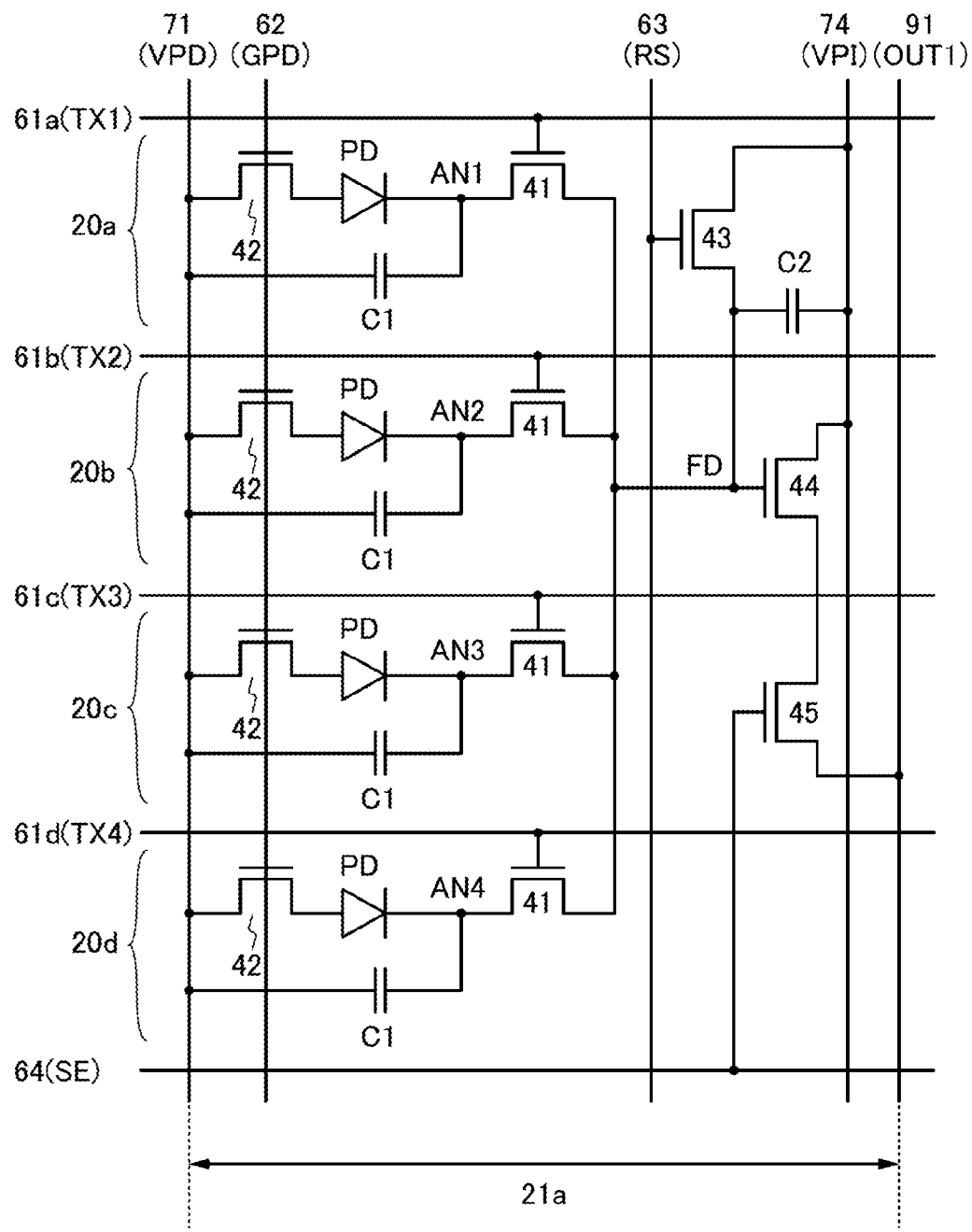
FIG. 4 is a circuit diagram illustrating a pixel block.

A pixel block 21a in FIG. 4 is an example of the specific structure of the pixel block 21. In the pixel block 21a, the transistors 43 to 45 and the capacitor C2 are used in common by four pixels (the pixels 20a, 20b, 20c, and 20d) that are arranged in an extending direction of the wiring 91 (OUT1) (hereinafter, this direction is referred to as a vertical direction). Although the pixel block 21a in FIG. 4 includes four pixels, the pixel block 21a may include two pixels, three pixels, or five or more pixels. Alternatively, the pixel block 21a may include only one pixel.

In the pixel block 21a, the wiring 71 (VPD) and the wiring 73 (VSS) in FIG. 1 are merged into one wiring and the wiring 72 (VRS) and the wiring 74 (VPI) in FIG. 1 are merged into one wiring so that the number of wirings is reduced; however, wirings in FIGS. 2A to 2F may be included. In addition, although an example in which the other electrode of the capacitor C2 is connected to the wiring 74 (VPI) is described, the other electrode of the capacitor C2 may be connected to the wiring 71 (VPD).

In the pixel block 21a, the wiring 71 (VPD), the wiring 74 (VPI), the wiring 62 (GPD), and the wiring 63 (RS) can be used in common by four pixels. In addition, these wirings can be used in common by another pixel block 21a provided in the vertical direction.

A wiring 61a (TX1), a wiring 61b (TX2), a wiring 61c (TX3), and a wiring 61d (TX4) can be used in common by another pixel block 21a provided in an extending direction of the wiring 64 (SE) (hereinafter, this direction is referred to as a horizontal direction).

Figure 5:
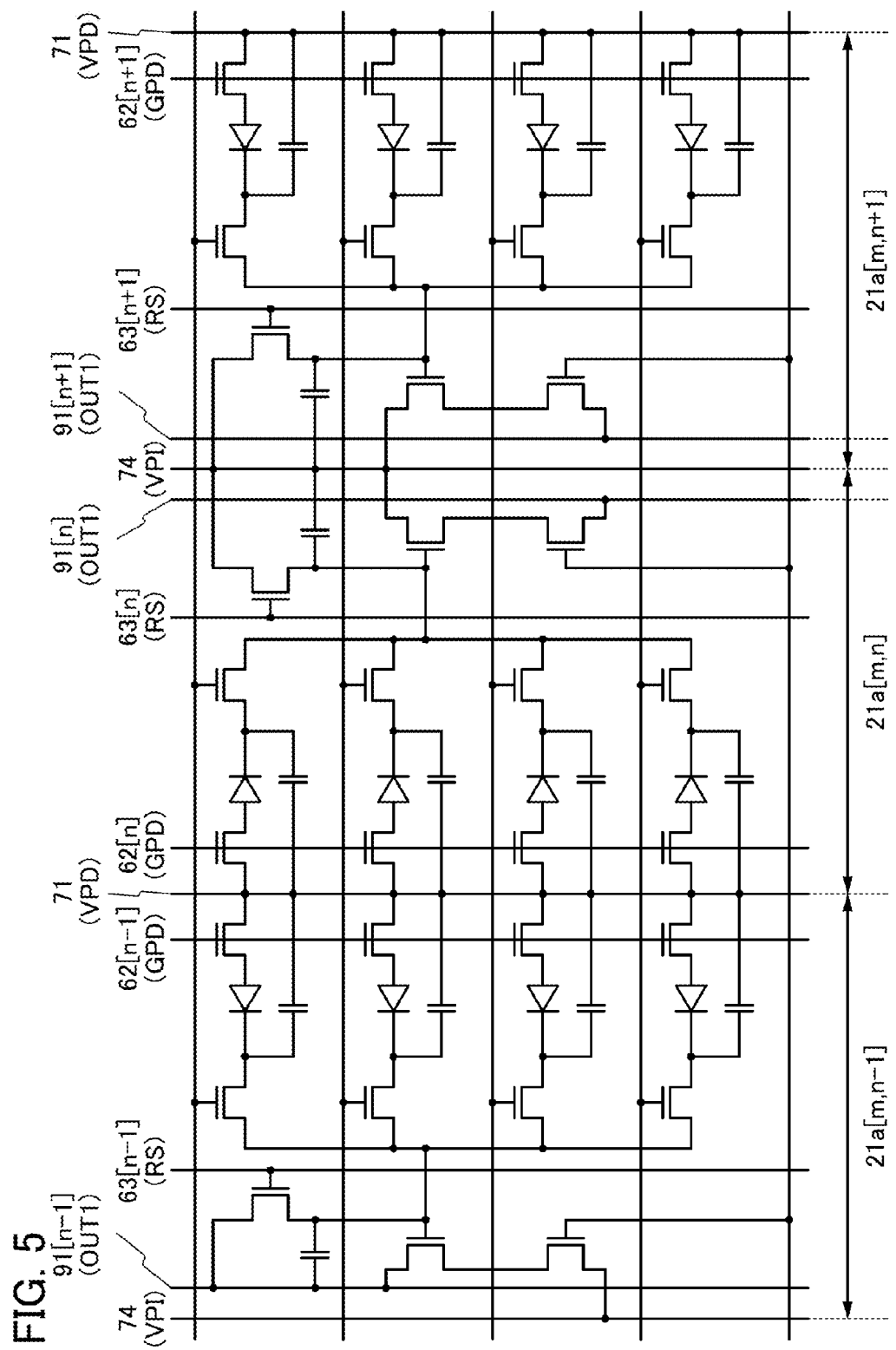
FIG. 5 is a circuit diagram illustrating a pixel block.

FIG. 5 illustrates the structure of a pixel block 21a[m, n−1], a pixel block 21a[m, n], and a pixel block 21a[m, n+1] that are adjacent to each other in the horizontal direction. Note that m and n are given natural numbers and denote a row and a column, respectively.

In the pixel block 21a[m, n−1] and the pixel block 21a[m, n], when the circuits are arranged line symmetrically with respect to the wiring 71 (VPD), the wiring 71 (VPD) can be used in common. Furthermore, in the pixel block 21a[m, n] and the pixel block 21a[m, n+1], when the circuits are arranged line symmetrically with respect to the wiring 74 (VPI), the wiring 74 (VPI) can be used in common. Therefore, the number of wirings can be reduced.

Figure 6:
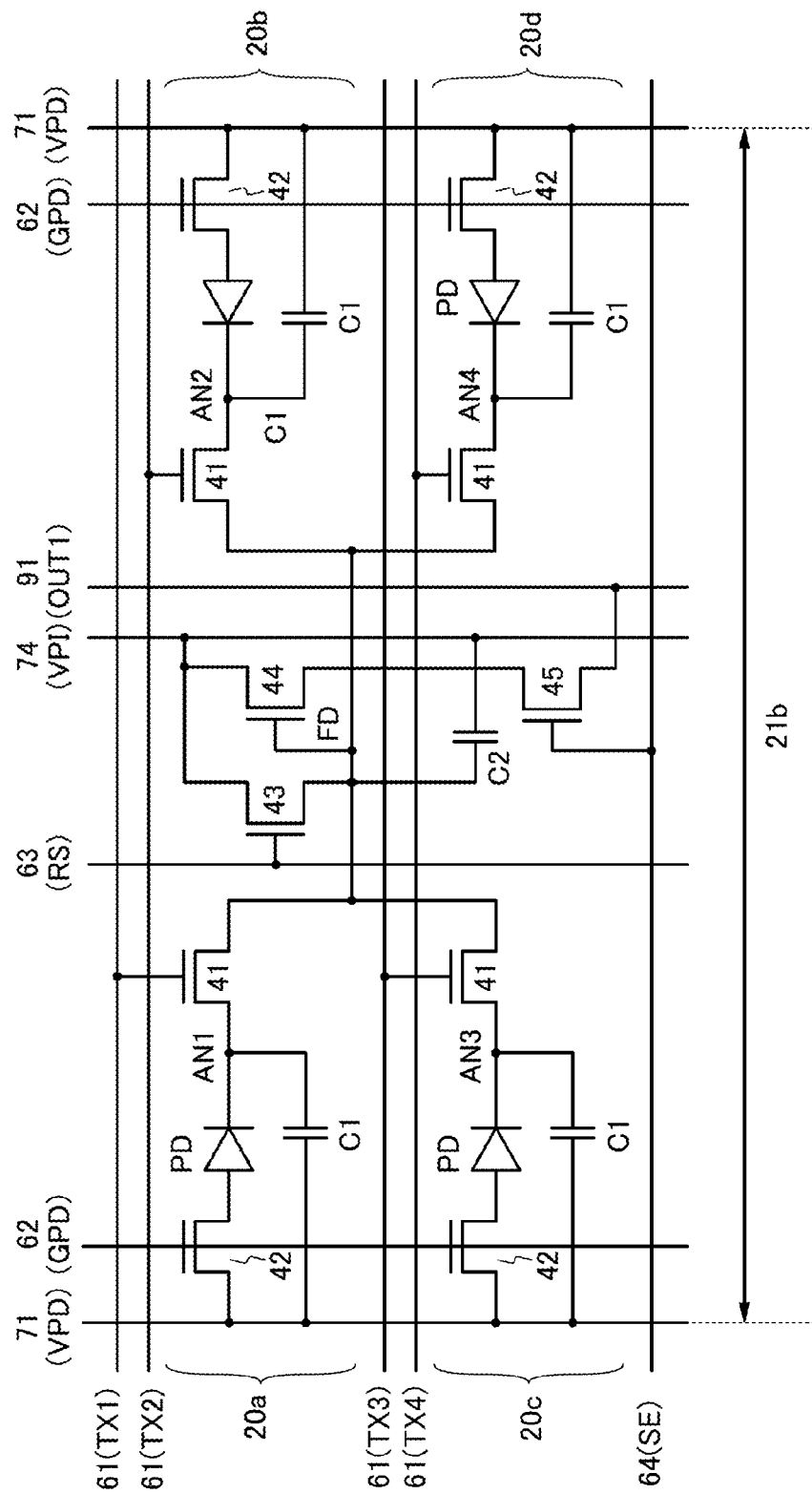
FIG. 6 is a circuit diagram illustrating a pixel block.

The pixel block 21 may be a pixel block 21b illustrated in FIG. 6. In the pixel block 21b, the transistors 43 to 45 and the capacitor C2 are used in common by four pixels (the pixels 20a, 20b, 20c, and 20d) that are arranged in the horizontal and vertical directions. Also in the pixel block 21b, the wirings can be used in common by another pixel block 21b arranged in the vertical or horizontal direction.

Figure 7:
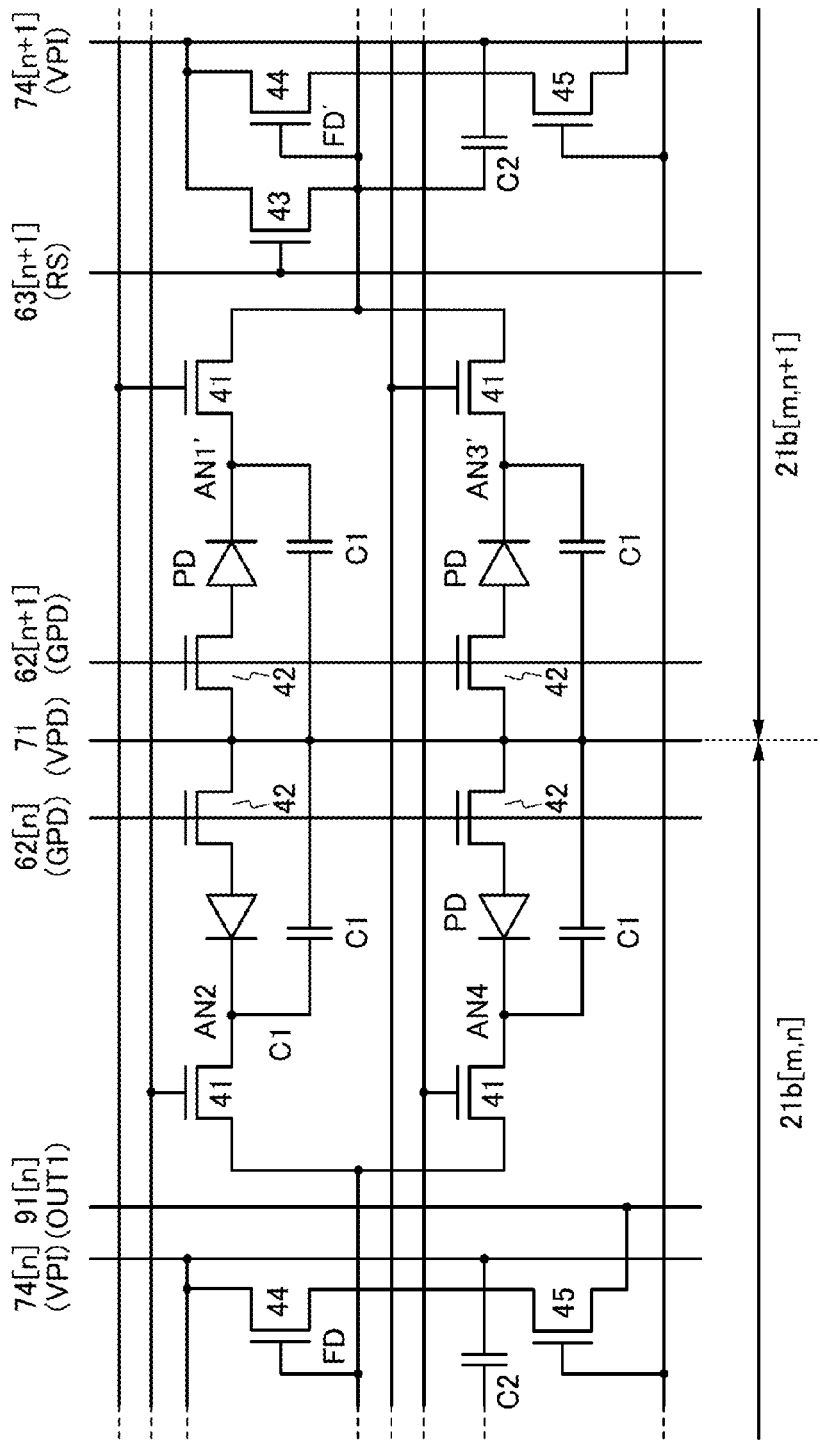
FIG. 7 is a circuit diagram illustrating a pixel block.

FIG. 7 illustrates the structure of a pixel block 21b[m, n] and a pixel block 21b[m, n+1] adjacent to the pixel block 21b[m, n] in the horizontal direction. The wirings 71 (VPD) are positioned at both ends in the horizontal direction in the pixel block 21b in FIG. 6; thus, one wiring 71 (VPD) can be eliminated and the other wiring 71 (VPD) can be used in common by the pixel block 21b[m, n] and the pixel block 21b[m, n+1], as illustrated in FIG. 7.

Figure 8A:
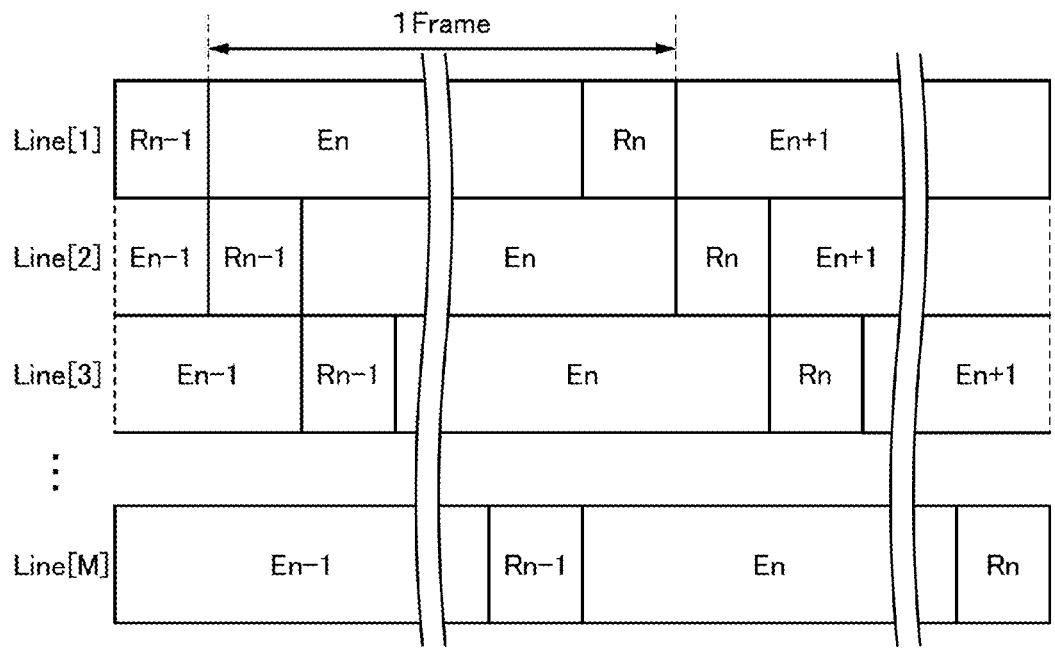
FIGS. 8A and 8B each illustrate operation of an imaging device.
Figure 8B:
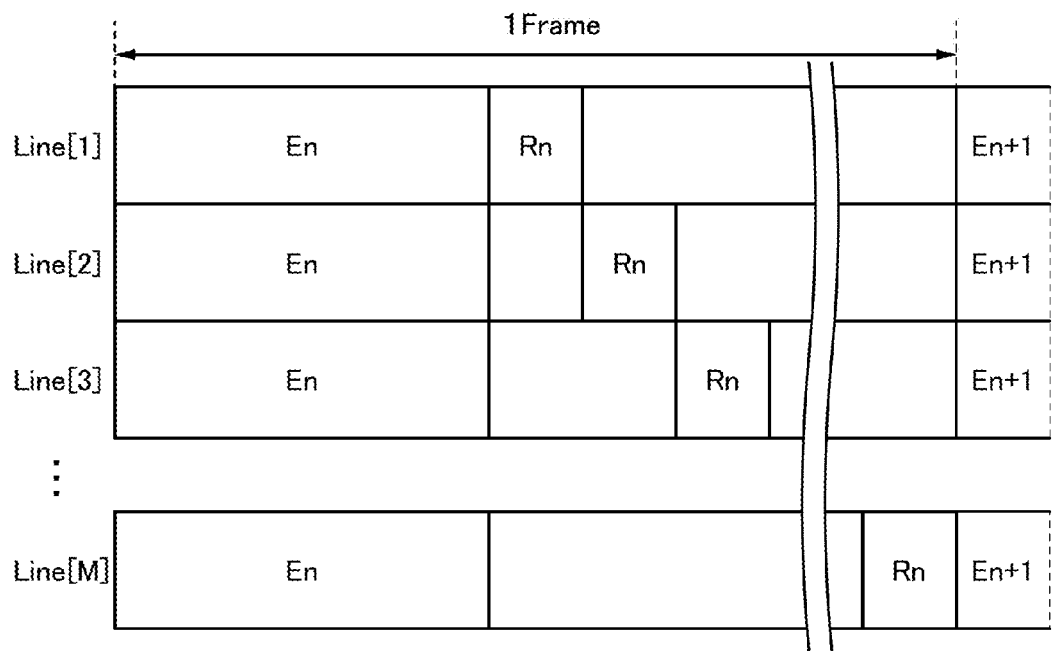

Next, the operation methods of an imaging device are described with reference to FIGS. 8A and 8B. In FIGS. 8A and 8B, "E" represents a period in which exposure operation can be performed, and "R" represents a period in which reading operation can be performed. Furthermore, n represents an n-th frame (n is a natural number of two or more). Moreover, n−1 represents a frame previous to the n-th frame, and n+1 represents a frame following the n-th frame. Note that here, it is assumed that pixels are arranged in a matrix and pixel blocks are not considered. Line[1] represents a pixel in a first row, and Line[M] represents a pixel in an M-th row (the last row).

FIG. 8A is a schematic view illustrating the operation method of a rolling shutter system. In the rolling shutter system, exposure and data reading are performed row by row. Since imaging cannot be simultaneously performed on all pixels, distortion is caused in an image when a moving object is imaged.

FIG. 8B is a schematic view illustrating the operation method of a global shutter system. In the global shutter system, exposure is simultaneously performed on all pixels, and then data reading is performed row by row. Thus, an image without distortion can be obtained even when a moving object is imaged. The imaging device in one embodiment of the present invention can operate with a global shutter system.

Figure 9:
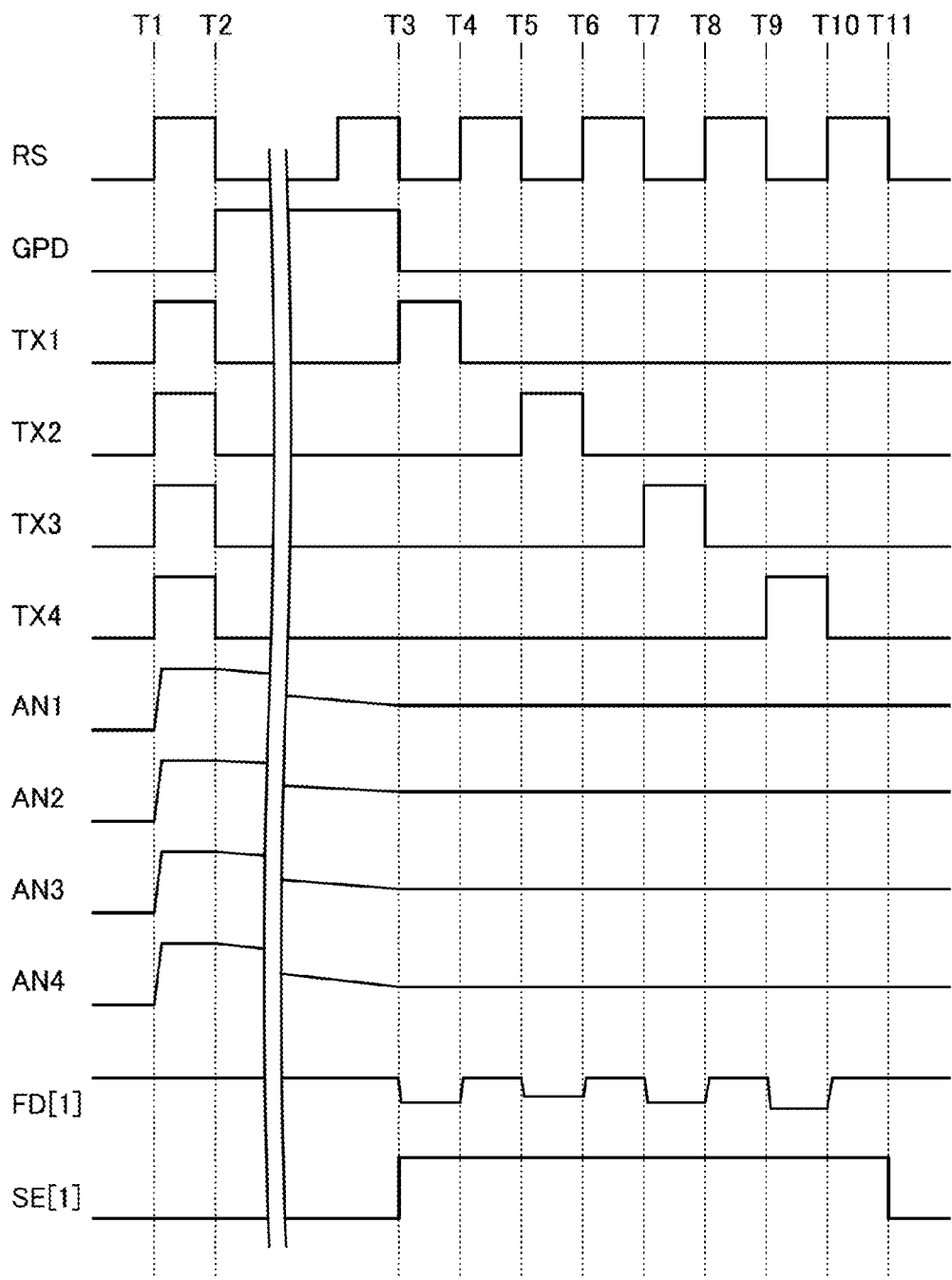
FIG. 9 is a timing chart illustrating operation of an imaging device.
Figure 10:
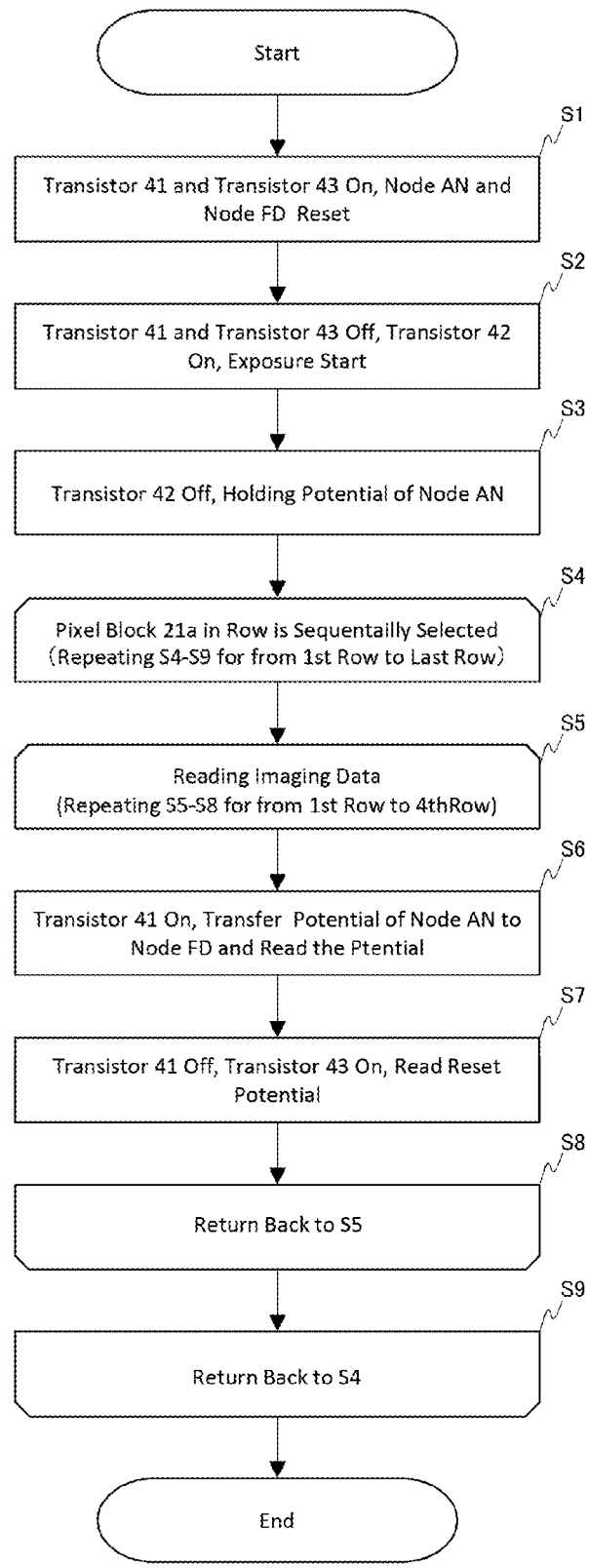
FIG. 10 is a flow chart illustrating operation of an imaging device.

Next, the operation of the pixel block 21a in FIG. 4 with a global shutter system is described. FIG. 9 is a timing chart illustrating the operation of the pixel block 21a in the first row. FIG. 10 is a flow chart illustrating the operation of the n-th frame. In the case where the pixel block 21a operates according to the timing chart in FIG. 9, the wiring 71 (VPD) is set to a low potential ("L") and the wiring 74 (VPI) is set to a high potential ("H").

In FIG. 9, RS represents the potential of the wiring 63 (RS); GPD represents the potential of a wiring 65 (GPD); TX1 to TX4 represent the potentials of the wirings 61a (TX1) to 61d (TX4), respectively; AN1 to AN4 represent the potentials of a node AN1 in the pixel 20a to a node AN4 in the pixel 20d, respectively; FD[1] represents the potential of the node FD in the pixel block 21a in the first row; and SE[1] represents the potential of the wiring 64 (SE) connected to the pixel block 21a in the first row.

At time T1, when RS is set to "H" and TX1 to TX4 are set to "H," the transistor 41 and the transistor 43 are turned on. Then, AN1 to AN4 and FD[1] are reset to "H" (the potential of the wiring 74 (VPI)) (S1).

At time T2, when RS is set to "L," TX1 to TX4 are set to "L," and GPD is set to "H," the transistor 41 and the transistor 43 are turned off and the transistor 42 is turned on. Then, AN1 to AN4 start to decrease in accordance with illuminance (S2). That is, exposure is started.

At time T3, when GPD is set to "L," the transistor 42 is turned off and the potentials of the nodes AN1 to AN4 are held (S3). Note that although FIG. 9 illustrates operation in which RS is set to "H" between time T2 and time T3 to reset FD, this reset operation can be omitted.

At time T3, when SE[1] is set to "H," the pixel block 21a in the first row is selected (S4).

At time T3, when TX1 is set to "H," the potential of the node AN1 is transferred to the node FD, and a signal corresponding to FD[1] is read in the circuit 23 (S5 and S6). That is, the imaging data obtained by the exposure in S2 is read.

At time T4, when RS is set to "H" and TX1 is set to "L," FD[1] is reset and a signal corresponding to the reset potential is read in the circuit 23 (S7). Here, the reset potential that is the same as the signal obtained by the reset operation in S1 is read. As described above, the circuit 23 can detect a difference between a signal corresponding to imaging data and a signal corresponding to the reset potential, so that imaging data with less noise can be obtained.

From time T5 to time T11, the potentials of the nodes AN2 to AN4 in the pixel block 21a in the first row are sequentially transferred to the node FD and imaging data are read in a manner similar to the above case by repeating S5 to S8. The operations so far are imaging and data read operations in the pixel block 21a in the first row. Then, the process returns back to S4 and the pixel block in the second row is selected.

FIG. 11 is a timing chart illustrating read operations in all the pixel blocks 21a arranged in a given column. Here, FD[1] to FD[M] represent the potentials of the nodes FD in the first row to the M-th row (the last row), and SE[1] to SE[M] represent the potentials of the wirings 64 (SE) that are connected to the pixel blocks 21a in the first to M-th rows. Since imaging is performed with a global shutter system, exposure is performed on all the pixel blocks 21a at the same time. In addition, for data reading, the pixel blocks 21a in the second row to the last row are sequentially selected as illustrated in FIG. 11, and operation similar to the operation in FIG. 9 is performed on the pixel blocks 21a (S4 to S9).

In this manner, the imaging device in one embodiment of the present invention includes the node AN (the charge retention portion) and the node FD (the charge detection portion). Imaging data obtained in the node AN is sequentially transferred to the node FD to be read. Therefore, operation with a global shutter system is possible even when some transistors are used in common in the pixel block.

Figure 12A:
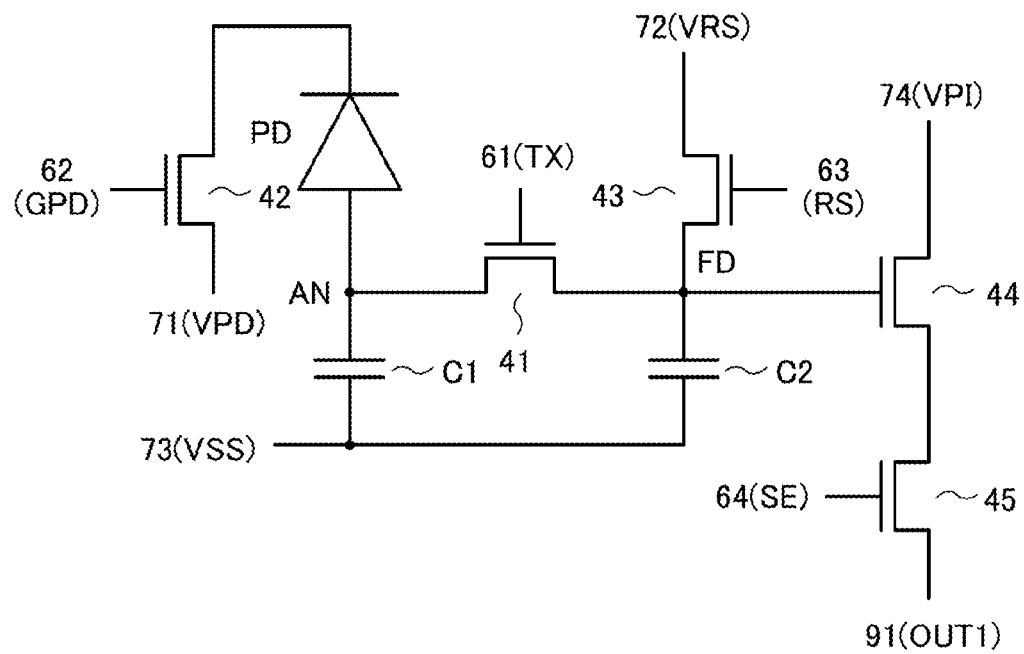
FIGS. 12A and 12B are circuit diagrams each illustrating a pixel.

The pixel 20 may have a structure illustrated in FIG. 12A. The connection direction of the photoelectric conversion element PD in the pixel 20 in FIG. 12A is different from that in the pixel 20 in FIG. 1. In that case, the nodes AN and FD are each set to a low potential in reset operation, and the potentials of the nodes are increased by light irradiation. In this structure, the wiring 71 (VPD) and the wiring 74 (VPI) are each set to a high potential ("H"), and the wiring 72 (VRS) and the wiring 73 (VSS) are each set to a low potential ("L").

Figure 12B:
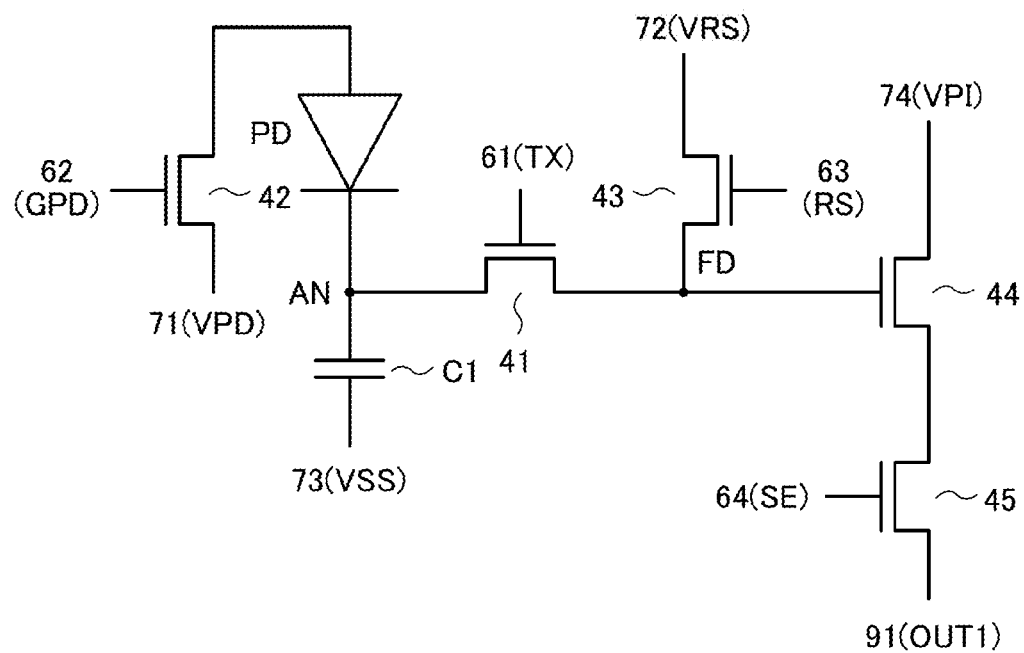
Figure 13A:
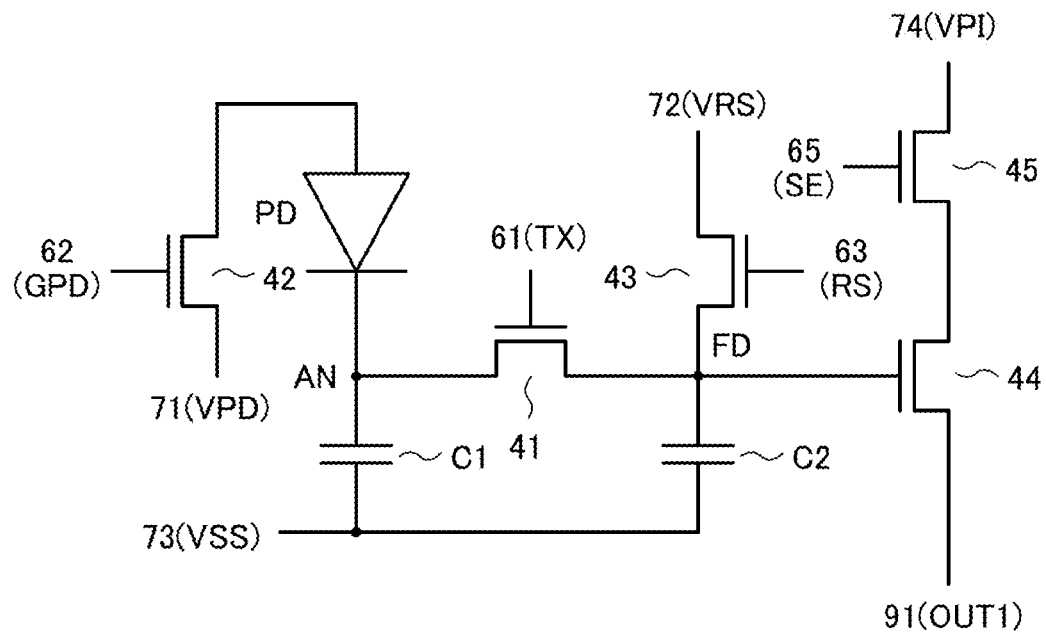
FIGS. 13A and 13B are circuit diagrams each illustrating a pixel.

As illustrated in FIG. 12B, it is possible to eliminate the capacitor C2. Alternatively, as illustrated in FIG. 13A, the one of the source and the drain of the transistor 44 may be connected to the wiring 91 (OUT1).

Figure 13B:
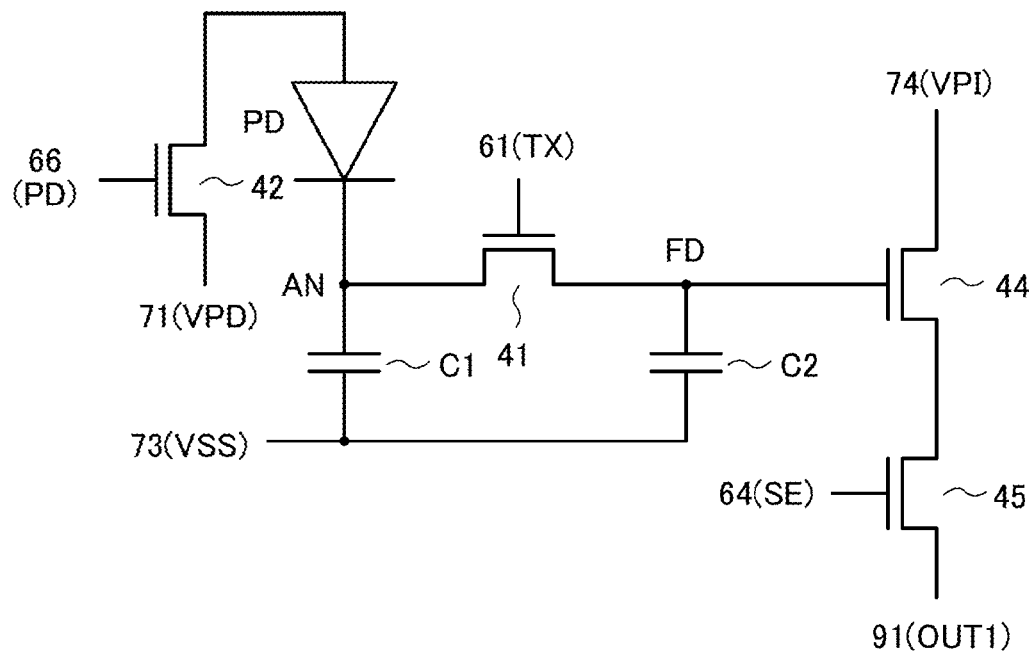
Figure 14:
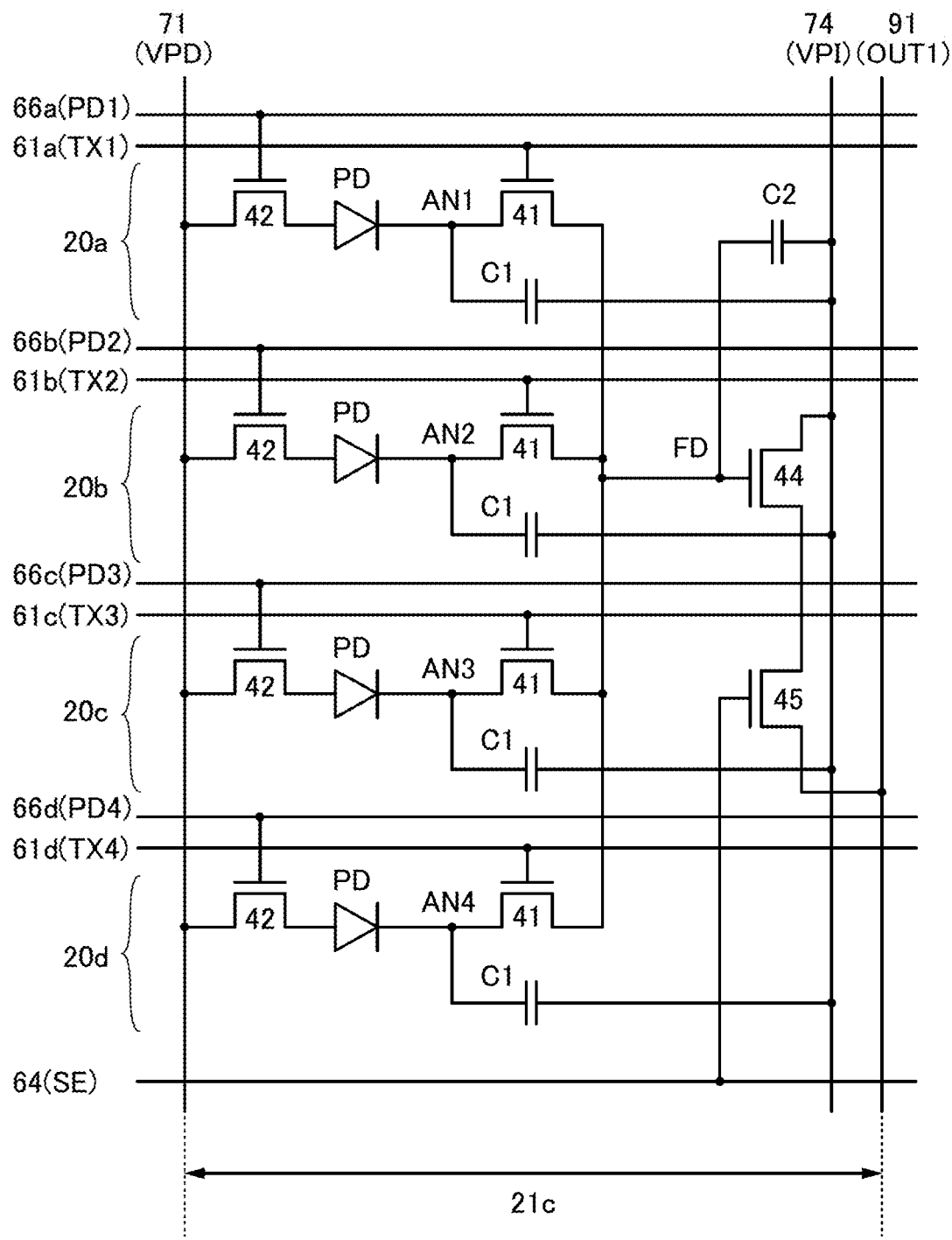
FIG. 14 is a circuit diagram illustrating a pixel block.

Alternatively, as illustrated in FIG. 13B, the pixel 20 may have a structure in which the transistor 43 is not provided. FIG. 14 illustrates an example of a pixel block 21c including the pixels 20 in FIG. 13B. Wirings 66a (PD1) to 66d (PD4) that can independently control gates of the transistors 42 are provided in the pixels.

In the pixel block 21c, the potentials of the nodes AN1 to AN4 and the node FD can be reset by setting the wiring 71 (VPD) to a high potential, turning on the transistors 41 and 42, and applying a forward bias to the photoelectric conversion element PD in a reset period.

Figure 15:
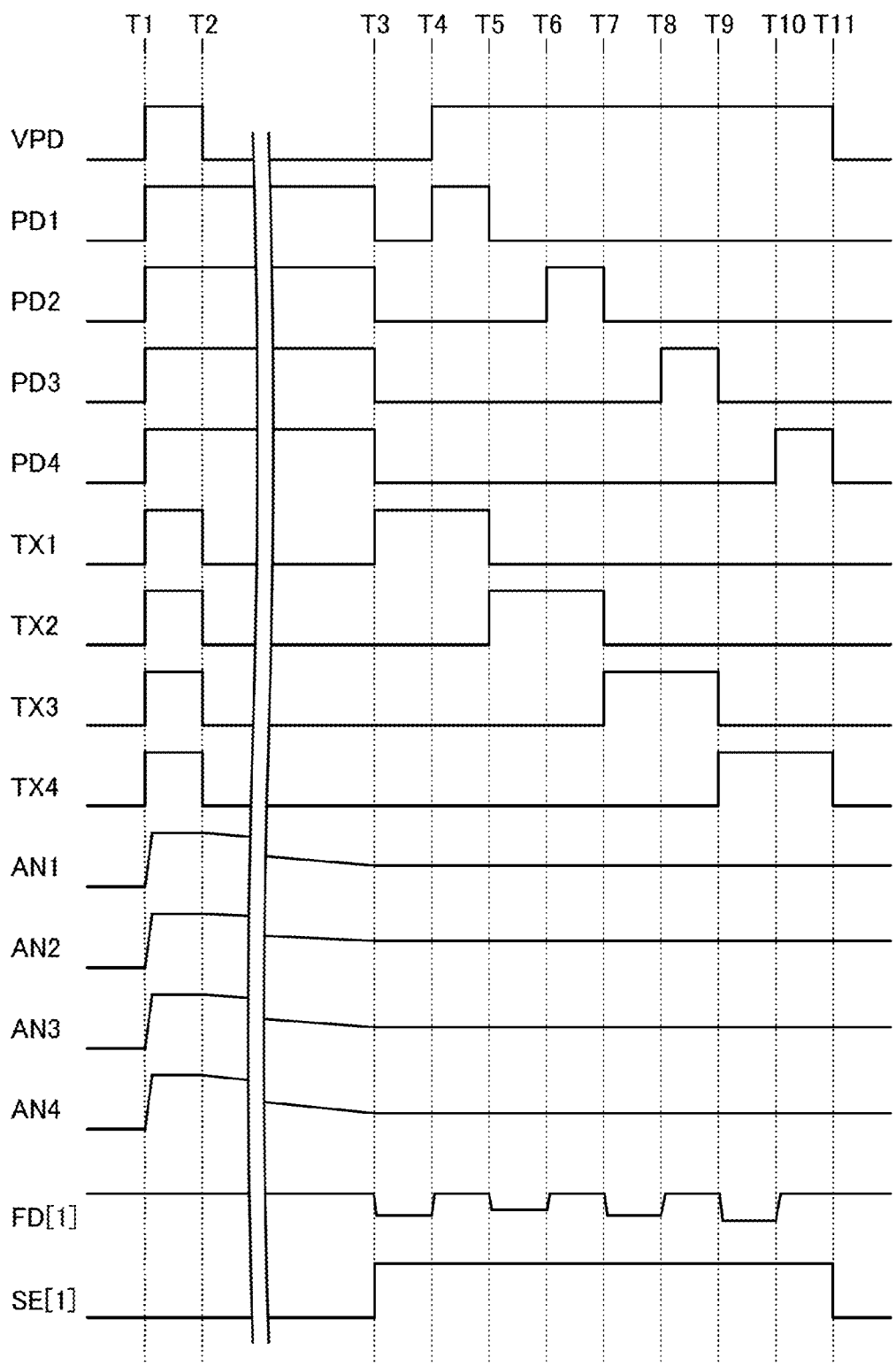
FIG. 15 is a timing chart illustrating operation of an imaging device.

The pixel block 21c can operate according to a timing chart in FIG. 15. Note that VPD represents the potential of the wiring 71 (VPD), and PD1 to PD4 represent the potentials of the wirings 66a (PD1) to 66d (PD4).

Figure 16A:
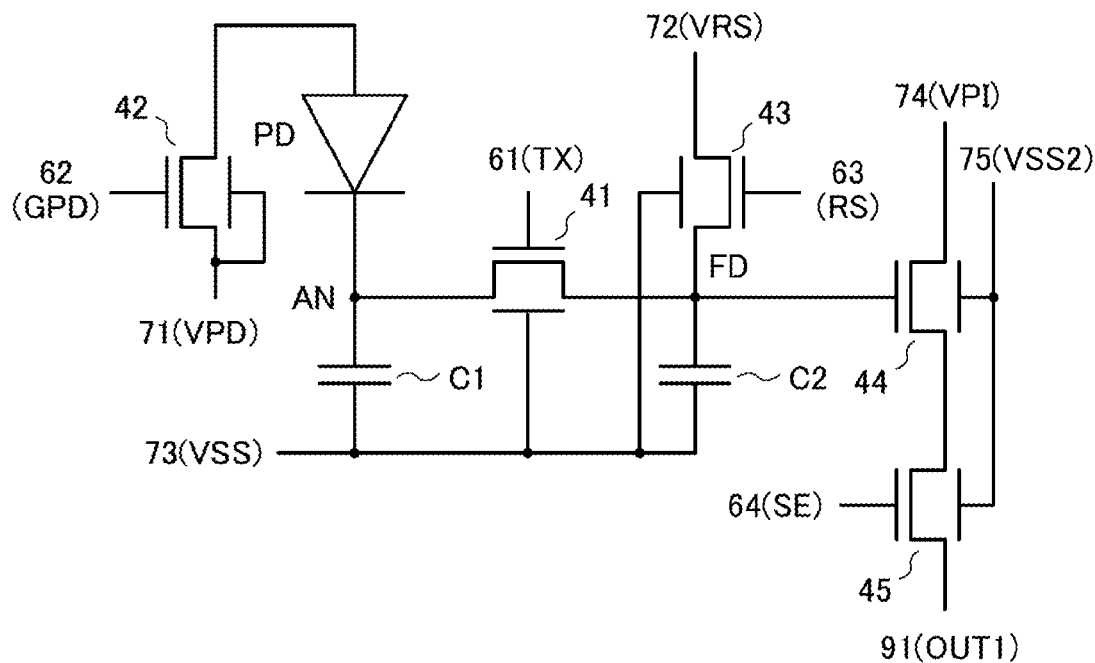
FIGS. 16A and 16B are circuit diagrams each illustrating a pixel.
Figure 16B:
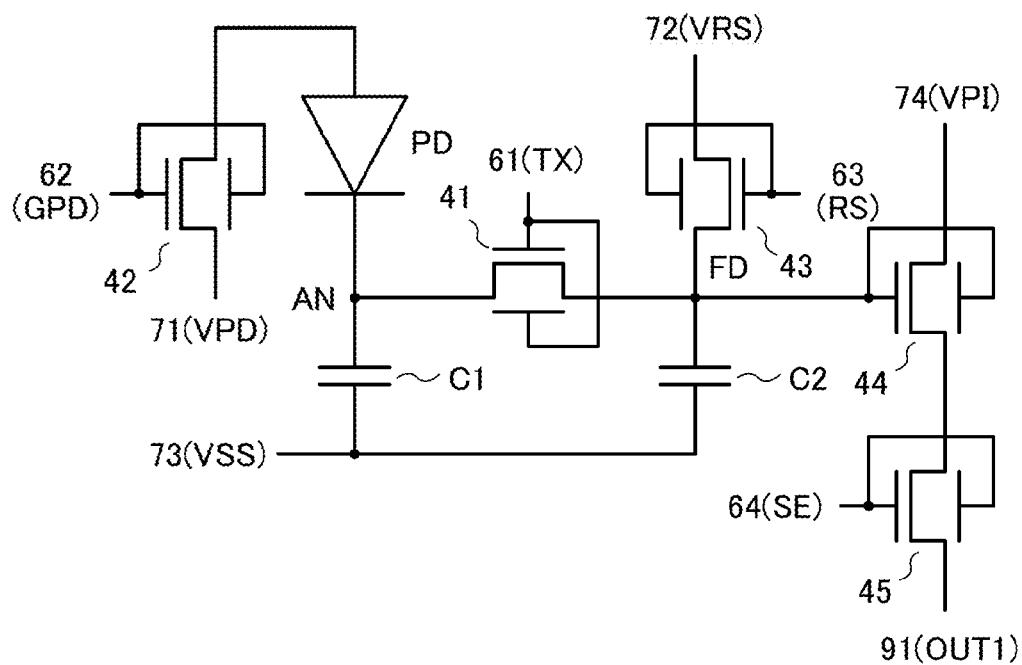

The transistors 41 to 45 in the pixel 20 may each have a back gate as illustrated in FIGS. 16A and 16B. FIG. 16A illustrates a structure in which a constant potential is applied to the back gates, which enables control of the threshold voltage. The back gates are connected to the wiring 71 (VPD), the wiring 73 (VSS), and the wiring 75 (VSS2) that supply low potentials in the example of FIG. 16A, but may be connected to one of the wirings. FIG. 16B illustrates a structure in which the same potential is applied to the front gate and the back gate, which enables an increase in on-state current and a decrease in off-state current. The structures of FIGS. 16A and 16B and the like may be combined such that desired transistors can have appropriate electrical characteristics. Note that a transistor without a back gate may be provided. Any of the structures of FIG. 1, FIGS. 2A to 2F, FIGS. 12A and 12B, FIGS. 13A and 13B, and FIGS. 16A and 16B can be combined as necessary.

Figure 17A:
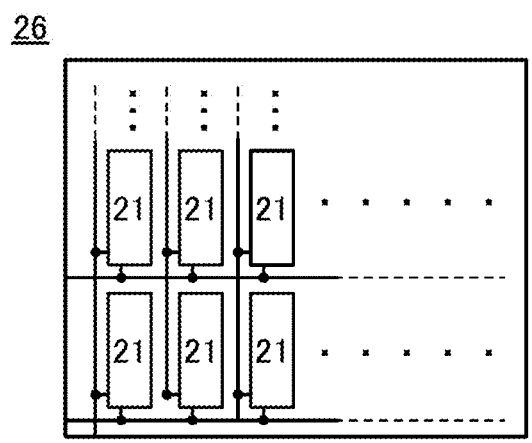
FIGS. 17A to 17C are top views and a perspective view illustrating the structure of an imaging device.
Figure 17B:
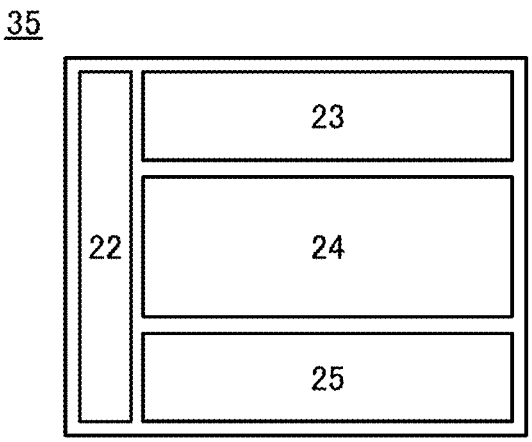
Figure 17C:
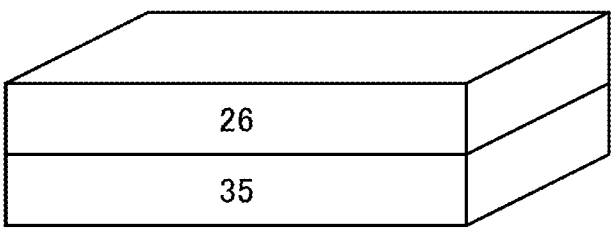

Furthermore, an imaging device in one embodiment of the present invention can have a stacked structure including the pixel array 26 and a substrate 35 provided with the circuits 22 to 25. For example, a stacked structure as illustrated in the perspective view in FIG. 17C, which includes the pixel array 26 having the top view in FIG. 17A and the substrate 35 having the top view in FIG. 17B can be obtained. With this structure, transistors suitable for elements can be used, and the area of the imaging device can be made small. Note that the layout of the circuit in FIG. 17B is an example, and another layout may be used.

To achieve both high-speed operation and the structure of a CMOS circuit, the circuits 22 to 25 are preferably formed using transistors including silicon (hereinafter referred to as Si transistors). For example, a silicon substrate can be used as the substrate 35, and the circuits can be formed over the silicon substrate. The pixel array 26 is preferably formed using transistors including an oxide semiconductor (hereinafter referred to as OS transistors). Note that some of the transistors included in the circuits 22 to 25 may be provided on the same surface as the pixel array 26.

Figure 18A:
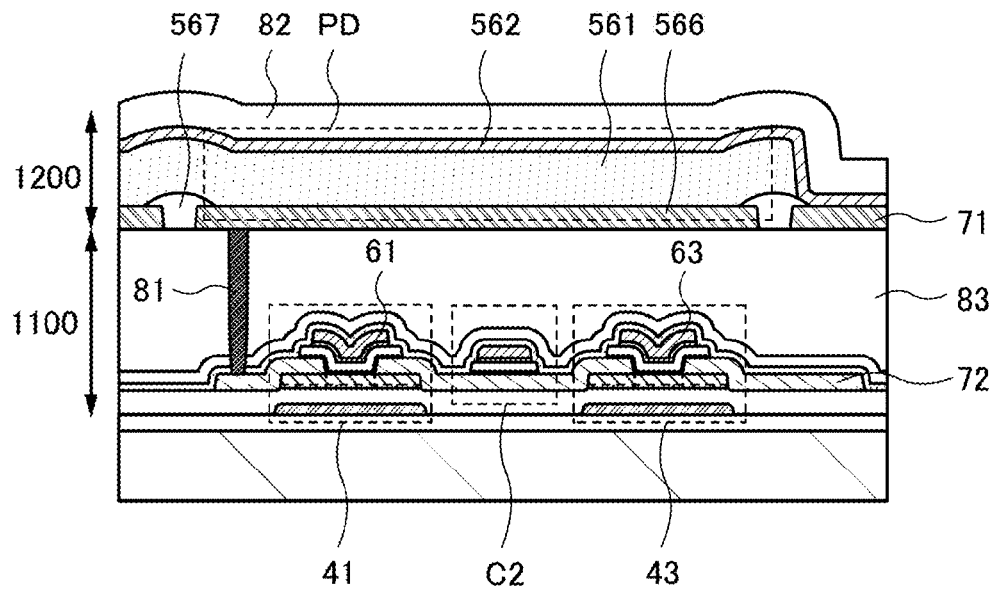
FIGS. 18A to 18C are cross-sectional views each illustrating the structure of an imaging device.

Specific structure examples of the imaging device in one embodiment of the present invention are described below with reference to drawings. FIG. 18A illustrates an example of specific connection between the photoelectric conversion element PD, the transistor 41, the transistor 42, and the capacitor C2 which are included in the pixel 20 in FIG. 1. Note that FIG. 18A does not illustrate the transistor 42, the transistor 44, the transistor 45, and the capacitor C1. The transistors 41 to 45 and the capacitors C1 and C2 can be provided in a layer 1100, and the photoelectric conversion element PD can be provided in a layer 1200.

Although the wirings, the electrodes, and contact plugs (conductors 81) are illustrated as independent components in cross-sectional views in this embodiment, some of them are provided as one component in some cases when they are electrically connected to each other. In addition, a structure in which the wiring is connected to the electrode through the conductor 81 is only an example, and the wiring may be directly connected to the electrode.

Insulating layers 82 and 83 and the like that function as protective films, interlayer insulating films, or planarization films are provided over the components. For example, an inorganic insulating film such as a silicon oxide film or a silicon oxynitride film can be used as each of the insulating layers 82 and 83 and the like. Alternatively, an organic insulating film such as an acrylic resin film or a polyimide resin film may be used. Top surfaces of the insulating layers 82 and 83 and the like are preferably planarized by chemical mechanical polishing (CMP) or the like as necessary.

In some cases, one or more of the wirings and the like illustrated in the drawing are not provided or a wiring, a transistor, or the like that is not illustrated in the drawing is included in each layer. In addition, a layer that is not illustrated in the drawing might be included. Furthermore, one or more of the layers illustrated in the drawing are not included in some cases.

It is particularly preferable to use OS transistors as the transistors 41 to 45 that are components of the pixel 20. Extremely low off-state current of the OS transistor can widen the dynamic range of imaging. In the circuit structure of the pixel 20 illustrated in FIG. 1, an increase in the intensity of light entering the photoelectric conversion element PD reduces the potentials of the nodes AN and FD. Since the OS transistor exhibits extremely low off-state current, current based on a gate potential can be accurately output even when the gate potential is extremely low. Thus, it is possible to widen the detection range of illuminance, i.e., the dynamic range.

A period during which charge can be held in the nodes AN and FD can be extremely long owing to the low off-state current of the transistors 41 to 43. Therefore, a global shutter system in which accumulation operation is performed in all the pixels at the same time can be used without a complicated circuit structure and operation method. Note that the imaging device in one embodiment of the present invention can be operated in a rolling shutter system.

The OS transistor has lower temperature dependence of change in electrical characteristics than a transistor including silicon in an active region or an active layer, and thus can be used in an extremely wide range of temperatures. Therefore, an imaging device and a semiconductor device that include the OS transistors are suitable for automobiles, aircrafts, and spacecrafts.

Moreover, the OS transistor has higher drain breakdown voltage than the Si transistor. To utilize avalanche multiplication, a photoelectric conversion element in which a selenium-based material is used for a photoelectric conversion layer is preferably operated while comparatively high voltage (e.g., 10 V or higher) is applied. Therefore, by combination of the OS transistor and the photoelectric conversion element in which the selenium-based material is used for the photoelectric conversion layer, a highly reliable imaging device can be obtained.

Figure 18B:
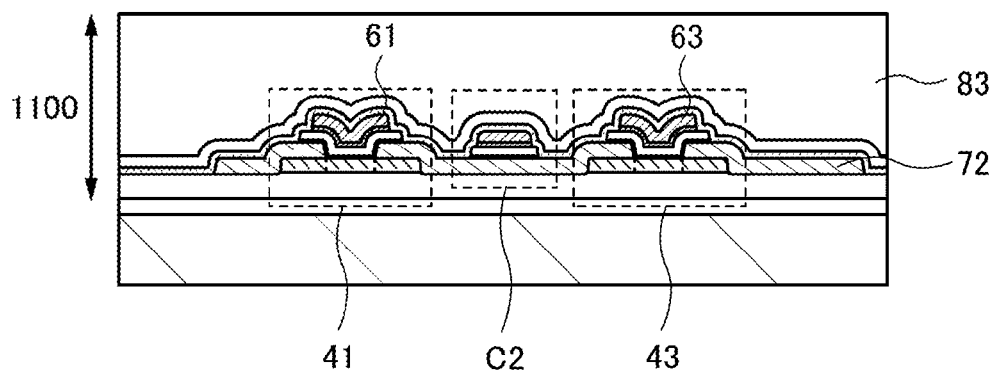
Figure 18C:
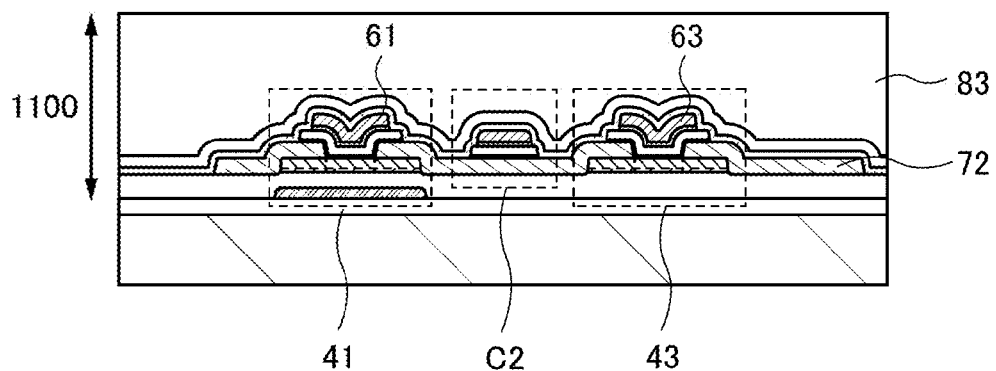

Although each transistor includes a back gate in FIG. 18A, as illustrated in FIG. 18B, each transistor does not necessarily include a back gate. Alternatively, as illustrated in FIG. 18C, one or more transistors, for example, only the transistor 41 may include a back gate. The back gate might be electrically connected to a front gate of the transistor that faces the back gate. Alternatively, different fixed potentials might be supplied to the back gate and the front gate. Note that the presence or absence of the back gate can also be applied to another pixel described in this embodiment.

A variety of elements can be used as the photoelectric conversion element PD provided in the layer 1200. FIG. 18A illustrates the photoelectric conversion element PD including a selenium-based material for a photoelectric conversion layer 561. The photoelectric conversion element PD including a selenium-based material has high external quantum efficiency with respect to visible light. Furthermore, the selenium-based material has a high light absorption coefficient, which leads to an advantage that the photoelectric conversion layer 561 is easily formed to be thin. The photoelectric conversion element PD including a selenium-based material can be a highly sensitive sensor in which the amount of amplification is large because of avalanche multiplication. In other words, with the use of a selenium-based material for the photoelectric conversion layer 561, a sufficient amount of photocurrent can be obtained even when the pixel area is reduced. Thus, the photoelectric conversion element PD including a selenium-based material is also suitable for imaging in a low-illuminance environment.

Amorphous selenium or crystalline selenium can be used as a selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and a higher absorption coefficient to visible light than amorphous selenium.

Figure 19A:
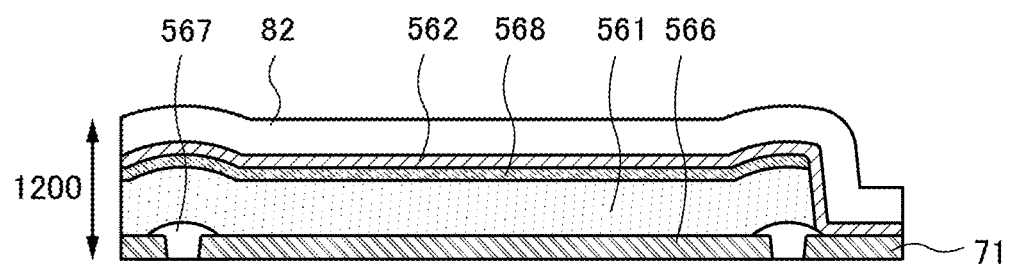
FIGS. 19A to 19C are cross-sectional views each illustrating the structure of a photoelectric conversion element.
Figure 19B:
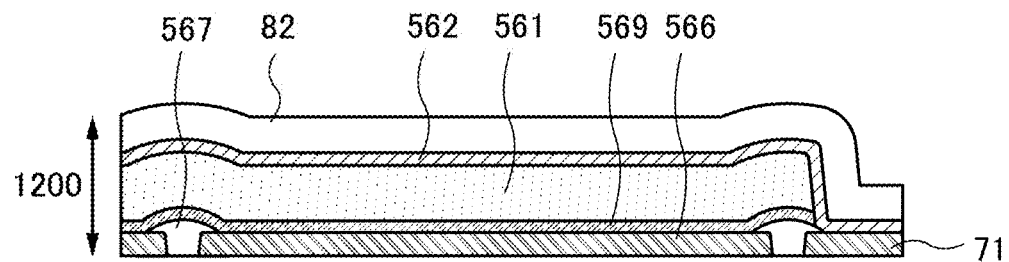
Figure 19C:
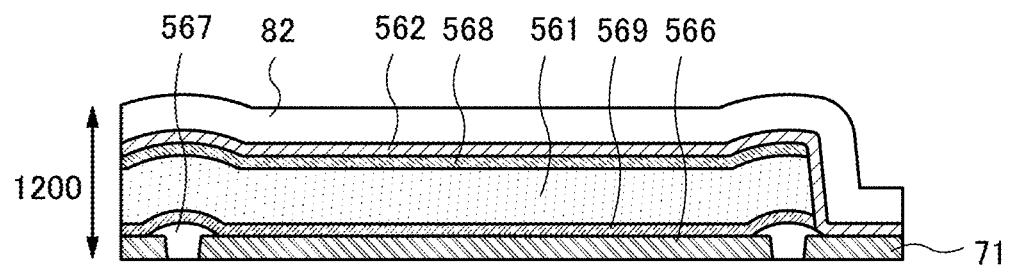

Although the photoelectric conversion layer 561 is a single layer in FIG. 18A, a layer of gallium oxide, cerium oxide, an In—Ga—Zn oxide, or the like may be provided as a hole injection blocking layer 568 on a light-receiving surface side as illustrated in FIG. 19A. Alternatively, as illustrated in FIG. 19B, a layer of nickel oxide, antimony sulfide, or the like may be provided as an electron injection blocking layer 569 on an electrode 566 side. Alternatively, as illustrated in FIG. 19C, the hole injection blocking layer 568 and the electron injection blocking layer 569 may be provided. Note that as illustrated in FIG. 1 and FIG. 12A, structures that differ from each other in the direction of connection of the photoelectric conversion element PD can be used. Thus, the hole injection blocking layer 568 and the electron injection blocking layer 569 in FIGS. 19A to 19C may be replaced with each other.

Furthermore, the photoelectric conversion layer 561 may be a layer including a compound of copper, indium, and selenium (CIS). Alternatively, a layer including a compound of copper, indium, gallium, and selenium (CIGS) may be used. With the CIS layer or the CIGS layer, a photoelectric conversion element that utilizes avalanche multiplication in a manner similar to that of a single layer of selenium can be formed.

In the photoelectric conversion element PD including a selenium-based material, for example, the photoelectric conversion layer 561 can be provided between a light-transmitting conductive layer 562 and the electrode 566 formed using a metal material or the like. CIS and CIGS are p-type semiconductors and may be formed in contact with an n-type semiconductor such as cadmium sulfide or zinc sulfide to form a junction.

Figure 20A:
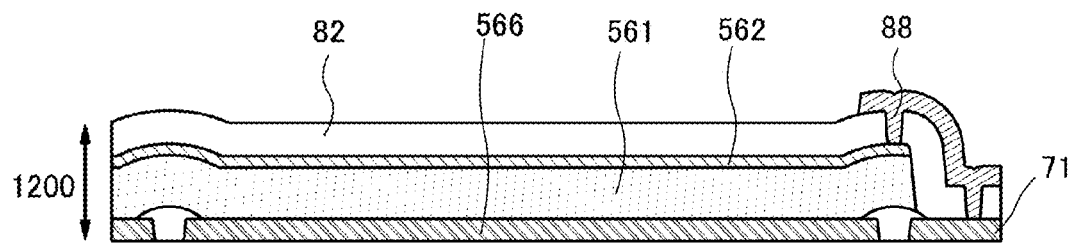
FIGS. 20A to 20D are cross-sectional views each illustrating connection of a photoelectric conversion element.
Figure 20B:
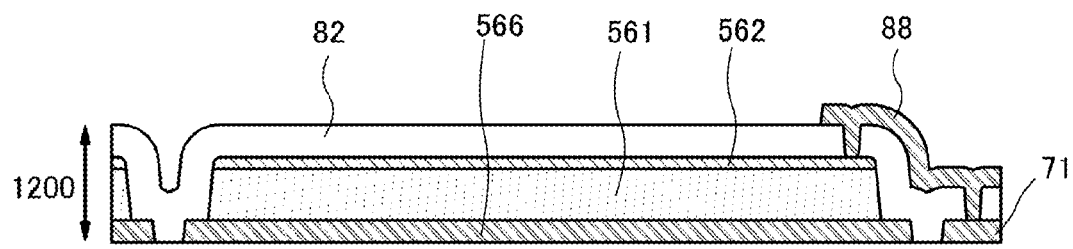
Figure 20C:
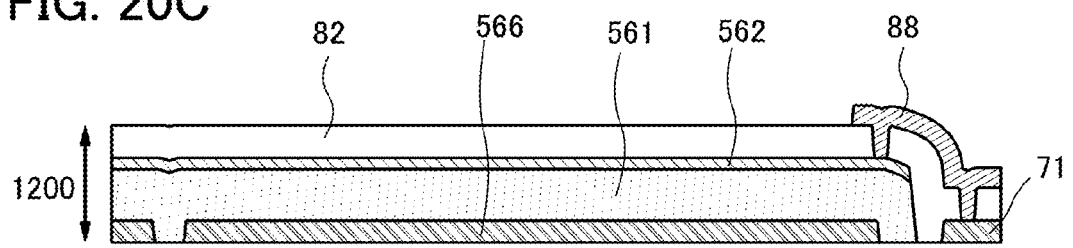
Figure 20D:
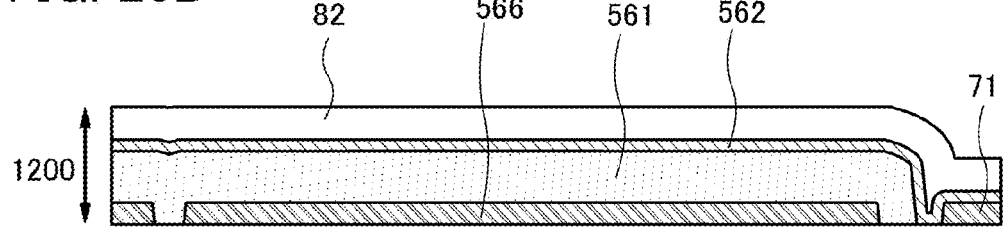

Although the light-transmitting conductive layer 562 is directly in contact with the wiring 71 in FIG. 18A, the light-transmitting conductive layer 562 may be in contact with the wiring 71 through a wiring 88 as illustrated in FIG. 20A. Although the photoelectric conversion layer 561 and the light-transmitting conductive layer 562 are not divided between pixel circuits in FIG. 18A, the photoelectric conversion layer 561 and the light-transmitting conductive layer 562 may be divided between circuits as illustrated in FIG. 20B. Furthermore, a partition wall 567 formed using an insulator is preferably provided in a region between pixels where the electrode 566 is not provided so as not to generate a crack in the photoelectric conversion layer 561 and the light-transmitting conductive layer 562; however, the partition wall 567 is not necessarily provided as illustrated in FIGS. 20C and 20D.

Figure 21A:
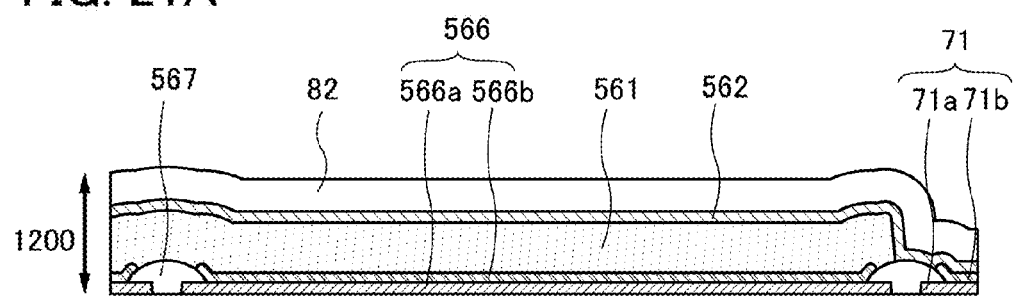
FIGS. 21A and 21B are cross-sectional views each illustrating connection of a photoelectric conversion element.

The electrode 566, the wiring 71, and the like may each be a multilayer. For example, as illustrated in FIG. 21A, the electrode 566 can include two conductive layers 566a and 566b and the wiring 71 can include two conductive layers 71a and 71b. In the structure of FIG. 21A, for example, the conductive layers 566a and 71a may be made of a low-resistance metal or the like, and the conductive layers 566b and 71b may be made of a metal or the like that exhibits an excellent contact property with the photoelectric conversion layer 561. Such a structure improves the electrical properties of the photoelectric conversion element PD. Furthermore, even when the conductive layer 71a contains a metal that causes electrolytic corrosion, which occurs when some kinds of metal are in contact with the light-transmitting conductive layer 562, electrolytic corrosion can be prevented because the conductive layer 71b is placed between the conductive layer 71a and the light-transmitting conductive layer 562.

The conductive layers 566b and 71b can be formed using, for example, molybdenum, tungsten, or the like. The conductive layers 566a and 71a can be formed using, for example, aluminum, titanium, or a stack of titanium, aluminum, and titanium that are layered in that order.

Figure 21B:
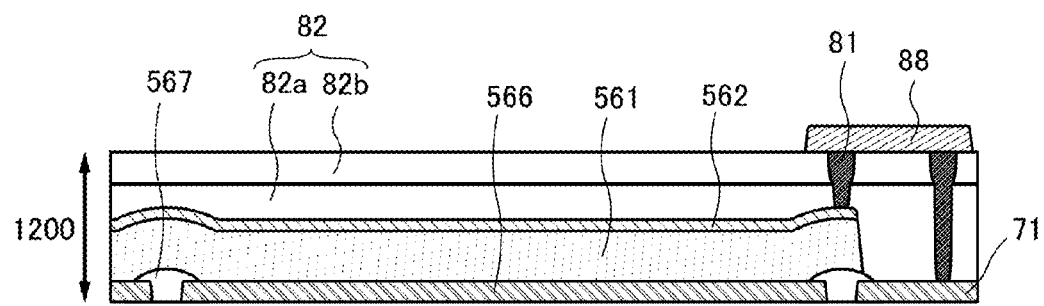

As illustrated in FIG. 21B, the light-transmitting conductive layer 562 and the wiring 71 may be connected to each other through the conductor 81 and the wiring 88. The insulating layer 82 and the like may each be a multilayer. For example, as illustrated in FIG. 21B, the conductor 81 has a difference in level in the case where the insulating layer 82 includes insulating layers 82a and 82b that have different etching rates. In the case where another insulating layer used as an interlayer insulating film or a planarization film is a multilayer, the conductor 81 also has a difference in level.

Although the insulating layer 82 is formed using two layers here, the insulating layer 82 and another insulating layer may each be formed using three or more layers.

The partition wall 567 can be formed using an inorganic insulator, an insulating organic resin, or the like. The partition wall 567 may be colored black or the like in order to shield the transistors and the like from light and/or to determine the area of a light-receiving portion in each pixel.

Alternatively, a PIN diode element or the like formed using an amorphous silicon film, a microcrystalline silicon film, or the like may be used as the photoelectric conversion element PD.

Figure 22:
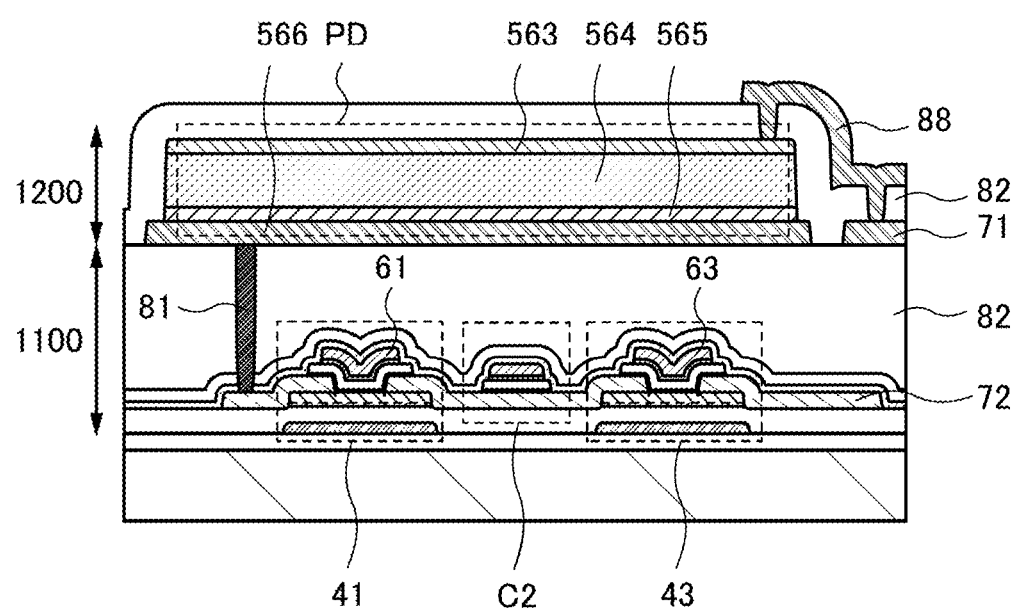
FIG. 22 is a cross-sectional view illustrating an imaging device.

FIG. 22 illustrates an example in which a thin film PIN photodiode is used as the photoelectric conversion element PD. In the photodiode, an n-type semiconductor layer 565, an i-type semiconductor layer 564, and a p-type semiconductor layer 563 are stacked in that order. The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element PD in FIG. 22, the n-type semiconductor layer 565 functioning as a cathode is in contact with the electrode 566 that is electrically connected to the transistor 41. Furthermore, the p-type semiconductor layer 563 functioning as an anode is electrically connected to the wiring 71 through the wiring 88.

Note that when the anode and the cathode of the photoelectric conversion element PD are oppositely connected to the electrode layer and the wiring, a structure corresponding to the circuit diagram in FIG. 12A can be used.

In any case, the photoelectric conversion element PD is preferably formed so that the p-type semiconductor layer 563 serves as a light-receiving surface. When the p-type semiconductor layer 563 serves as a light-receiving surface, the output current of the photoelectric conversion element PD can be increased.

Figure 23A:
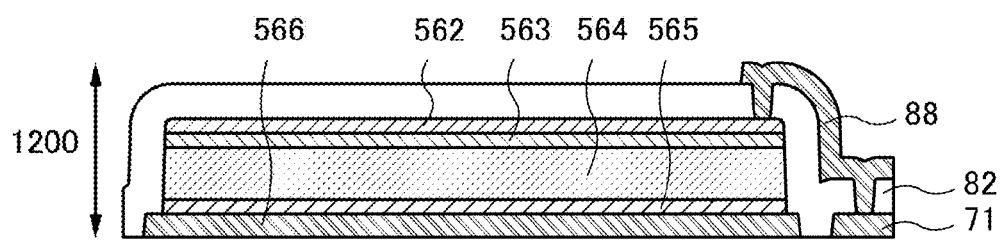
FIGS. 23A to 23C are cross-sectional views each illustrating connection of a photoelectric conversion element.
Figure 23B:
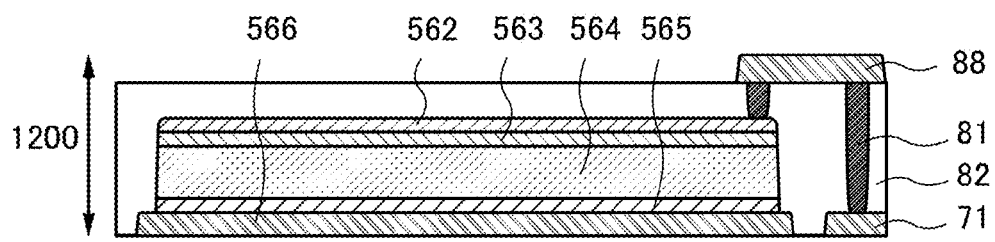
Figure 23C:
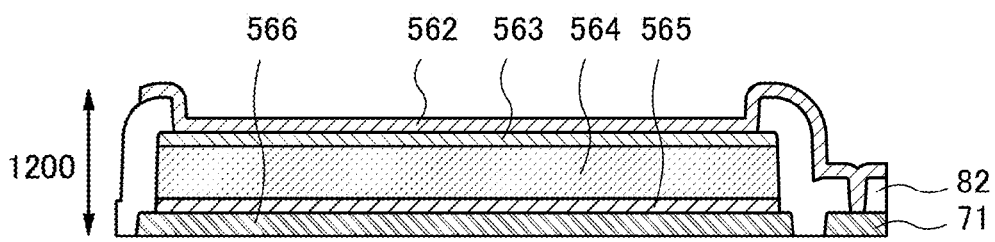

FIGS. 23A to 23C illustrate other examples of the structure of the photoelectric conversion element PD having a configuration of a PIN thin film photodiode and the connection between the photoelectric conversion element PD and the wirings. Note that the structure of the photoelectric conversion element PD and the connection between the photoelectric conversion element PD and the wirings are not limited thereto, and other configurations may be applied.

FIG. 23A illustrates the structure of the photoelectric conversion element PD that includes the light-transmitting conductive layer 562 in contact with the p-type semiconductor layer 563. The light-transmitting conductive layer 562 serves as an electrode and can increase the output current of the photoelectric conversion element PD.

For the light-transmitting conductive layer 562, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; graphene oxide; or the like. The light-transmitting conductive layer 562 is not limited to a single layer, and may be a stacked layer of different films.

In FIG. 23B, the light-transmitting conductive layer 562 and the wiring 71 are connected to each other through the conductor 81 and the wiring 88. Note that the p-type semiconductor layer 563 of the photoelectric conversion element PD and the wiring 71 can be connected to each other through the conductor 81 and the wiring 88. In FIG. 23B, the light-transmitting conductive layer 562 is not necessarily provided.

FIG. 23C illustrates a structure in which an opening exposing the p-type semiconductor layer 563 is provided in an insulating layer covering the photoelectric conversion element PD, and the light-transmitting conductive layer 562 that covers the opening is electrically connected to the wiring 71.

Figure 24:
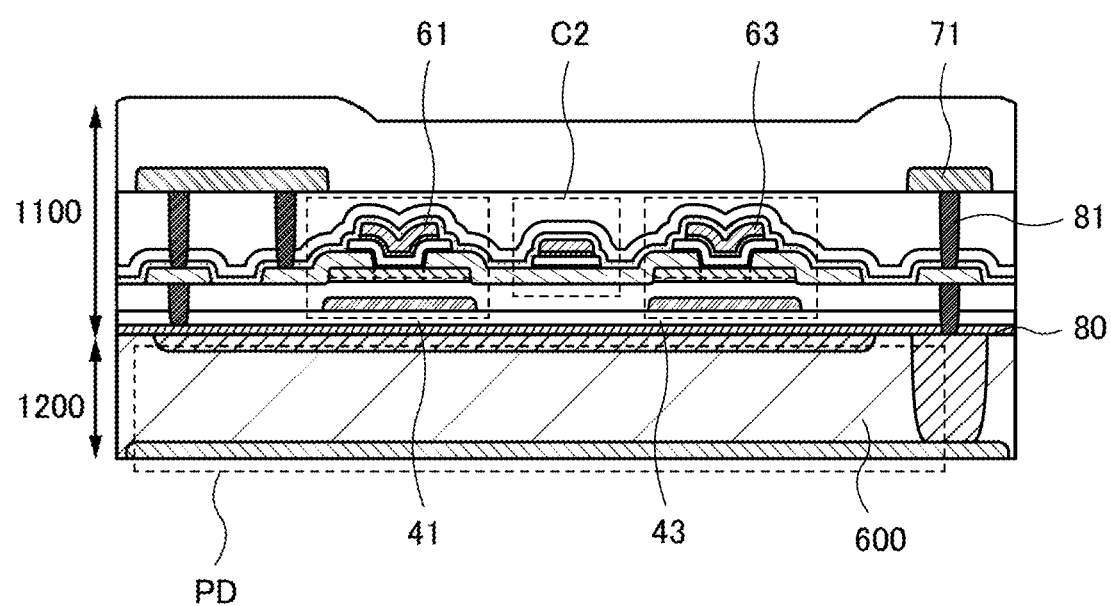
FIG. 24 is a cross-sectional view illustrating an imaging device.

Alternatively, as illustrated in FIG. 24, the photoelectric conversion element PD can be a photodiode including a silicon substrate 600 as a photoelectric conversion layer.

The photoelectric conversion element PD including the selenium-based material, amorphous silicon, or the like can be formed through general semiconductor manufacturing processes such as a deposition process, a lithography process, and an etching process. In addition, since the resistance of the selenium-based material is high, the photoelectric conversion layer 561 does not need to be divided between circuits as illustrated in FIG. 18A. Therefore, the imaging device in one embodiment of the present invention can be manufactured with a high yield at low cost. Furthermore, since the transistor and the like included in the pixel circuit and the photoelectric conversion element PD can be stacked, the aperture ratio that is defined as the proportion of the light-receiving surface of the photoelectric conversion element PD to the pixel area can be increased.

Figure 25A:
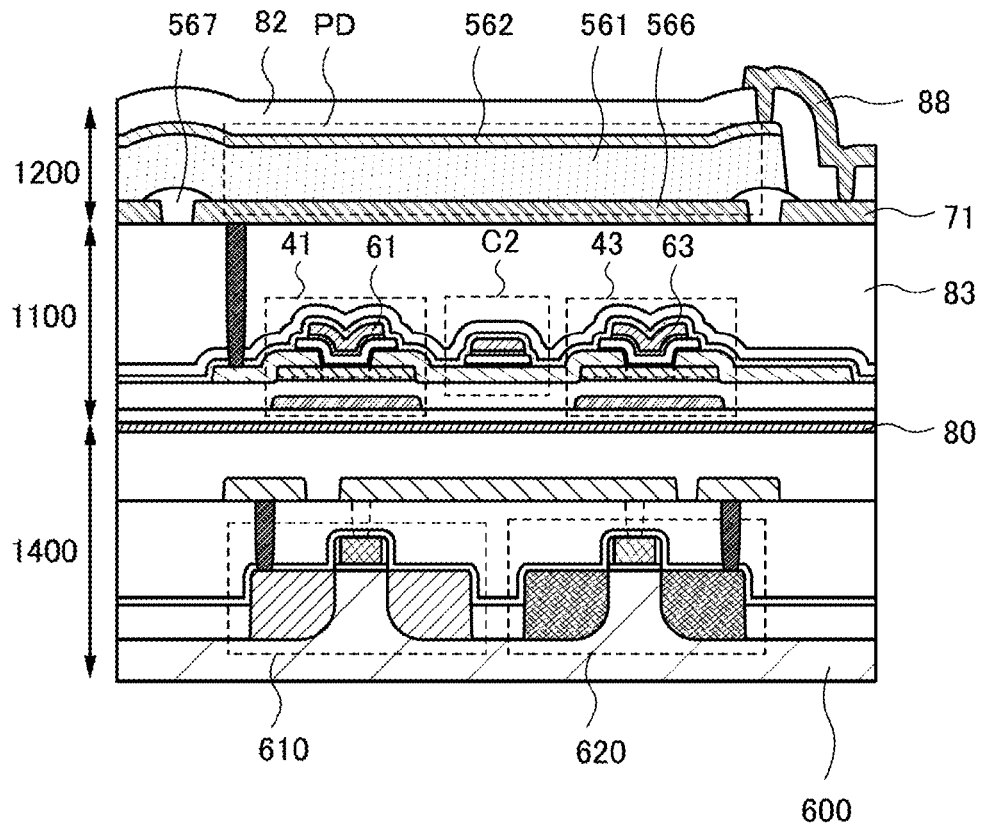
FIGS. 25A and 25B are cross-sectional views illustrating an imaging device.
Figure 25B:
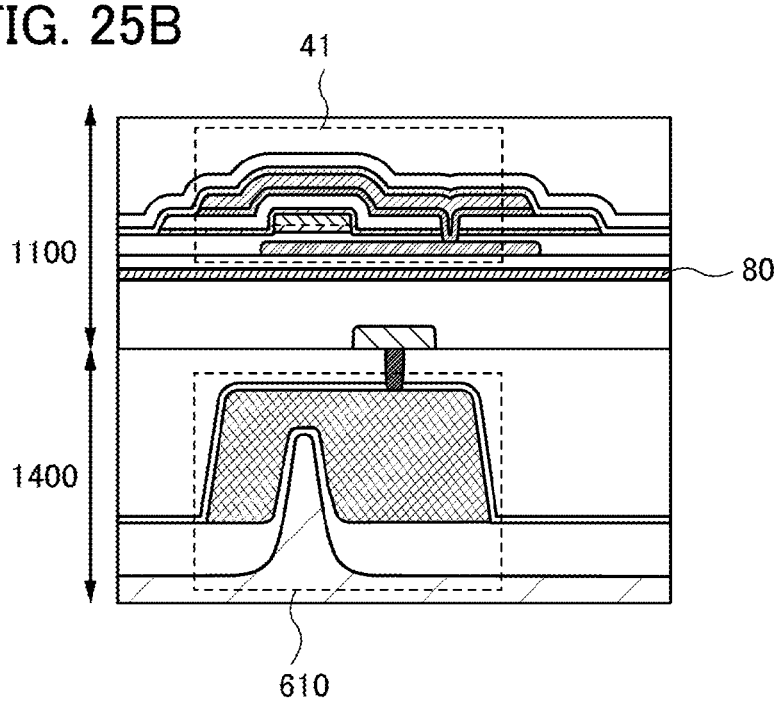

In the imaging device in one embodiment of the present invention, a stack including the silicon substrate 600 where a circuit is formed may be used. For example, as illustrated in FIG. 25A, the pixel circuit can overlap with a layer 1400 that includes transistors 610 and 620 whose active regions are formed in the silicon substrate 600. FIG. 25B is a cross-sectional view illustrating the transistors in a channel width direction.

Figure 26A:
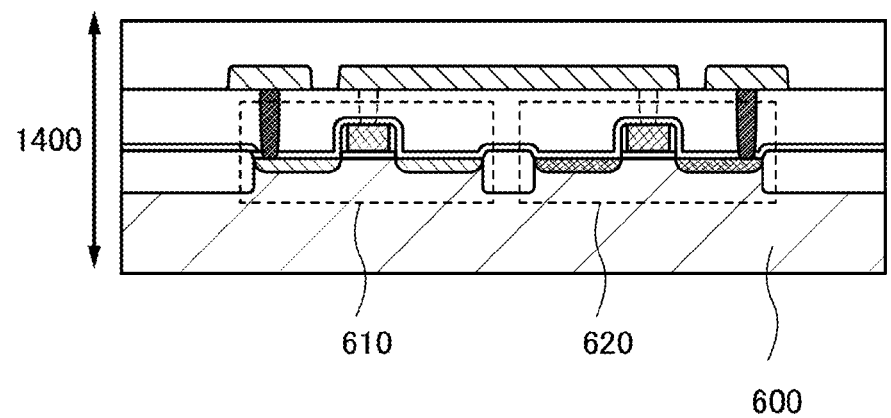
FIGS. 26A to 26C are cross-sectional views and a circuit diagram illustrating an imaging device.
Figure 26B:
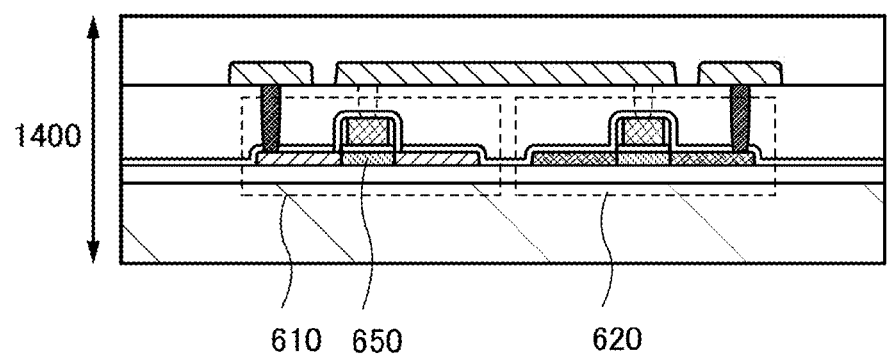

Although FIGS. 25A and 25B illustrate the Si transistors of a fin type, the transistors may be of a planar type as illustrated in FIG. 26A. As illustrated in FIG. 26B, the transistors may each be a transistor including an active layer 650 formed using a silicon thin film. The active layer 650 can be formed using polycrystalline silicon or single crystal silicon of a silicon-on-insulator (SOI) structure.

Figure 26C:
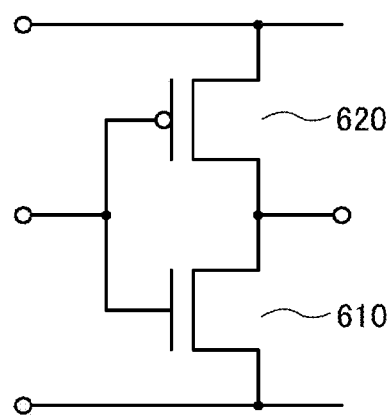

The circuit formed on the silicon substrate 600 is capable of reading a signal output from the pixel circuit and converting the signal; for example, the circuit can include a CMOS inverter as illustrated in the circuit diagram in FIG. 26C. A gate of the transistor 610 (n-channel transistor) is electrically connected to a gate of the transistor 620 (p-channel transistor). One of a source and a drain of one transistor is electrically connected to one of a source and a drain of the other transistor. The other of the source and the drain of the one transistor is electrically connected to a wiring, and the other of the source and the drain of the other transistor is electrically connected to another wiring.

The circuit formed on the silicon substrate 600 corresponds to each of the circuit 22, the circuit 23, the circuit 24, the circuit 25, and the like in FIG. 3A and FIG. 17B, for example.

Furthermore, the silicon substrate 600 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 24 and FIGS. 25A and 25B, an insulating layer 80 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 610 and 620. Therefore, hydrogen has an effect of improving the reliability of the transistors 610 and 620. Meanwhile, hydrogen in insulating layers which are provided in the vicinity of the oxide semiconductor layer that is the active layer of the transistor 51 or the like causes generation of carriers in the oxide semiconductor layer. Therefore, hydrogen might reduce the reliability of the transistor 51 or the like. Consequently, in the case where one layer including the transistor formed using a silicon-based semiconductor material and the other layer including the OS transistor are stacked, it is preferable that the insulating layer 80 having a function of preventing diffusion of hydrogen be provided between the layers. Hydrogen is confined in the one layer by the insulating layer 80, so that the reliability of the transistors 610 and 620 can be improved. Furthermore, diffusion of hydrogen from the one layer to the other layer is inhibited, so that the reliability of the transistor 41 or the like can also be improved.

The insulating layer 80 can be, for example, formed using aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

As illustrated in FIGS. 25A and 25B, a circuit (e.g., a driver circuit) formed on the silicon substrate 600, the transistor 51 or the like, and the photoelectric conversion element PD can overlap with each other; thus, the integration degree of pixels can be increased. In other words, the resolution of the imaging device can be increased. For example, such a structure is suitable for an imaging device whose number of pixels is 4K2K, 8K4K, 16K8K, or the like. Note that Si transistors are formed as the transistors 45 and 46 included in the pixel 20 to overlap with the transistor 41, the transistor 42, the transistor 43, the transistor 44, the photoelectric conversion element PD, and the like.

Figure 27:
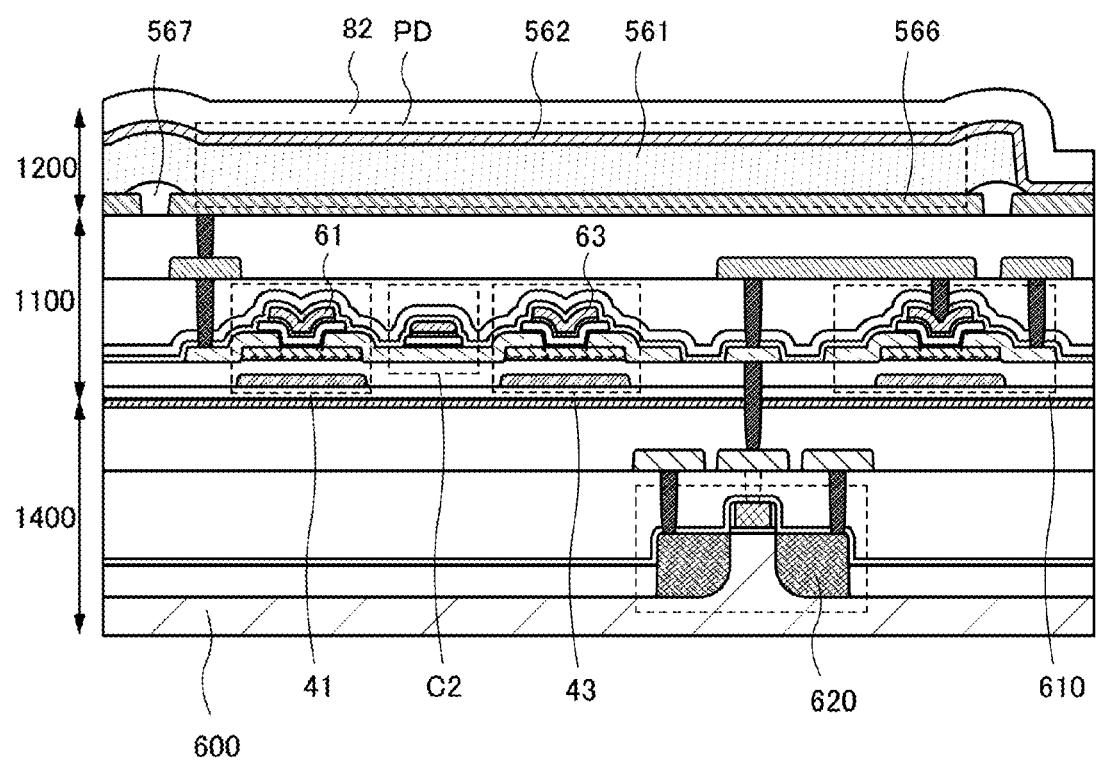
FIG. 27 is a cross-sectional view illustrating an imaging device.

The imaging device in one embodiment of the present invention can have a structure in FIG. 27. The imaging device in FIG. 27 is a modification example of the imaging device in FIG. 25A. A CMOS inverter is formed using an OS transistor and a Si transistor.

Here, the transistor 620 is a p-channel Si transistor provided in the layer 1400, and the transistor 610 is an n-channel OS transistor provided in the layer 1100. When only the p-channel transistor is provided on the silicon substrate 600, a step of forming a well, an n-type impurity layer, or the like can be skipped.

Although selenium or the like is used for the photoelectric conversion element PD in the imaging device in FIG. 27, a PIN thin film photodiode may be used as in FIG. 22.

In the imaging device in FIG. 27, the transistor 610 can be formed in the same process as the transistors 41 and 43 formed in the layer 1100. Thus, the manufacturing process of the imaging device can be simplified.

As illustrated in FIG. 28, an imaging device in one embodiment of the present invention may have a structure where a pixel includes the photoelectric conversion element PD formed on a silicon substrate 660 and OS transistors formed over the photoelectric conversion element PD and the pixel and the silicon substrate 600 on which the circuit is formed are attached to each other. Such a structure facilitates the increase in the effective area of the photoelectric conversion element PD formed on the silicon substrate 660. Furthermore, the circuit formed on the silicon substrate 600 can be highly integrated using miniaturized Si transistors; thus, a high-performance semiconductor device can be provided.

FIG. 29 illustrates a modification example of FIG. 28, in which a circuit includes an OS transistor and a Si transistor. Such a structure facilitates the increase in the effective area of the photoelectric conversion element PD formed on the silicon substrate 660. Furthermore, the circuit formed on the silicon substrate 600 can be highly integrated using miniaturized Si transistors; thus, a high-performance semiconductor device can be provided.

In the case of the structure in FIG. 29, a CMOS circuit can be formed using the Si transistor formed on the silicon substrate 600 and the OS transistor formed thereon. Since the off-state current of the OS transistor is extremely low, the static leakage current of the CMOS circuit can be extremely low.

Note that the structure of the transistor and the photoelectric conversion element included in each of the imaging devices described in this embodiment is only an example. Therefore, for example, one or more of the transistors 41 to 46 can be formed using a transistor in which an active region or an active layer includes silicon or the like. Furthermore, either one or both the transistors 610 and 620 can be formed using a transistor including an oxide semiconductor layer as an active layer.

Figure 30A:
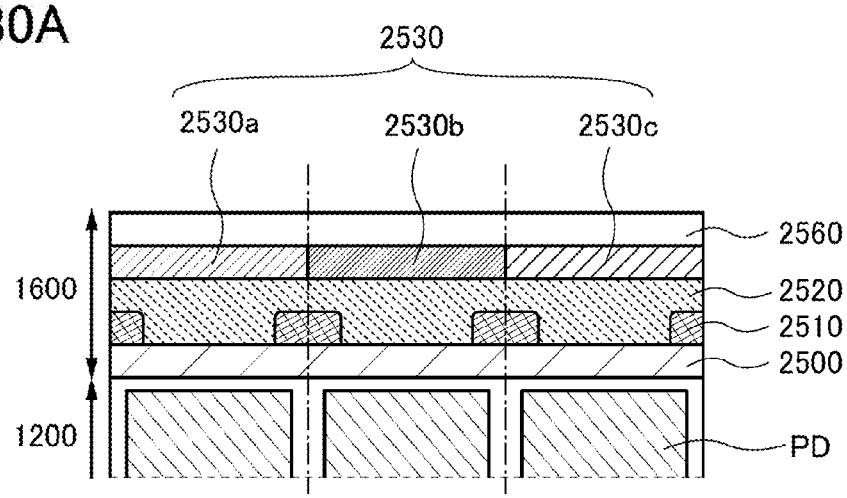
FIGS. 30A to 30D are cross-sectional views each illustrating the structure of an imaging device.

FIG. 30A is a cross-sectional view of an example of a mode in which a color filter and the like are added to the imaging device. The cross-sectional view illustrates part of a region including pixel circuits for three pixels. An insulating layer 2500 is formed over the layer 1200 where the photoelectric conversion element PD is formed. As the insulating layer 2500, for example, a silicon oxide film with a high visible-light transmitting property can be used. In addition, a silicon nitride film may be stacked as a passivation film. Furthermore, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the color filter. The light-blocking layer 2510 can be formed using a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530*a*, a color filter 2530*b*, and a color filter 2530*c*) is formed in each pixel. For example, a color filter 2530*a*, a color filter 2530*b*, and a color filter 2530*c* each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 30B:
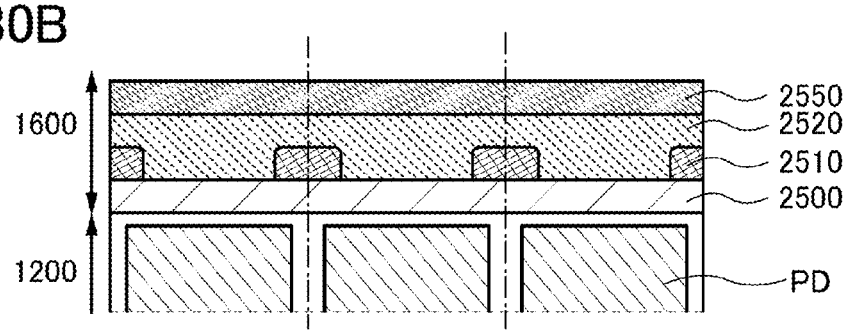

As illustrated in FIG. 30B, an optical conversion layer 2550 may be used instead of the color filter 2530. Such a structure enables the imaging device to capture images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that captures an image visualizing the intensity of radiation and is used for an X-ray imaging device, for example, can be obtained. Radiation such as X-rays passes through an object to enter a scintillator, and then is converted into light (fluorescence) such as visible light or ultraviolet light owing to a phenomenon known as photoluminescence. Then, the photoelectric conversion element PD detects the light to obtain image data. Furthermore, the imaging device having the structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which any of $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO is dispersed can be used.

In the photoelectric conversion element PD including a selenium-based material, radiation such as X-rays can be directly converted into charge; thus, the scintillator is not necessarily used.

Figure 30C:
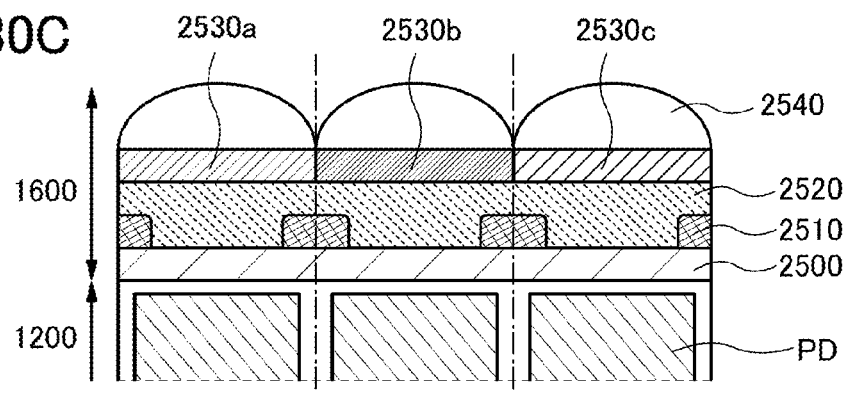
Figure 30D:
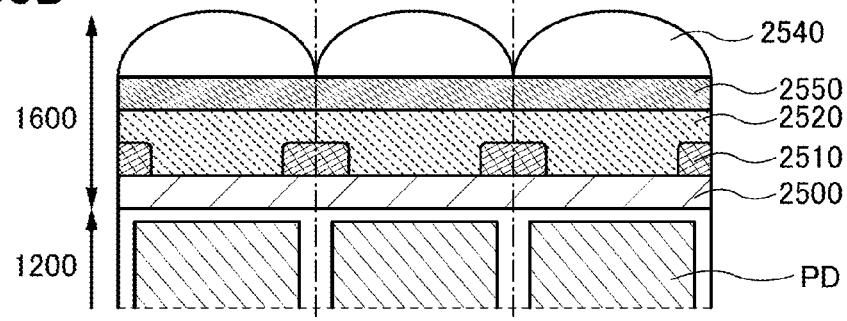

Alternatively, as illustrated in FIG. 30C, a microlens array 2540 may be provided over the color filters 2530*a*, 2530*b*, and 2530*c*. Light penetrating lenses included in the microlens array 2540 goes through the color filters positioned thereunder to reach the photoelectric conversion element PD. Alternatively, as illustrated in FIG. 30D, the microlens array 2540 may be provided over the optical conversion layer 2550. Note that a region other than the layer 1200 in FIGS. 30A to 30D is referred to as a layer 1600.

Figure 31:
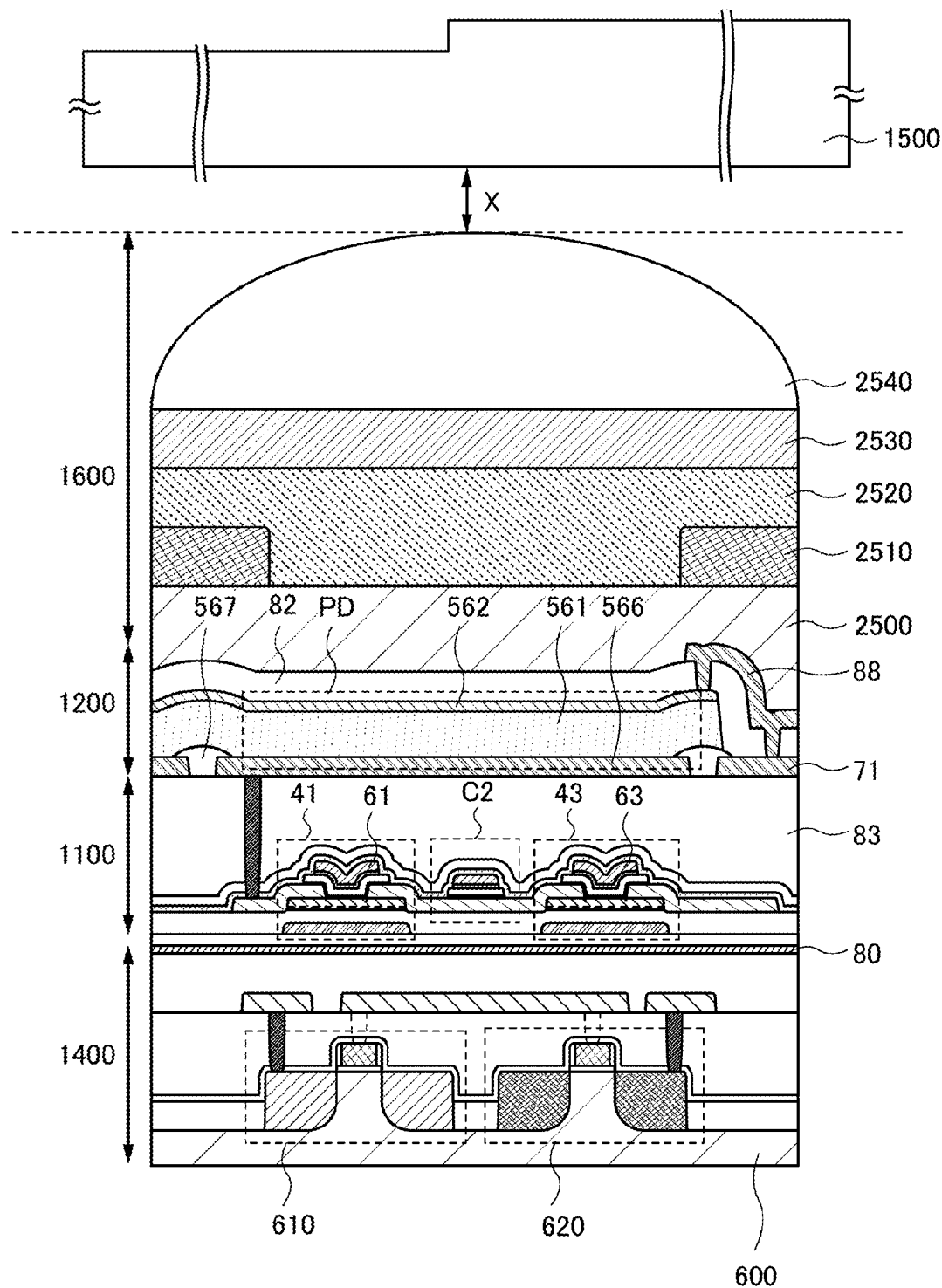
FIG. 31 is a cross-sectional view illustrating the structure of an imaging device.

FIG. 31 illustrates a specific example of a stacked structure including the pixel 20 in one embodiment of the present invention, the microlens array 2540 in FIG. 30C, and the like. In the example of FIG. 31, the structure of the pixel in FIG. 25A is used. In an example of FIG. 32, the structure of the pixel in FIG. 29 is used.

The photoelectric conversion element PD, the circuit of the pixel 20, and the driver circuit can be positioned to overlap with each other in this manner, so that the size of the imaging device can be reduced.

Figure 32:
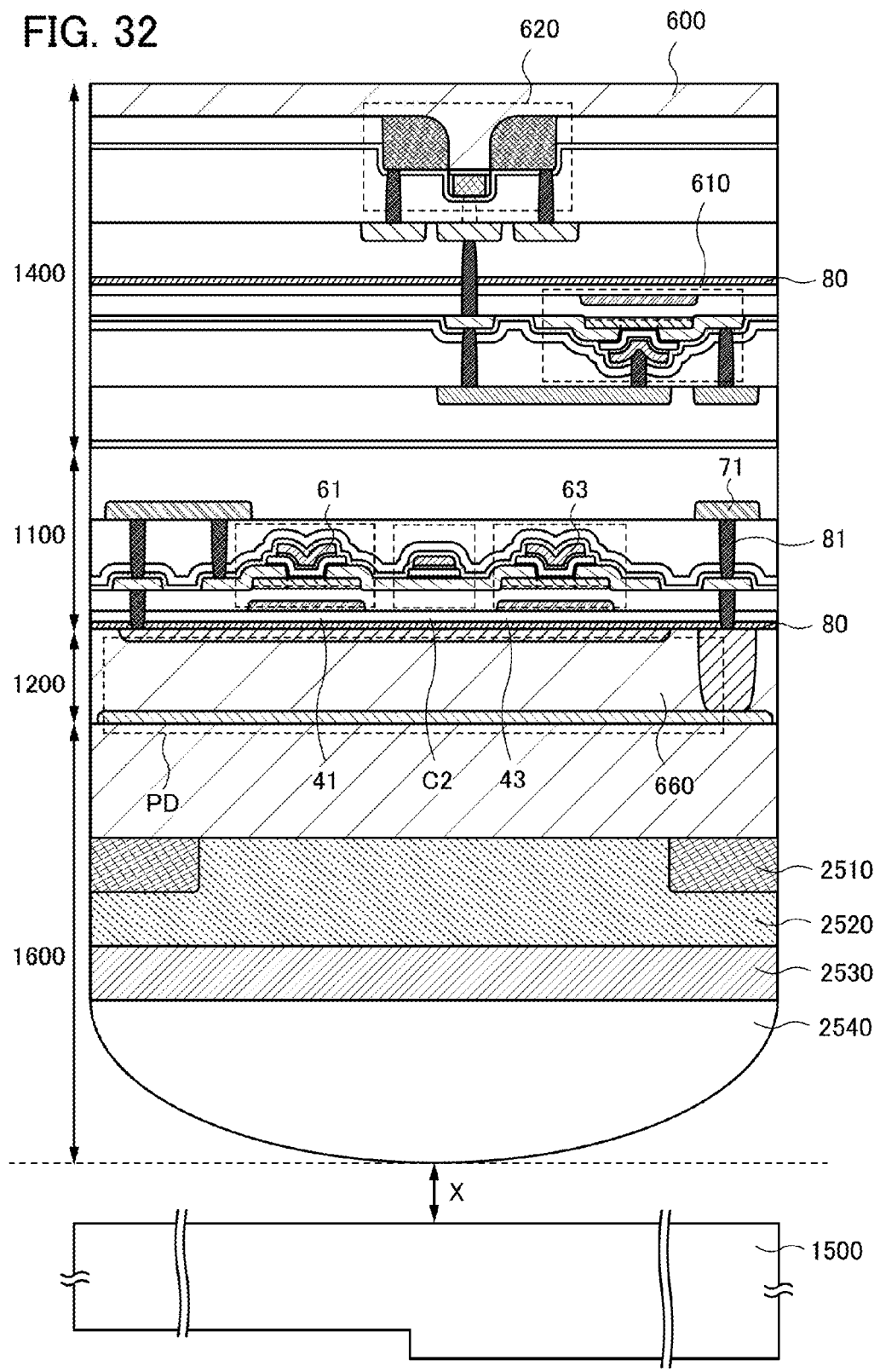
FIG. 32 is a cross-sectional view illustrating the structure of an imaging device.

As illustrated in FIG. 31 and FIG. 32, a diffraction grating 1500 may be provided above the microlens array 2540. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

A space X may be provided between the diffraction grating 1500 and the microlens array 2540. The space X can be less than or equal to 1 mm, preferably less than or equal to 100 µm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIGS. 33A1 and 33B1, the imaging device may be bent. FIG. 33A1 illustrates a state in which the imaging device is bent along dashed-two dotted line Y1-Y2. FIG. 33A2 is a cross-sectional view illustrating a portion indicated by dashed-two dotted line X1-X2 in FIG. 33A1. FIG. 33A3 is a cross-sectional view illustrating a portion indicated by dashed-two dotted line Y1-Y2 in FIG. 33A1.

FIG. 33B1 illustrates a state where the imaging device is bent along dashed-two dotted line X3-X4 and the direction of dashed-two dotted line Y3-Y4. FIG. 33B2 is a cross-sectional view illustrating a portion indicated by dashed-two dotted line X3-X4 in FIG. 33B1. FIG. 33B3 is a cross-sectional view illustrating a portion indicated by dashed-two dotted line Y3-Y4 in FIG. 33B1.

Bending the imaging device can reduce field curvature and astigmatism. Thus, the optical design of the lens and the like, which are used in combination of the imaging device, can be facilitated. For example, the number of lenses used for aberration correction can be reduced; accordingly, the size or weight of semiconductor devices including the imaging device can be easily reduced. In addition, the quality of captured images can be improved.

In this embodiment, one embodiment of the present invention has been described. Other embodiments of the present invention are described in the other embodiments. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor. Although an example in which a global shutter system is employed is described as one embodiment of the present invention, one embodiment of the present invention is not limited thereto. Depending on circumstances or conditions, another system such as a rolling shutter system may be employed in one embodiment of the present invention. Alternatively, depending on circumstances or conditions, the global shutter system is not necessarily employed.

This embodiment can be combined with any of the structures described in the other embodiments as appropriate.

(Embodiment 2)

In this embodiment, a transistor including an oxide semiconductor that can be used in one embodiment of the present invention is described with reference to drawings. In the drawings in this embodiment, some components are enlarged, reduced in size, or omitted for easy understanding.

Figure 34A:
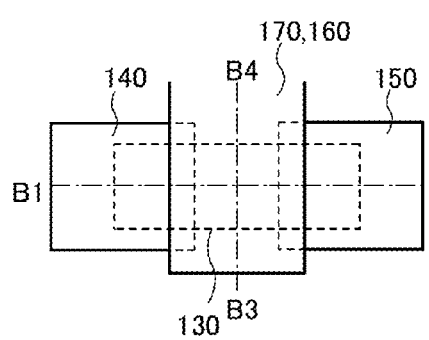
FIGS. 34A to 34F are top views and cross-sectional views illustrating a transistor.
Figure 34B:
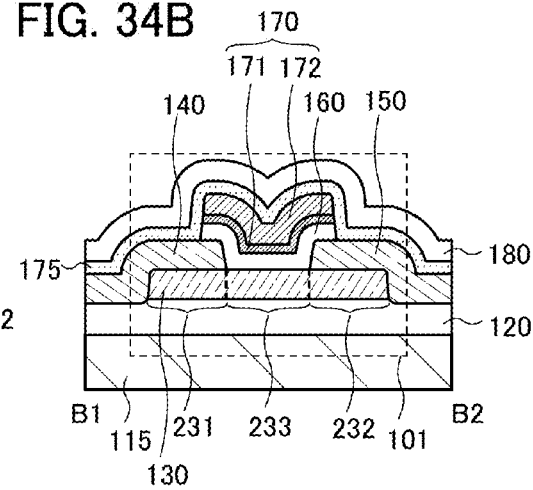
Figure 36A:
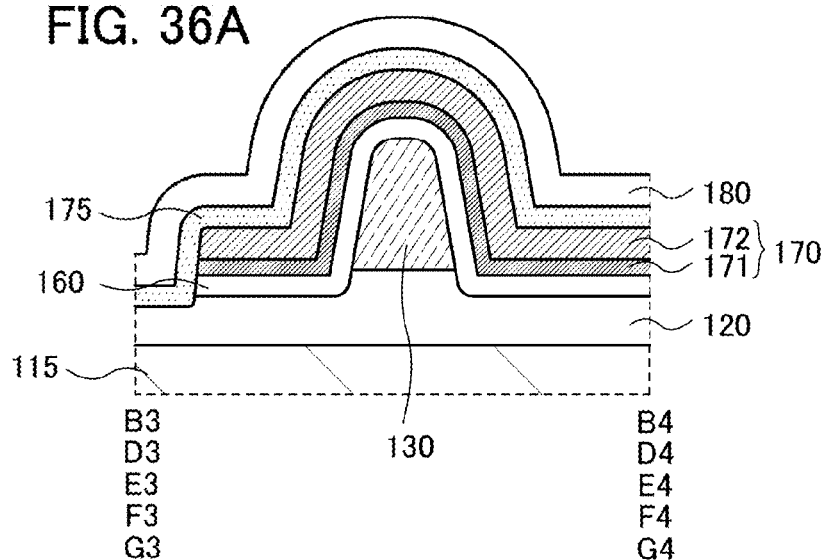
FIGS. 36A to 36D each illustrate a cross section of a transistor in a channel width direction.

FIGS. 34A and 34B are a top view and a cross-sectional view illustrating a transistor 101 in one embodiment of the present invention. FIG. 34A is a top view, and a cross section in the direction of dashed-dotted line B1-B2 in FIG. 34A is illustrated in FIG. 34B. A cross section in the direction of dashed-dotted line B3-B4 in FIG. 34A is illustrated in FIG. 36A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

The conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 34B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of an opposite conductivity type is used or when the direction of current flow is changed in circuit operation, for example. Therefore, the terms "source" and "drain" can be interchanged with each other in this specification. In addition, the term "electrode layer" can be changed into the term "wiring."

The conductive layer 170 includes two layers, conductive layers 171 and 172, but also may be a single layer or a stack of three or more layers. The same applies to other transistors described in this embodiment.

Each of the conductive layers 140 and 150 is a single layer, but also may be a stack of two or more layers. The same applies to other transistors described in this embodiment.

Figure 34C:
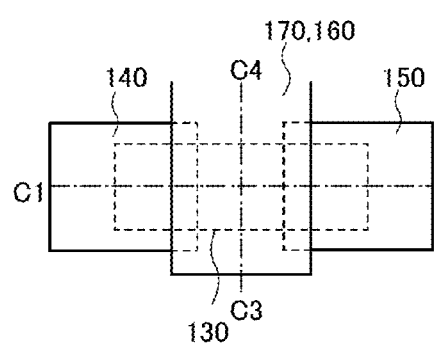
Figure 34D:
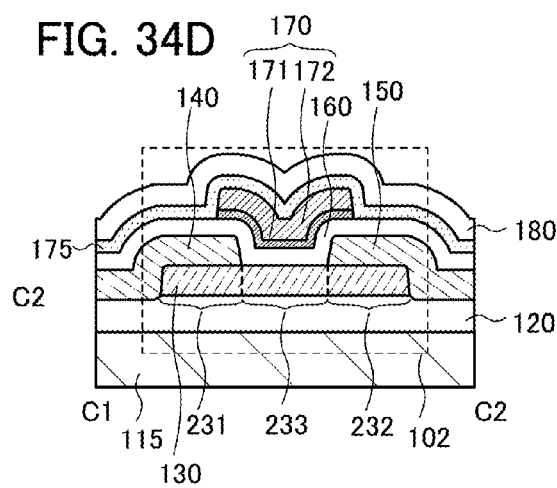
Figure 36B:
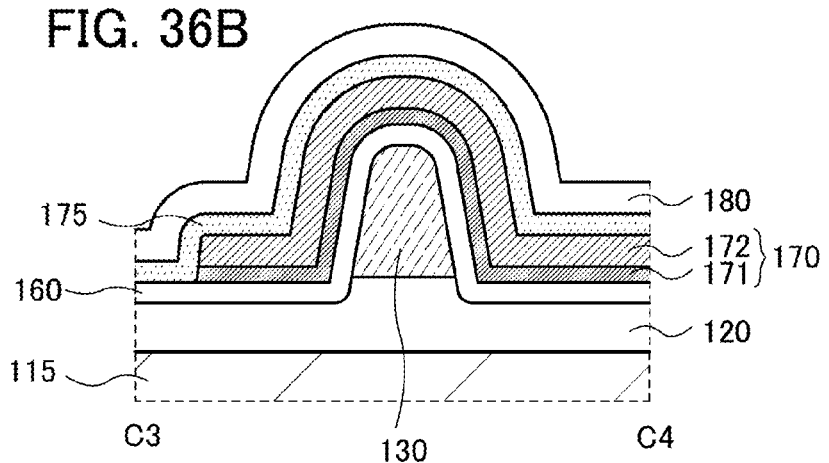

The transistor in one embodiment of the present invention may have a structure illustrated in FIGS. 34C and 34D. FIG. 34C is a top view of a transistor 102. A cross section in the direction of dashed-dotted line C1-C2 in FIG. 34C is illustrated in FIG. 34D. A cross section in the direction of dashed-dotted line C3-C4 in FIG. 34C is illustrated in FIG. 36B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with high on-state current can be easily formed.

Figure 34E:
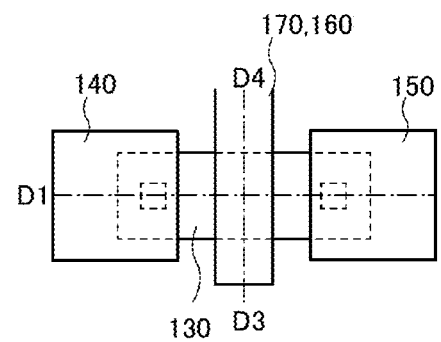
Figure 34F:
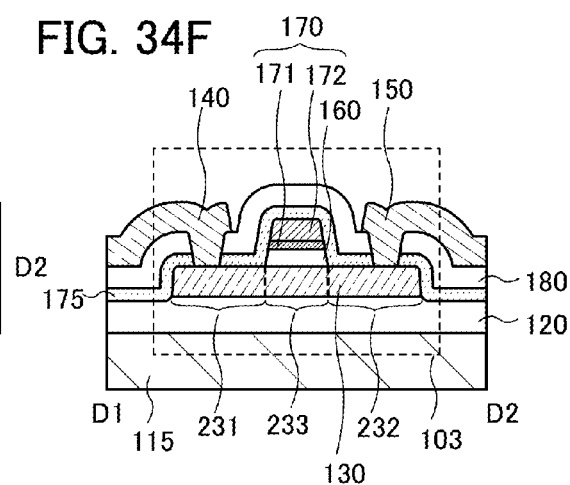

The transistor in one embodiment of the present invention may have a structure illustrated in FIGS. 34E and 34F. FIG. 34E is a top view of a transistor 103. A cross section in the direction of dashed-dotted line D1-D2 in FIG. 34E is illustrated in FIG. 34F. A cross section in the direction of dashed-dotted line D3-D4 in FIG. 34E is illustrated in FIG. 36A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

The conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 34F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 35A:
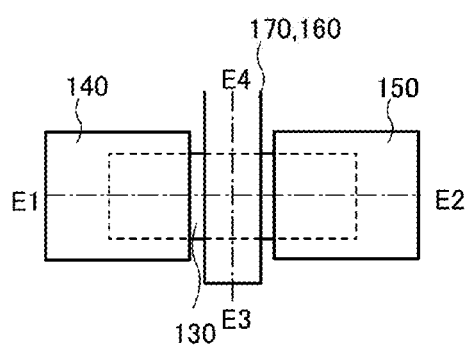
FIGS. 35A to 35F are top views and cross-sectional views illustrating a transistor.
Figure 35B:
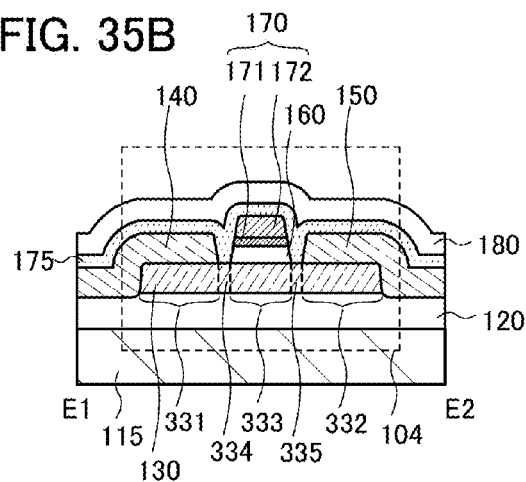

The transistor in one embodiment of the present invention may have a structure illustrated in FIGS. 35A and 35B. FIG. 35A is a top view of a transistor 104. A cross section in the direction of dashed-dotted line E1-E2 in FIG. 35A is illustrated in FIG. 35B. A cross section in the direction of dashed-dotted line E3-E4 in FIG. 35A is illustrated in FIG. 36A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 35B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 35C:
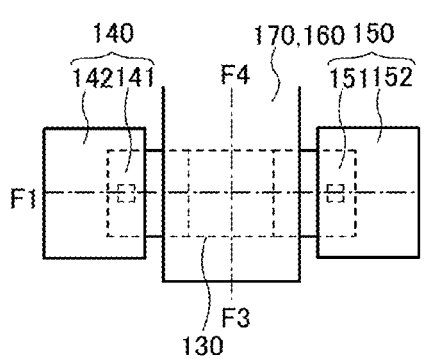
Figure 35D:
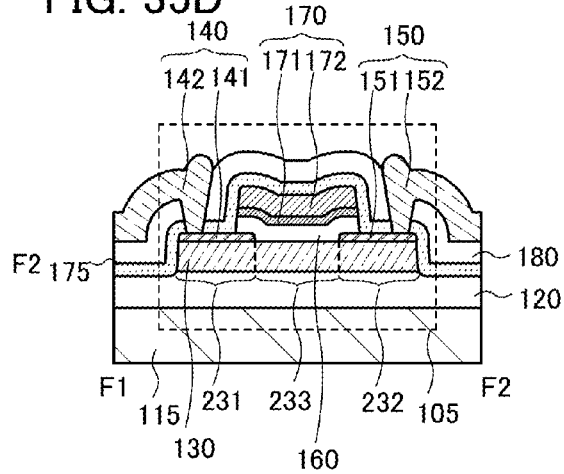

The transistor in one embodiment of the present invention may have a structure illustrated in FIGS. 35C and 35D. FIG. 35C is a top view of a transistor 105. A cross section in the direction of dashed-dotted line F1-F2 in FIG. 35C is illustrated in FIG. 35D. A cross section in the direction of dashed-dotted line F3-F4 in FIG. 35C is illustrated in FIG. 36A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 35E:
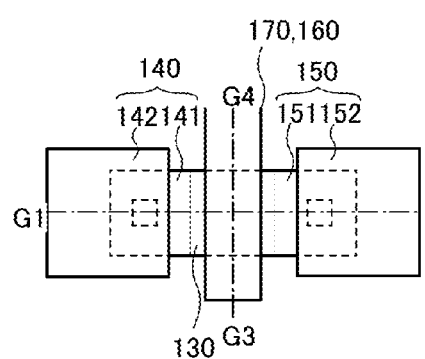
Figure 35F:
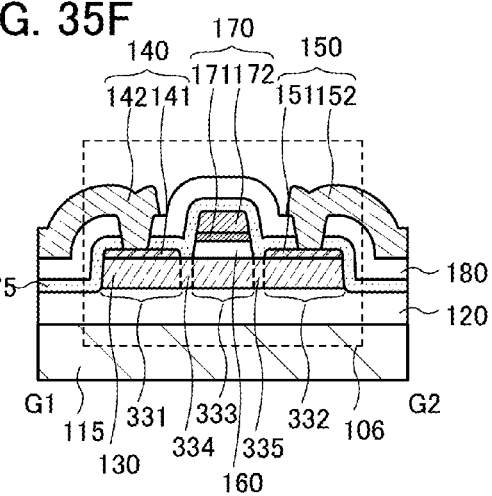

The transistor in one embodiment of the present invention may have a structure illustrated in FIGS. 35E and 35F. FIG. 35E is a top view of a transistor 106. A cross section in the direction of dashed-dotted line G1-G2 in FIG. 35E is illustrated in FIG. 35F. A cross section in the direction of dashed-dotted line G3-G4 in FIG. 35E is illustrated in FIG. 36A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

The conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property in a manner similar to the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 36C:
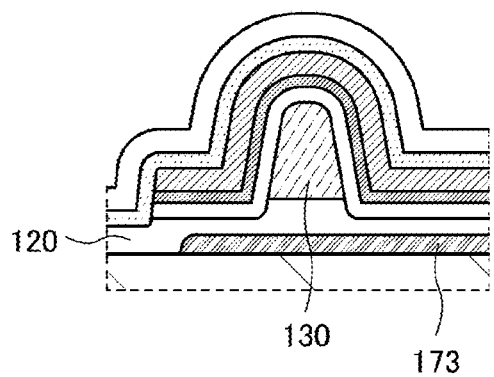
Figure 36D:
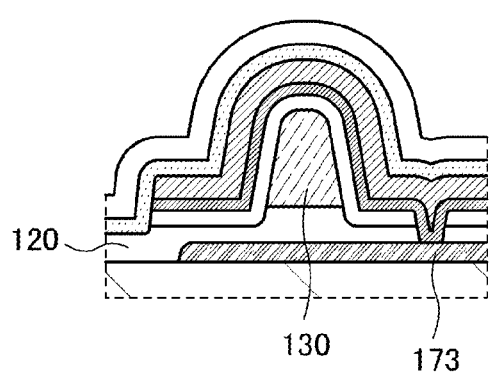
Figure 37A:
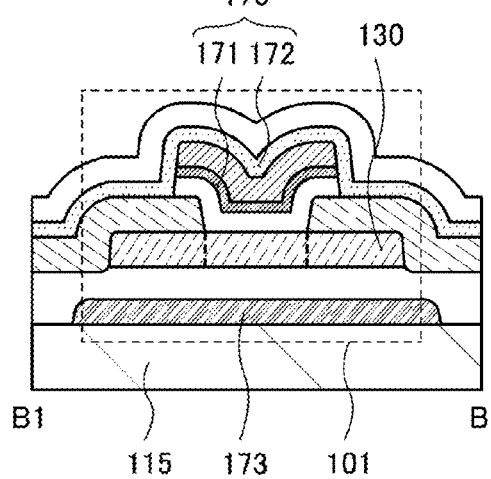
FIGS. 37A to 37F each illustrate a cross section of a transistor in a channel length direction.
Figure 37B:
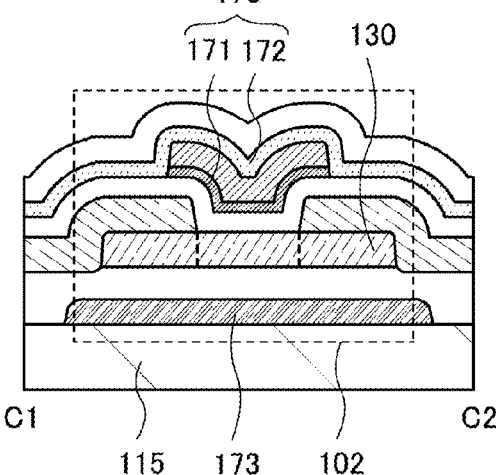
Figure 37C:
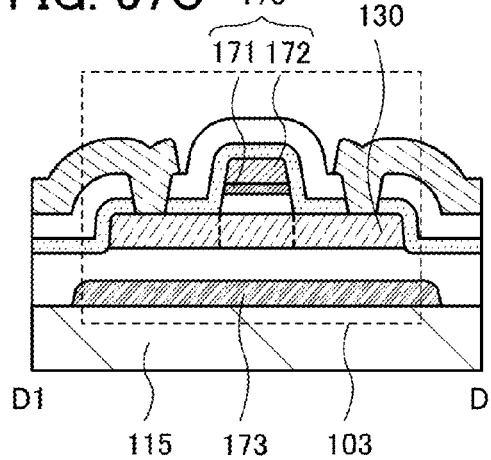
Figure 37D:
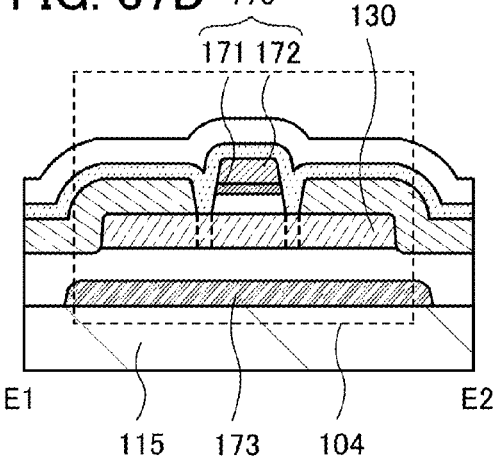
Figure 37E:
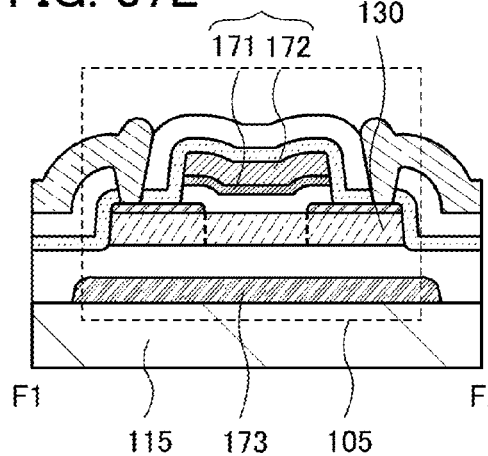
Figure 37F:
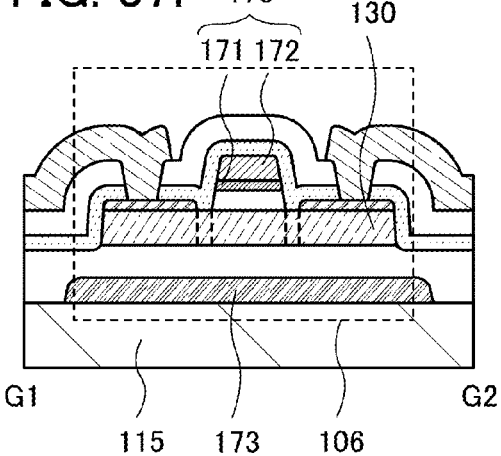

The transistor in one embodiment of the present invention may include a conductive layer 173 between the oxide semiconductor layer 130 and the substrate 115 as illustrated in cross-sectional views in the channel length direction in FIGS. 37A to 37F and cross-sectional views in the channel width direction in FIGS. 36C and 36D. When the conductive layer 173 is used as a second gate electrode layer (back gate), the on-state current can be increased or the threshold voltage can be controlled. In the cross-sectional views in FIGS. 37A to 37F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 36D, the conductive layers 170 and 173 may be electrically connected to each other through a contact hole.

Although the transistors 101 to 106 in FIGS. 34A to 34F and FIGS. 35A to 35F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIG. 38B, 38C, 38D, or 38E.

Figure 38A:
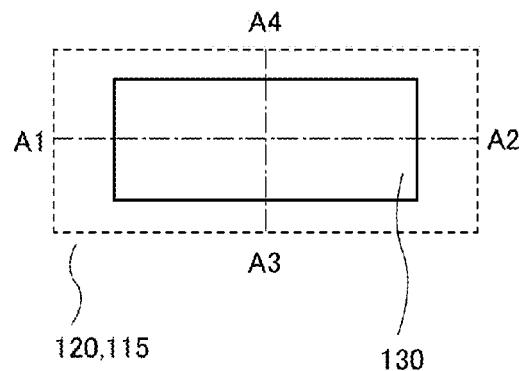
FIGS. 38A to 38E are a top view and cross-sectional views illustrating a semiconductor layer.
Figure 38B:
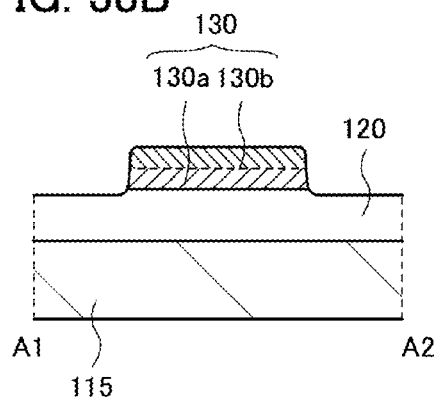
Figure 38C:
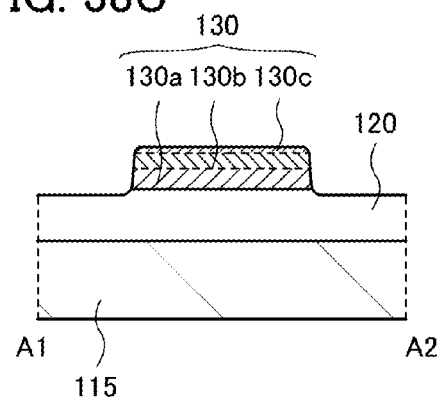
Figure 38D:
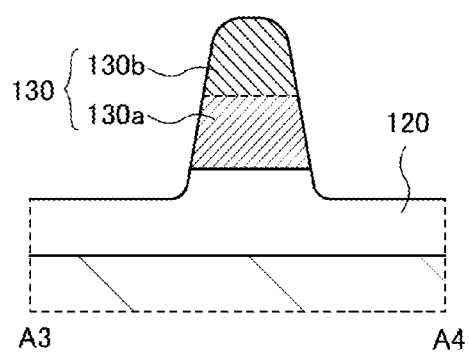
Figure 38E:
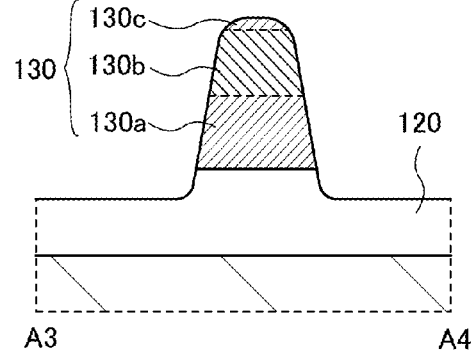

FIG. 38A is a top view of the oxide semiconductor layer 130, and FIGS. 38B and 38C are cross-sectional views of the oxide semiconductor layer 130 with a two-layer structure. FIGS. 38D and 38E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 39A:
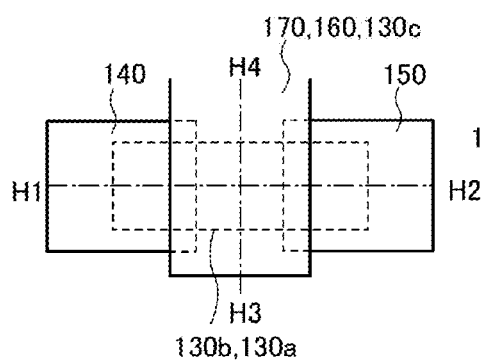
FIGS. 39A to 39F are top views and cross-sectional views illustrating a transistor.
Figure 39B:
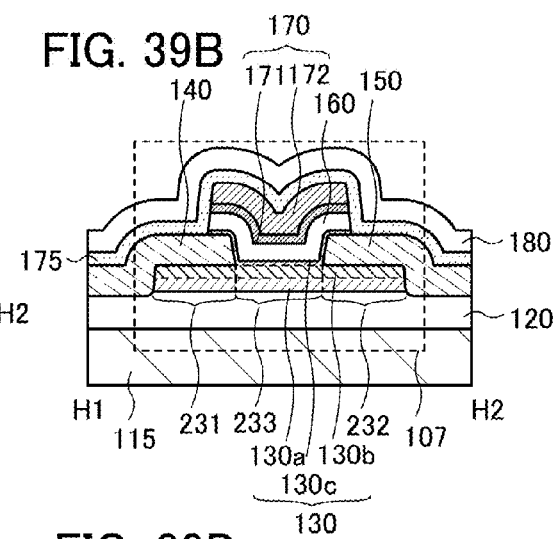
Figure 41A:
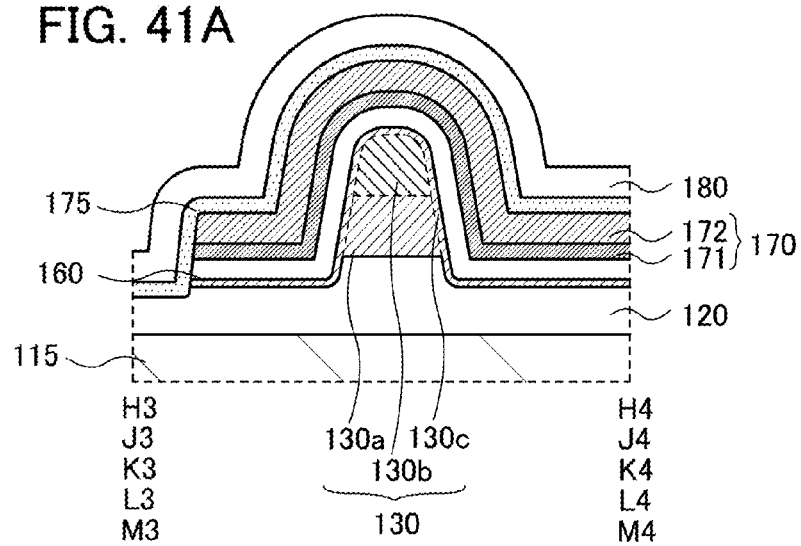
FIGS. 41A to 41D each illustrate a cross section of a transistor in a channel width direction.

The transistor in one embodiment of the present invention may have a structure illustrated in FIGS. 39A and 39B. FIG. 39A is a top view of a transistor 107. A cross section in the direction of dashed-dotted line H1-H2 in FIG. 39A is illustrated in FIG. 39B. A cross section in the direction of dashed-dotted line H3-H4 in FIG. 39A is illustrated in FIG. 41A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 39C:
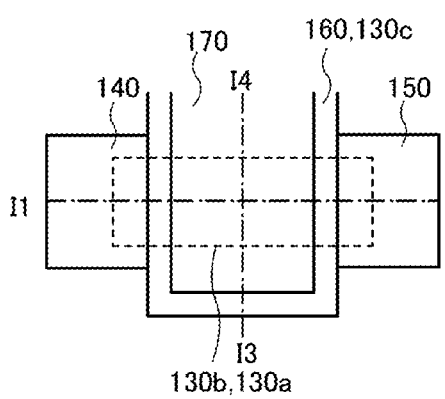
Figure 39D:
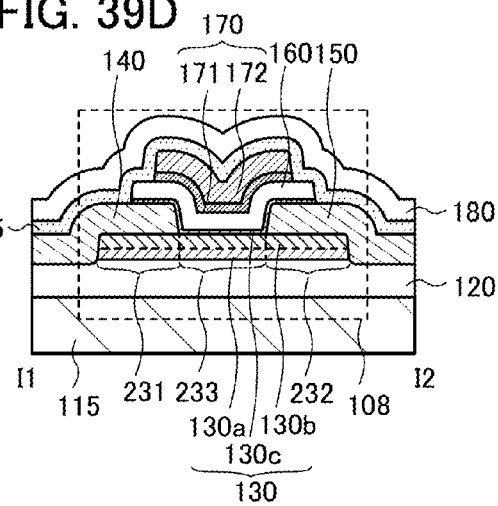
Figure 41B:
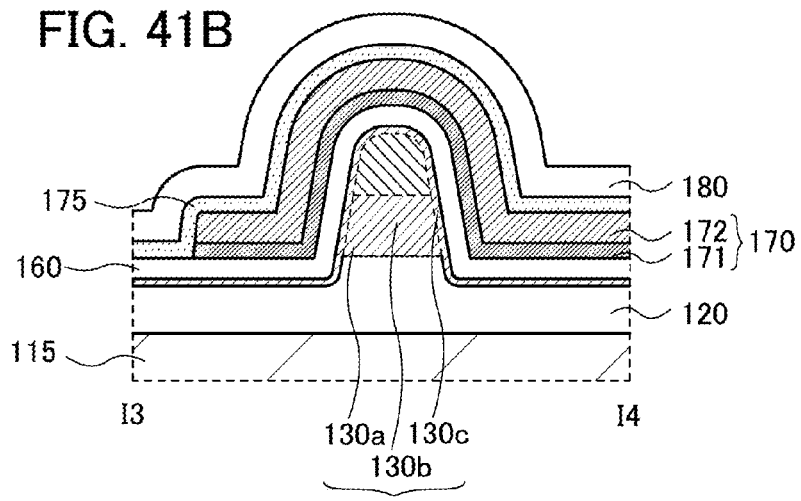

The transistor in one embodiment of the present invention may have a structure illustrated in FIGS. 39C and 39D. FIG. 39C is a top view of a transistor 108. A cross section in the direction of dashed-dotted line I1-I2 in FIG. 39C is illustrated in FIG. 39D. A cross section in the direction of dashed-dotted line I3-I4 in FIG. 39C is illustrated in FIG. 41B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with the end portion of the conductive layer 170.

Figure 39E:
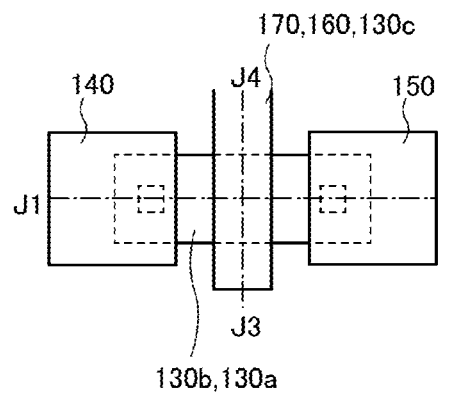
Figure 39F:
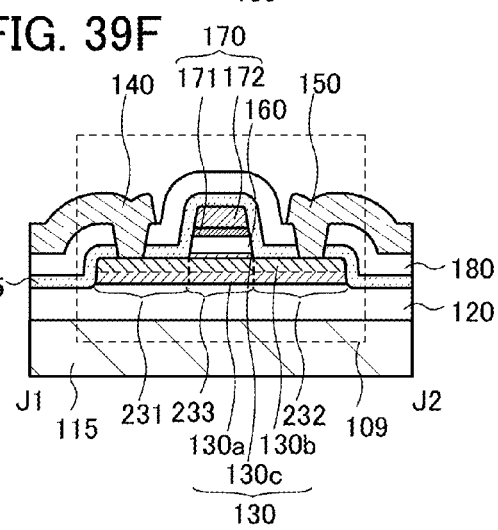

The transistor in one embodiment of the present invention may have a structure illustrated in FIGS. 39E and 39F. FIG. 39E is a top view of a transistor 109. A cross section in the direction of dashed-dotted line J1-J2 in FIG. 39E is illustrated in FIG. 39F. A cross section in the direction of dashed-dotted line J3-J4 in FIG. 39E is illustrated in FIG. 41A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 40A:
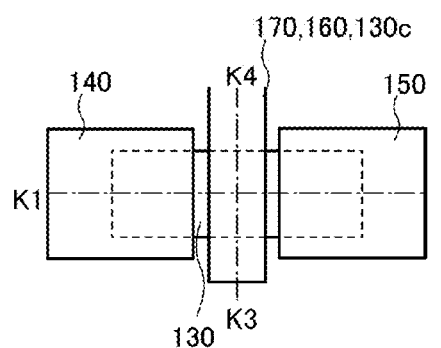
FIGS. 40A to 40F are top views and cross-sectional views illustrating a transistor.
Figure 40B:
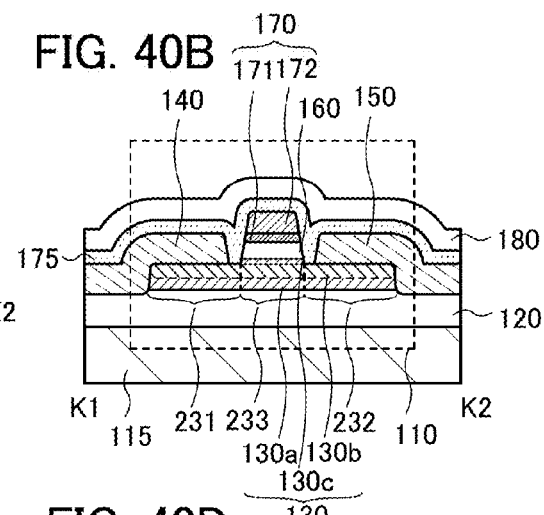

The transistor in one embodiment of the present invention may have a structure illustrated in FIGS. 40A and 40B. FIG. 40A is a top view of a transistor 110. A cross section in the direction of dashed-dotted line K1-K2 in FIG. 40A is illustrated in FIG. 40B. A cross section in the direction of dashed-dotted line K3-K4 in FIG. 40A is illustrated in FIG. 41A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 40C:
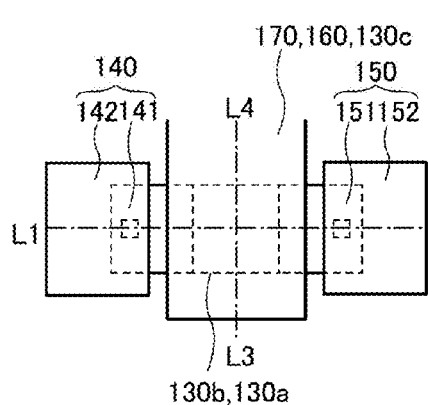
Figure 40D:
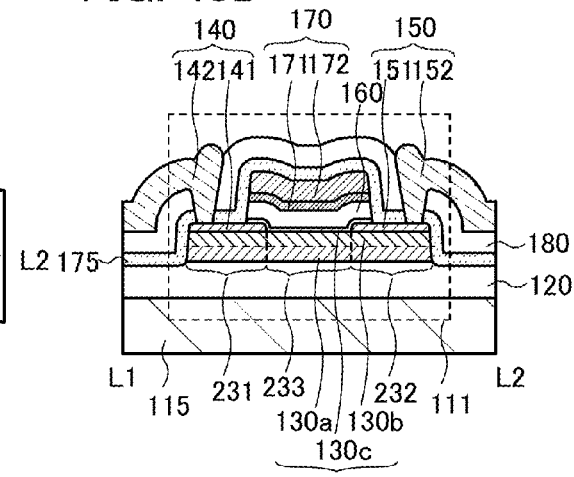

The transistor in one embodiment of the present invention may have a structure illustrated in FIGS. 40C and 40D. FIG. 40C is a top view of a transistor 111. A cross section in the direction of dashed-dotted line L1-L2 in FIG. 40C is illustrated in FIG. 40D. A cross section in the direction of dashed-dotted line L3-L4 in FIG. 40C is illustrated in FIG. 41A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 40E:
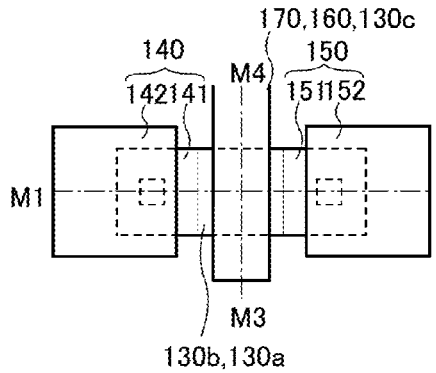
Figure 40F:
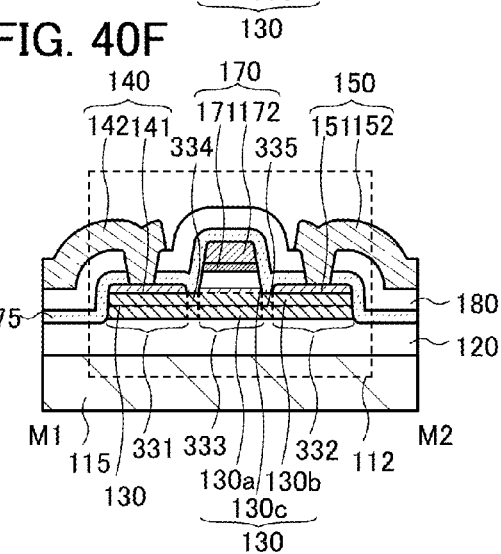

The transistor in one embodiment of the present invention may have a structure illustrated in FIGS. 40E and 40F. FIG. 40E is a top view of a transistor 112. A cross section in the direction of dashed-dotted line M1-M2 in FIG. 40E is illustrated in FIG. 40F. A cross section in the direction of dashed-dotted line M3-M4 in FIG. 40E is illustrated in FIG. 41A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 41C:
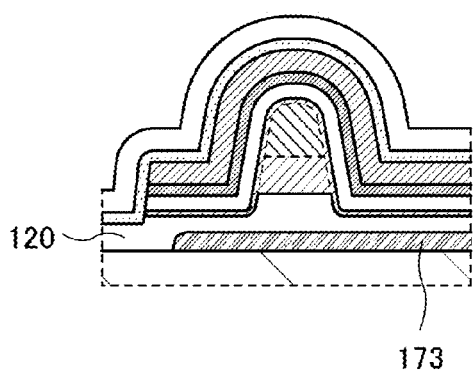
Figure 41D:
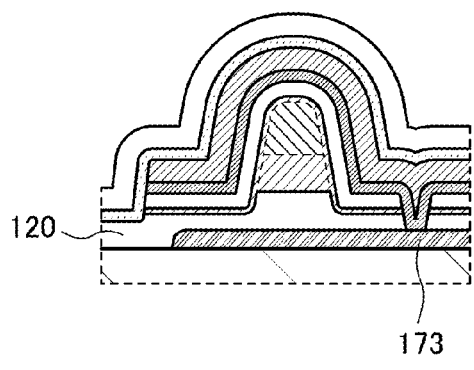
Figure 42A:
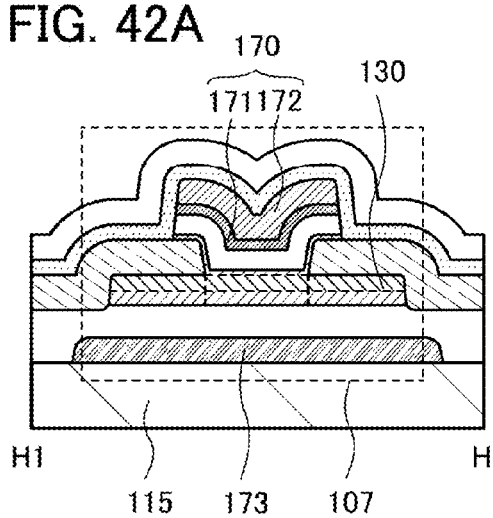
FIGS. 42A to 42F each illustrate a cross section of a transistor in a channel length direction.
Figure 42B:
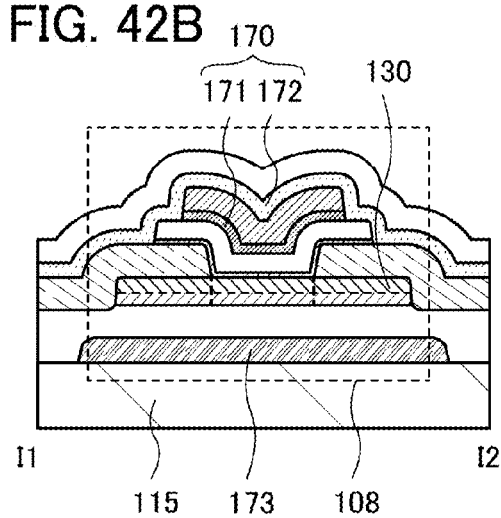
Figure 42C:
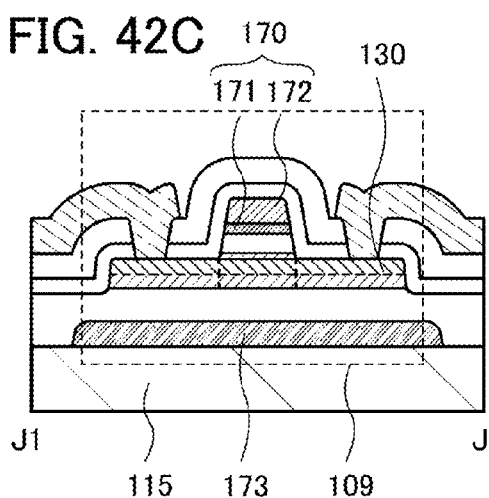
Figure 42D:
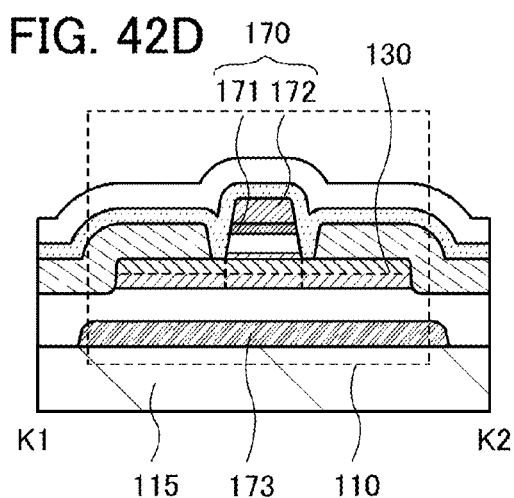
Figure 42E:
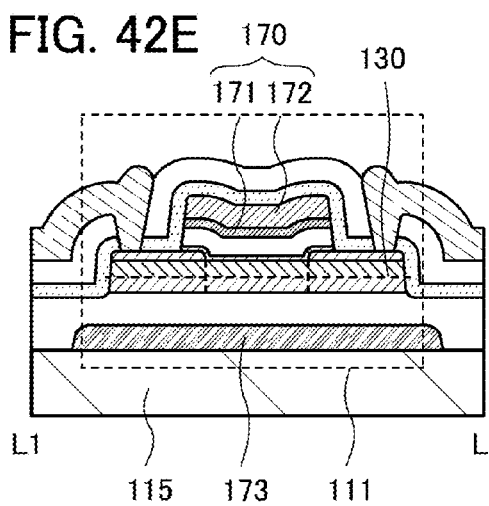
Figure 42F:
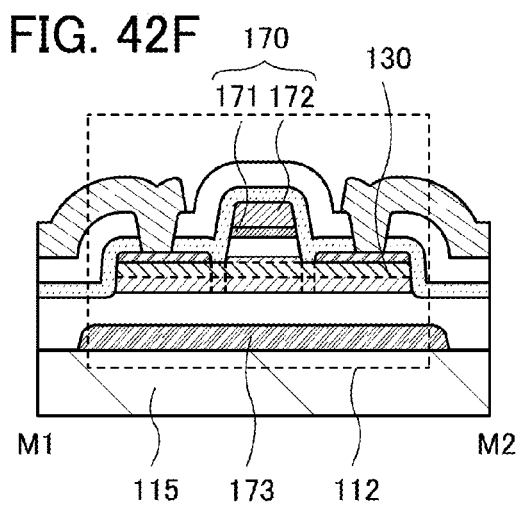

The transistor in one embodiment of the present invention may include the conductive layer 173 between the oxide semiconductor layer 130 and the substrate 115 as illustrated in cross-sectional views in the channel length direction in FIGS. 42A to 42F and cross-sectional views in the channel width direction in FIGS. 41C and 41D. When the conductive layer is used as a second gate electrode layer (back gate), the on-state current can be increased or the threshold voltage can be controlled. In the cross-sectional views in FIGS. 42A to 42F, the width of the conductive layer 173 may be shorter than that of the oxide semiconductor layer 130. Moreover, the width of the conductive layer 173 may be shorter than that of the conductive layer 170.

Figure 43A:
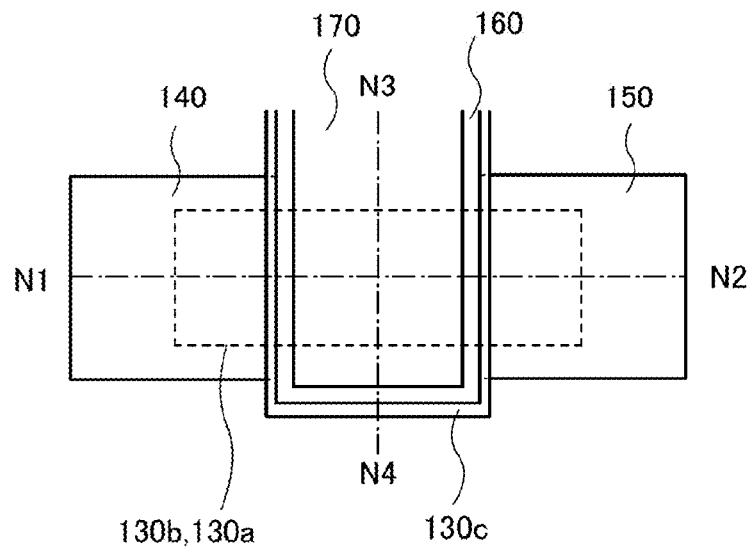
FIGS. 43A and 43B are a top view and a cross-sectional view illustrating a transistor.
Figure 43B:
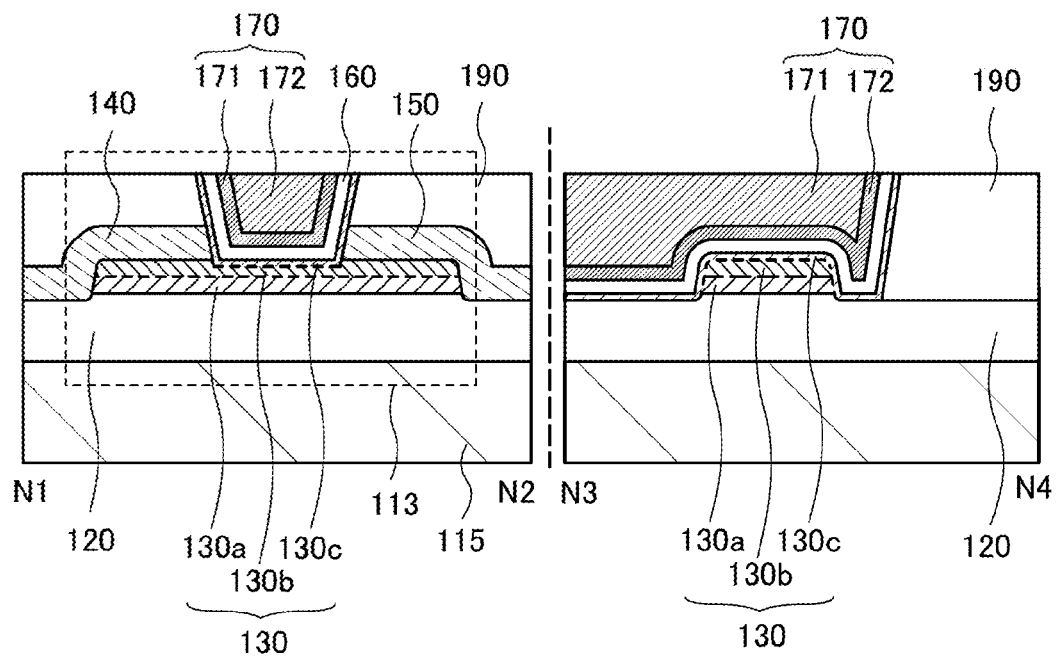

The transistor in one embodiment of the present invention can have a structure illustrated in FIGS. 43A and 43B. FIG. 43A is a top view and FIG. 43B is a cross-sectional view taken along dashed-dotted line N1-N2 and dashed-dotted line N3-N4 in FIG. 43A. Note that for simplification of the drawing, some components are not illustrated in the top view in FIG. 43A.

A transistor 113 in FIGS. 43A and 43B includes the substrate 115, the insulating layer 120 over the substrate 115, the oxide semiconductor layer 130 (the oxide semiconductor layers 130a to 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening that is provided in the insulating layer 190 over the transistor 113 and reaches the oxide semiconductor layers 130a and 130b and the insulating layer 120.

The transistor 113 has a smaller region in which a conductor serving as a source or a drain overlaps with a conductor serving as a gate electrode than the other transistors described above; thus, parasitic capacitance in the transistor 113 can be reduced. Therefore, the transistor 113 is preferable as a component of a circuit that needs high-speed operation. As illustrated in FIG. 43B, a top surface of the transistor 113 is preferably planarized by chemical mechanical polishing (CMP) or the like, but is not necessarily planarized.

Figure 44A:
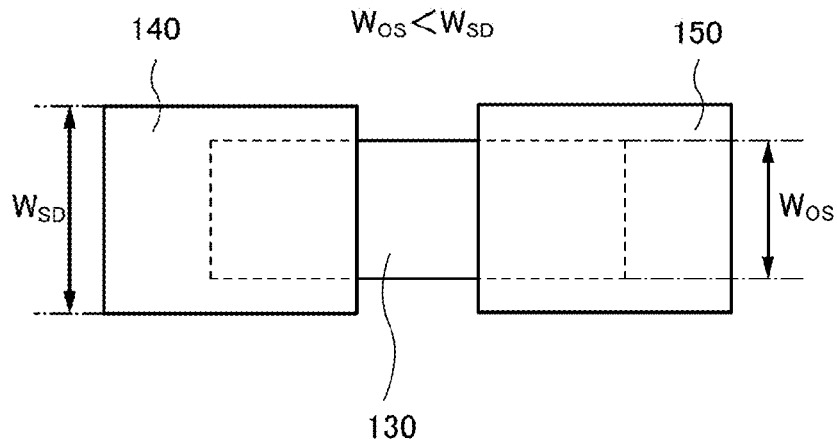
FIGS. 44A to 44C are top views each illustrating a transistor.
Figure 44B:
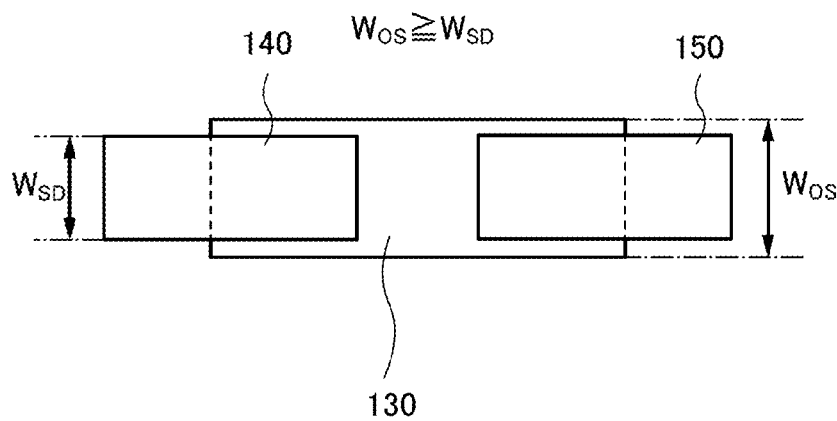
Figure 44C:
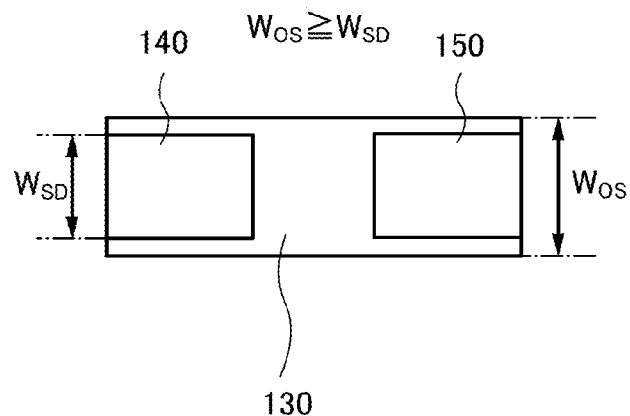

As illustrated in FIGS. 44A and 44B (illustrating only the oxide semiconductor layer 130, the conductive layer 140, and the conductive layer 150), the width ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 44C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 makes current flow to the oxide semiconductor layer 130b. Since current flows to the oxide semiconductor layer 130b, the current is hardly influenced by interface scattering, leading to high on-state current. Therefore, increasing the thickness of the oxide semiconductor layer 130b might increase the on-state current.

With the above structure, electrical characteristics of the transistor can be improved.

The structure described above in this embodiment can be combined with any of the structures described in the other embodiments as appropriate.

(Embodiment 3)

In this embodiment, components of the transistors described in Embodiment 2 are described in detail.

As the substrate 115, a glass substrate, a quartz substrate, a semiconductor substrate, a ceramic substrate, a metal substrate having a surface subjected to insulation treatment, or the like can be used. The substrate 115 can be a silicon substrate provided with a transistor and/or a photodiode; and an insulating layer, a wiring, a conductor functioning as a contact plug, and the like that are provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed using the silicon substrate, a surface of the silicon substrate where the transistor is formed preferably has a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and more preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm³ in TDS analysis. In the TDS analysis, the film surface temperature is higher than or equal to 100° C. and lower than or equal to 700° C., or higher than or equal to 100° C. and lower than or equal to 500° C. In the case where the substrate 115 is provided with another device, the insulating layer 120 also functions as an interlayer insulating film. In that case, the insulating layer 120 is preferably subjected to planarization treatment such as CMP so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

The oxide semiconductor layer 130 of the transistor can have a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which a layer corresponding to the oxide semiconductor layer 130a and a layer corresponding to the oxide semiconductor layer 130b are sequentially stacked from the insulating layer 120 side is used. In such a case, the oxide semiconductor layers 130a and 130b can be replaced with each other.

For the oxide semiconductor layer 130b, for example, an oxide semiconductor whose electron affinity (an energy difference between a vacuum level and the conduction band minimum) is higher than those of the oxide semiconductor layers 130a and 130c is used.

In such a structure, when an electric field is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer such as Al, Ga, Y, or Sn in addition to In and Zn.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film. Therefore, in a region of the oxide semiconductor film that is in contact with any of the above materials, oxygen is released from the oxide semiconductor layer and an oxygen vacancy is formed. Hydrogen slightly contained in the film and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a stacked structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with low off-state current. Examples of the crystal structure include a monoclinic crystal structure and a cubic crystal structure. Note that one embodiment of the present invention is not limited to the above examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide becomes high in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film of which the amount of released ammonia is larger than the amount of released nitrogen oxide in TDS; the amount of released ammonia is typically greater than or equal to $1\times10^{18}$ cm$^{-3}$ and less than or equal to $5\times10^{19}$ cm$^{-3}$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, W, or the like can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the conductive layer 170, an oxide conductive layer of an In—Ga—Zn oxide, zinc oxide, indium oxide, tin oxide, indium tin oxide, or the like may be used.

As the insulating layer 175, a silicon nitride film, an aluminum nitride film, or the like containing hydrogen can be used. In the transistors 103, 104, 106, 109, 110, and 112 described in Embodiment 2, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 2. The aluminum oxide film has a high blocking effect of preventing penetration of both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120.

The insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, miniaturization of a transistor tends to cause deterioration of electrical characteristics of the transistor. For example, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and effective channel width is increased, leading to a further increase in the on-state current.

Although the variety of films such as the metal films, the semiconductor films, and the inorganic insulating films that are described in this embodiment typically can be formed by sputtering or plasma-enhanced CVD, such films may be formed by another method such as thermal CVD. Examples of thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source material gas which is obtained by vaporizing liquid containing a solvent and a hafnium precursor (hafnium alkoxide and a hafnium amide such as tetrakis(dimethylamide)hafnium (TDMAH, $Hf[N(CH_3)_2]_4$) and tetrakis(ethylmethylamide) hafnium) are used.

For example, in the case where an aluminum oxide film is formed by a deposition apparatus using ALD, two kinds of gases, i.e., $H_2O$ as an oxidizer and a source gas which is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with an adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O film is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas which is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in a film can be reduced. In addition, the use of the facing-target-type sputtering apparatus enables low-pressure deposition. Accordingly, the concentration of impurities (e.g., hydrogen, a rare gas (e.g., argon), or water) in a deposited oxide semiconductor layer can be lowered.

The structure described above in this embodiment can be combined with any of the structures described in the other embodiments as appropriate.

(Embodiment 4)

In this embodiment, the material of an oxide semiconductor that can be used for one embodiment of the present invention is described.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide semiconductor according to the present invention are described with reference to FIGS. 45A to 45C. Note that the proportion of oxygen atoms is not shown. The terms of the atomic ratio of indium, the element M, and zinc contained in the oxide semiconductor are denoted by [In], [M], and [Zn], respectively.

Figure 45A:
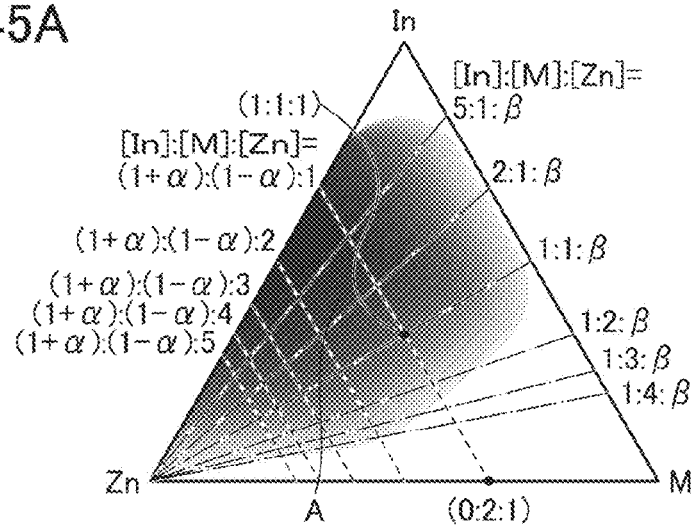
FIGS. 45A to 45C each show the range of the atomic ratio of an oxide semiconductor.
Figure 45B:
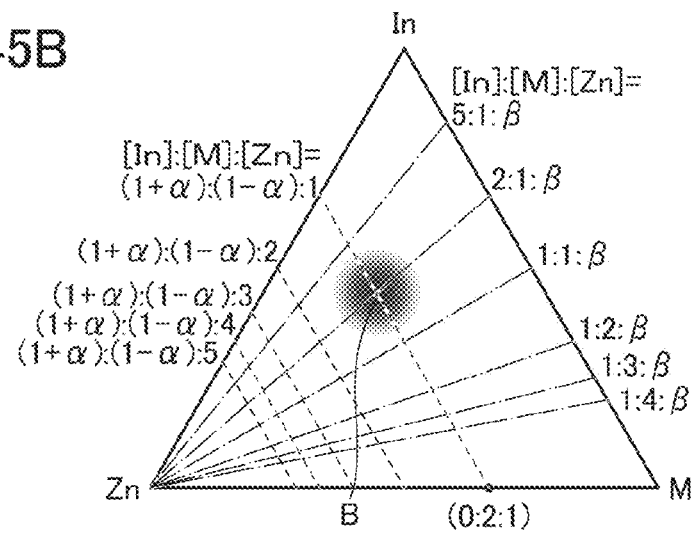
Figure 45C:
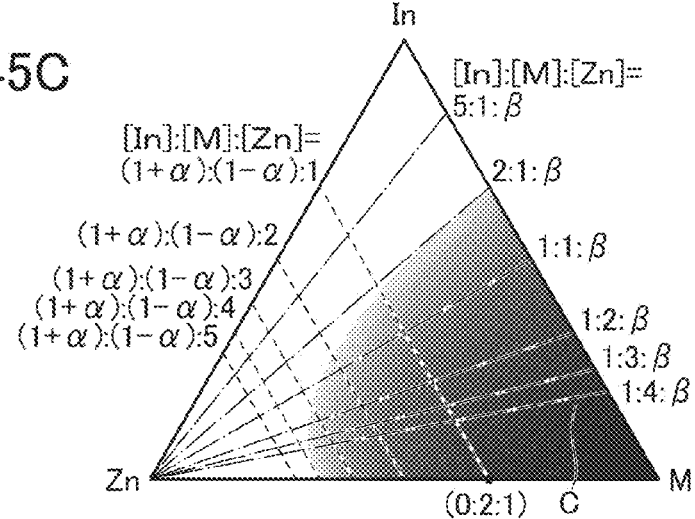

In FIGS. 45A to 45C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

FIGS. 45A and 45B show examples of the preferred ranges of the atomic ratio of indium, the element M, and zinc contained in an oxide semiconductor in one embodiment of the present invention.

Figure 46:
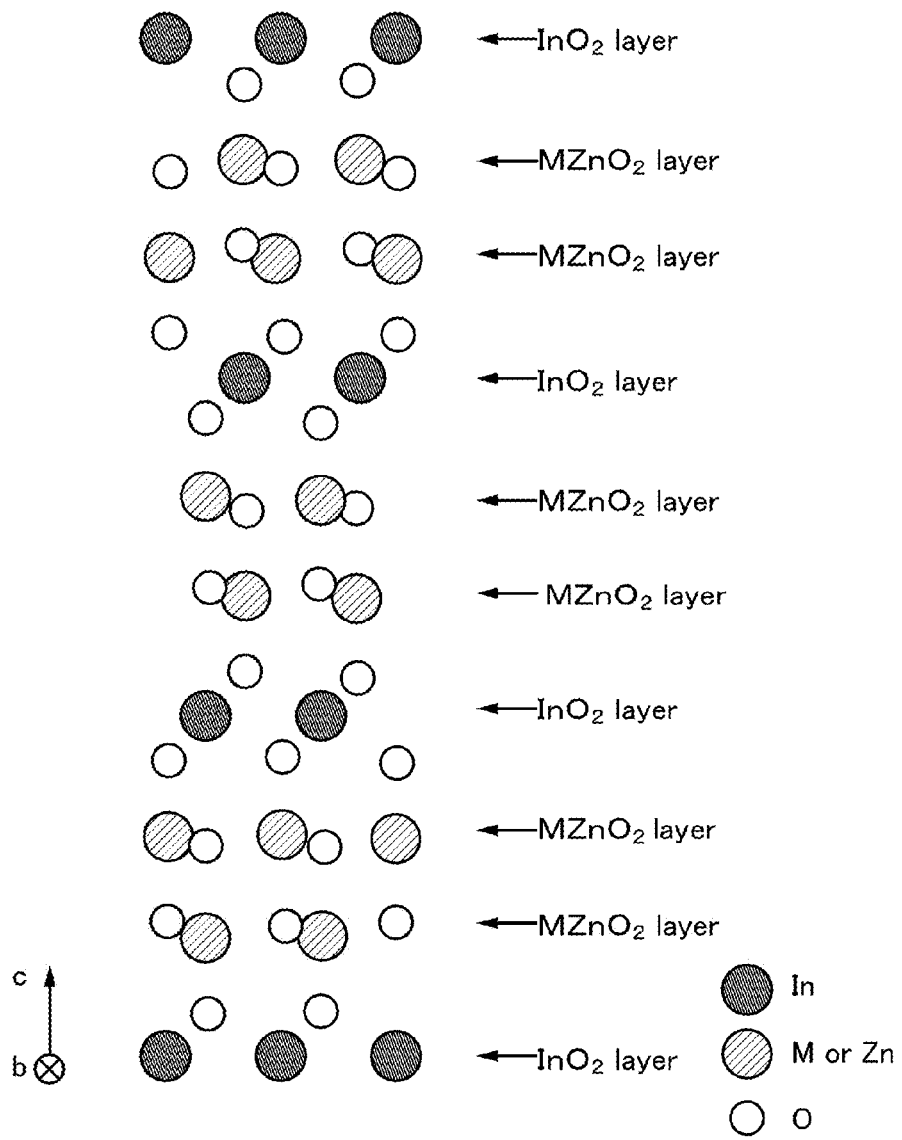
FIG. 46 shows the crystal structure of $InMZnO_4$.

FIG. 46 shows an example of the crystal structure of $InMZnO_4$ whose atomic ratio [In]:[M]:[Zn] is 1:1:1. The crystal structure shown in FIG. 46 is $InMZnO_4$ observed from a direction parallel to a b-axis. Note that a metal element in a layer that contains M, Zn, and oxygen (hereinafter, this layer is referred to as an "(M,Zn) layer") in FIG. 46 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 46.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide semiconductor whose atomic ratio [In]:[M]:[Zn] is 1:1:2 has a layered structure that contains one In layer for every three (M,Zn) layers. In other words, if [Zn] is larger than [In] and [M], the proportion of the (M,Zn) layer to the In layer becomes higher when the oxide semiconductor is crystallized.

Note that in the case where the number of (M,Zn) layers for every In layer is not an integer in the oxide semiconductor, the oxide semiconductor might have plural kinds of layered structures where the number of (M,Zn) layers for every In layer is an integer. For example, in the case of [In]:[M]:[Zn]=1:1:1.5, the oxide semiconductor might have the following layered structures: a layered structure of one In layer for every two (M,Zn) layers and a layered structure of one In layer for every three (M,Zn) layers.

For example, in the case where the oxide semiconductor is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide semiconductor in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide semiconductor, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; therefore, an oxide semiconductor having a high content of indium has higher carrier mobility than an oxide semiconductor having a low content of indium.

In contrast, when the indium content and the zinc content in an oxide semiconductor become lower, carrier mobility becomes lower. Thus, with an atomic ratio of [In]:[M]:[Zn]=0:1:0 and the vicinity thereof (e.g., a region C in FIG. 45C), insulation performance becomes better.

Accordingly, an oxide semiconductor in one embodiment of the present invention preferably has an atomic ratio represented by a region A in FIG. 45A. With the atomic ratio, a layered structure with high carrier mobility and a few grain boundaries is easily obtained.

A region B in FIG. 45B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide semiconductor with an atomic ratio represented by the region B is an excellent oxide semiconductor that has particularly high crystallinity and high carrier mobility.

Note that a condition where an oxide semiconductor forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide semiconductor has a layered structure, and boundaries of the regions A to C are not clear.

Next, the case where the oxide semiconductor is used for a transistor is described.

Note that when the oxide semiconductor is used for a transistor, carrier scattering or the like at a grain boundary can be reduced; thus, the transistor can have high field-effect mobility. In addition, the transistor can have high reliability.

An oxide semiconductor with low carrier density is preferably used for the transistor. For example, an oxide semiconductor whose carrier density is lower than $8 \times 10^{11}/cm^3$, preferably lower than $1 \times 10^{11}/cm^3$, more preferably lower than $1 \times 10^{10}/cm^3$, and greater than or equal to $1 \times 10^{-9}/cm^3$ is used.

A highly purified intrinsic or substantially highly purified intrinsic oxide semiconductor has few carrier generation sources and thus can have a low carrier density. The highly purified intrinsic or substantially highly purified intrinsic oxide semiconductor has a low density of defect states and accordingly has a low density of trap states in some cases.

Charge trapped by the trap states in the oxide semiconductor takes a long time to be released and may behave like fixed charge. Thus, a transistor whose channel region is formed in an oxide semiconductor having a high density of trap states has unstable electrical characteristics in some cases.

In order to obtain stable electrical characteristics of the transistor, it is effective to reduce the concentration of impurities in the oxide semiconductor. In addition, in order to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor is described.

When silicon or carbon that is one of Group 14 elements is contained in the oxide semiconductor, defect states are formed. Thus, the oxide semiconductor is formed to have a region where the concentration of silicon or carbon (measured by secondary ion mass spectrometry (SIMS)) is controlled to be lower than or equal to $2 \times 10^{18}$ atoms/cm$^3$, preferably lower than or equal to $2 \times 10^{17}$ atoms/cm$^3$ in the oxide semiconductor or around an interface with the oxide semiconductor.

When the oxide semiconductor contains alkali metal or alkaline earth metal, defect states are formed and carriers are generated, in some cases. Thus, a transistor including an oxide semiconductor that contains alkali metal or alkaline earth metal is likely to be normally-on. Therefore, it is preferable to reduce the concentration of alkali metal or alkaline earth metal in the oxide semiconductor. Specifically, the oxide semiconductor is formed to have a region where the concentration of alkali metal or alkaline earth metal measured by SIMS is controlled to be lower than or equal to $1 \times 10^{18}$ atoms/cm$^3$, preferably lower than or equal to $2 \times 10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the oxide semiconductor is formed to have a region where the concentration of nitrogen measured by SIMS is, for example, controlled to be lower than $5 \times 10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the oxide semiconductor is formed to have a region where the concentration of hydrogen measured by SIMS is controlled to be lower than $1\times10^{20}$ atoms/cm$^3$, preferably lower than $1\times10^{19}$ atoms/cm$^3$, more preferably lower than $5\times10^{18}$ atoms/cm$^3$, still more preferably lower than $1\times10^{18}$ atoms/cm$^3$.

When an oxide semiconductor with sufficiently reduced impurity concentration is used for a channel formation region in a transistor, the transistor can have stable electrical characteristics. A transistor in which a highly purified oxide semiconductor is used for a channel formation region exhibits extremely low off-state current. When voltage between a source and a drain is set to about 0.1 V, 5 V, or 10 V, for example, the off-state current per channel width of the transistor can be as low as several yoctoamperes per micrometer to several zeptoamperes per micrometer.

Next, the case where the oxide semiconductor has a two-layer structure or a three-layer structure is described. A band diagram of insulators that are in contact with a stacked structure of an oxide semiconductor S1, an oxide semiconductor S2, and an oxide semiconductor S3 and a band diagram of insulators that are in contact with a stacked structure of the oxide semiconductor S2 and the oxide semiconductor S3 are described with reference to FIGS. 47A and 47B. Note that the oxide semiconductor S1, the oxide semiconductor S2, and the oxide semiconductor S3 correspond to the oxide semiconductor layer 130a, the oxide semiconductor layer 130b, and the oxide semiconductor layer 130c, respectively.

Figure 47A:
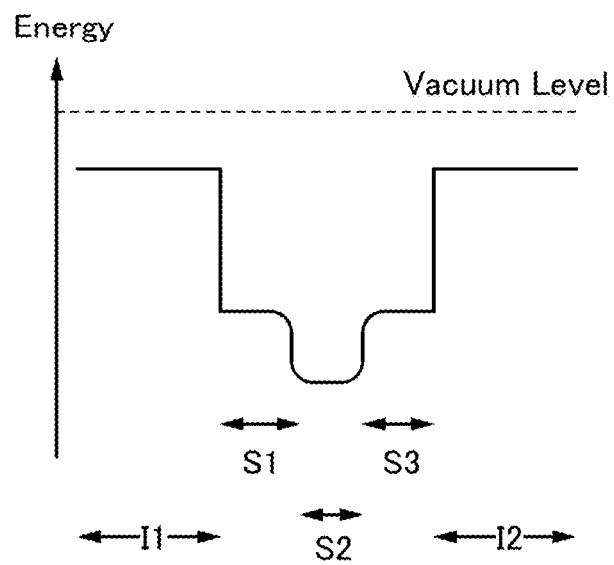
FIGS. 47A and 47B are band diagrams of stacked structures of oxide semiconductors.
Figure 47B:
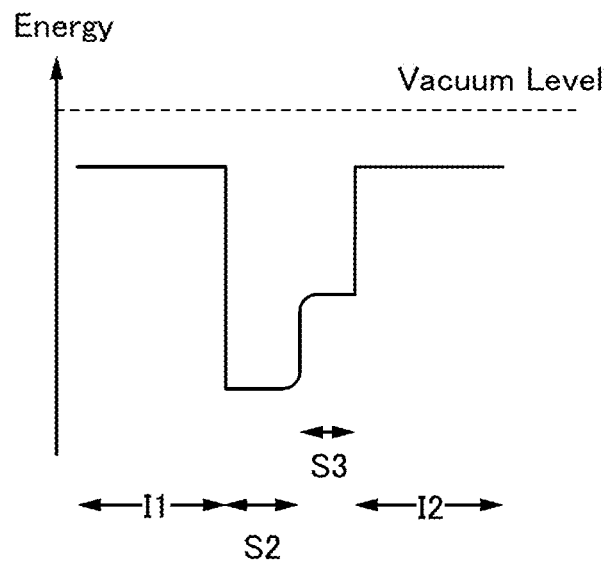

FIG. 47A is an example of a band diagram of a stacked structure including an insulator I1, the oxide semiconductor S1, the oxide semiconductor S2, the oxide semiconductor S3, and an insulator I2 in a film thickness direction. FIG. 47B is an example of a band diagram of a stacked structure including the insulator I1, the oxide semiconductor S2, the oxide semiconductor S3, and the insulator I2 in a film thickness direction. Note that for easy understanding, the band diagrams show the energy level of the conduction band minimum (Ec) of each of the insulator I1, the oxide semiconductor S1, the oxide semiconductor S2, the oxide semiconductor S3, and the insulator I2.

The energy level of the conduction band minimum of each of the oxide semiconductors S1 and S3 is closer to the vacuum level than that of the oxide semiconductor S2. Typically, a difference in energy level between the conduction band minimum of the oxide semiconductor S2 and the conduction band minimum of each of the oxide semiconductors S1 and S3 is preferably greater than or equal to 0.15 eV or greater than or equal to 0.5 eV, and less than or equal to 2 eV or less than or equal to 1 eV. That is, the electron affinity of the oxide semiconductor S2 is higher than the electron affinity of each of the oxide semiconductors S1 and S3, and the difference between the electron affinity of each of the oxide semiconductors S1 and S3 and the electron affinity of the oxide semiconductor S2 is greater than or equal to 0.15 eV or greater than or equal to 0.5 eV, and less than or equal to 2 eV or less than or equal to 1 eV.

As shown in FIGS. 47A and 47B, the energy level of the conduction band minimum of each of the oxide semiconductors S1 to S3 is gradually varied. In other words, the energy level of the conduction band minimum is continuously varied or continuously connected. In order to obtain such a band diagram, the density of defect states in a mixed layer formed at an interface between the oxide semiconductors S1 and S2 or an interface between the oxide semiconductors S2 and S3 is preferably made low.

Specifically, when the oxide semiconductors S1 and S2 or the oxide semiconductors S2 and S3 contain the same element (as a main component) in addition to oxygen, a mixed layer with a low density of defect states can be formed. For example, in the case where the oxide semiconductor S2 is an In—Ga—Zn oxide semiconductor, it is preferable to use an In—Ga—Zn oxide semiconductor, a Ga—Zn oxide semiconductor, gallium oxide, or the like as each of the oxide semiconductors S1 and S3.

At this time, the oxide semiconductor S2 serves as a main carrier path. Since the density of defect states at the interface between the oxide semiconductors S1 and S2 and the interface between the oxide semiconductors S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxide semiconductors S1 and S3 can make the trap state apart from the oxide semiconductor S2. This structure can prevent the positive shift of the threshold voltage of the transistor.

A material whose conductivity is sufficiently lower than that of the oxide semiconductor S2 is used for the oxide semiconductors S1 and S3. In that case, the oxide semiconductor S2, the interface between the oxide semiconductors S1 and S2, and the interface between the oxide semiconductors S2 and S3 mainly function as a channel region. For example, an oxide semiconductor with high insulation performance and the atomic ratio represented by the region C in FIG. 45C may be used.

In the case where an oxide semiconductor with the atomic ratio represented by the region A is used as the oxide semiconductor S2, it is particularly preferable to use an oxide semiconductor with an atomic ratio where [M]/[In] is greater than or equal to 1, preferably greater than or equal to 2 as each of the oxide semiconductors S1 and S3. In addition, it is suitable to use an oxide semiconductor with sufficiently high insulation performance and an atomic ratio where [M]/([Zn]+[In]) is greater than or equal to 1 as the oxide semiconductor S3.

The structure described above in this embodiment can be combined with any of the structures described in the other embodiments as appropriate.

(Embodiment 5)

The structure of an oxide semiconductor that can be used for one embodiment of the present invention is described below.

In this specification, the term "parallel" indicates that the angle formed between two straight lines is greater than or equal to −10° and less than or equal to 10°, and accordingly includes the case where the angle is greater than or equal to −5° and less than or equal to 5°. The term "perpendicular"

indicates that an angle formed between two straight lines is greater than or equal to 80° and less than or equal to 100°, and accordingly includes the case where the angle is greater than or equal to 85° and less than or equal to 95°.

In this specification, the trigonal and rhombohedral crystal systems are included in the hexagonal crystal system.
<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is an oxide semiconductor having a plurality of c-axis aligned crystal parts (also referred to as pellets).

Figure 48A:
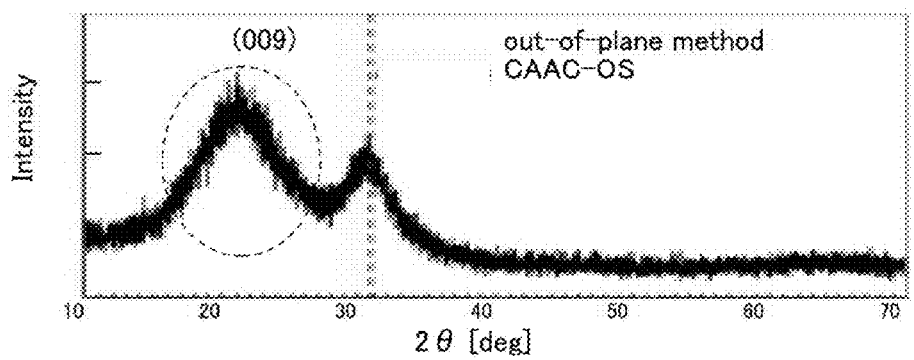
FIGS. 48A to 48E show structural analysis results of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 48A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 48B:
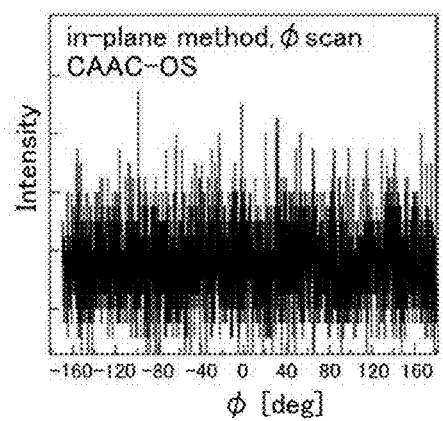
Figure 48C:
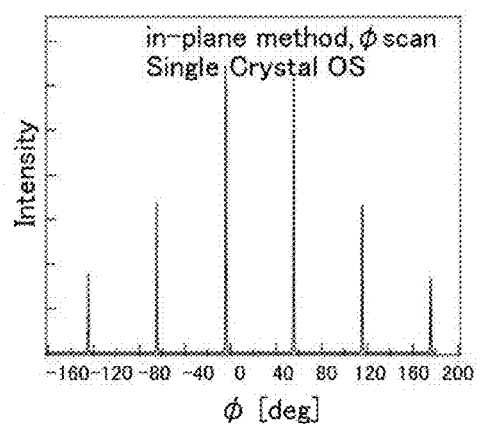

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the InGaZnO$_4$ crystal. When analysis (φ scan) is performed with 2θ fixed at around 56° and with the sample rotated using a normal vector to the sample surface as an axis (φ axis), as shown in FIG. 48B, a peak is not clearly observed. In contrast, in the case where single crystal InGaZnO$_4$ is subjected to φ scan with 2θ fixed at around 56°, as shown in FIG. 48C, six peaks which are derived from crystal planes equivalent to the (110) plane are observed. Accordingly, the structural analysis using XRD shows that the directions of a-axes and b-axes are irregularly oriented in the CAAC-OS.

Figure 48D:
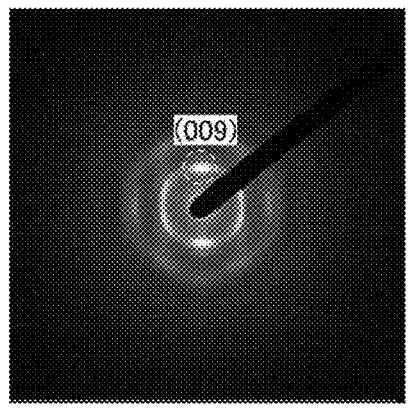
Figure 48E:
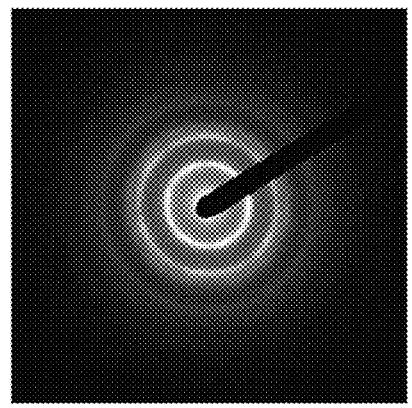

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 48D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 48E shows a diffraction pattern obtained in such a manner that an electron beam with a probe diameter of 300 nm is incident on the same sample in a direction perpendicular to the sample surface. As shown in FIG. 48E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 48E is considered to be derived from the (010) plane, the (100) plane, and the like of the InGaZnO$_4$ crystal. The second ring in FIG. 48E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 49A:
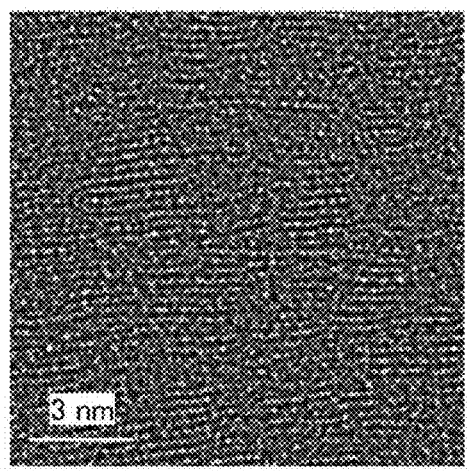
FIGS. 49A to 49E show a cross-sectional TEM image and plan-view TEM images of a CAAC-OS and images obtained through analysis thereof.

FIG. 49A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 49A shows pellets in which metal atoms are arranged in a layered manner. FIG. 49A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 49B:
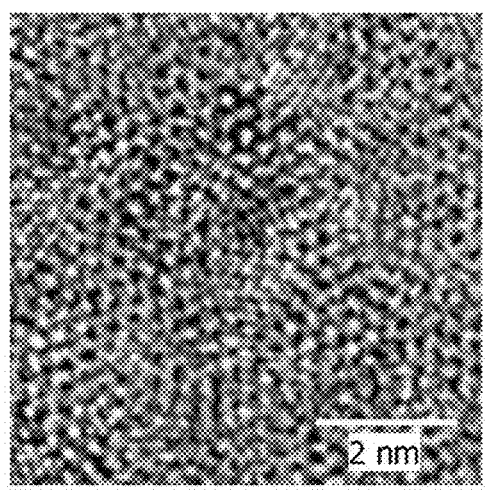
Figure 49C:
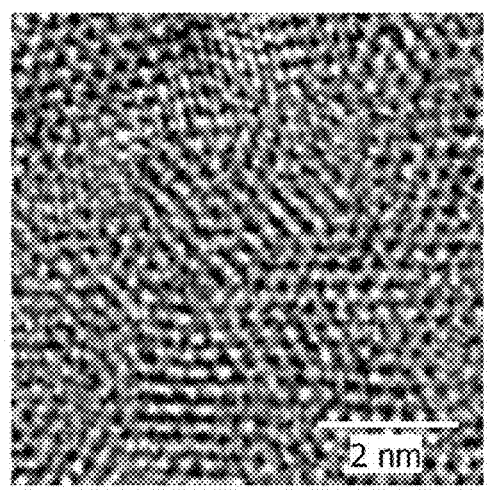
Figure 49D:
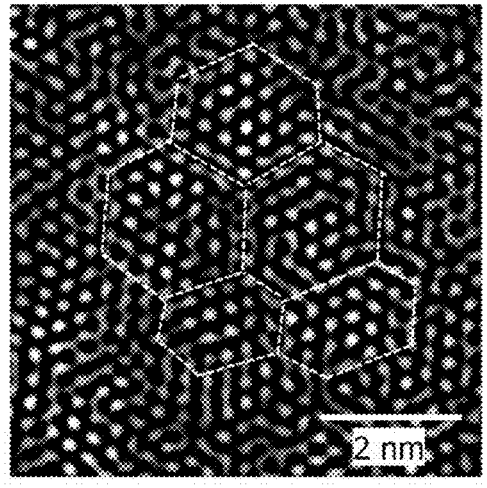
Figure 49E:
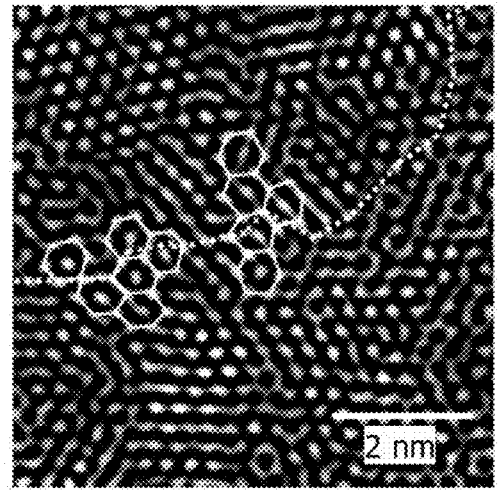

FIGS. 49B and 49C show Cs-corrected high-resolution TEM images of a plane of the CAAC-OS observed from a direction substantially perpendicular to the sample surface. FIGS. 49D and 49E are images obtained through image processing of FIGS. 49B and 49C. The method of image processing is as follows. The image in FIG. 49B is subjected to fast Fourier transform (FFT), so that an FFT image is obtained. Then, mask processing is performed such that a range of from 2.8 to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 49D, a portion where a lattice arrangement is broken is shown by a dashed line. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 49E, a dotted line denotes a portion between a region where a lattice arrangement is well aligned and another region where a lattice arrangement is well aligned. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of interatomic distance in an a-b plane direction, an interatomic distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density (specifically, lower than $8\times10^{11}$ cm$^{-3}$, preferably lower than $1\times10^{11}$ cm$^{-3}$, more preferably lower than $1\times10^{10}$ cm$^{-3}$, and is higher than or equal to $1\times10^{-9}$ cm$^{-3}$). Such an oxide semiconductor is referred to as a highly purified intrinsic or substantially highly purified intrinsic oxide semiconductor. A CAAC-OS has a low impurity concentration and a low density of defect states. That is, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, for example, a peak indicating orientation does not appear. That is, a crystal of an nc-OS does not have orientation.

Figure 50A:
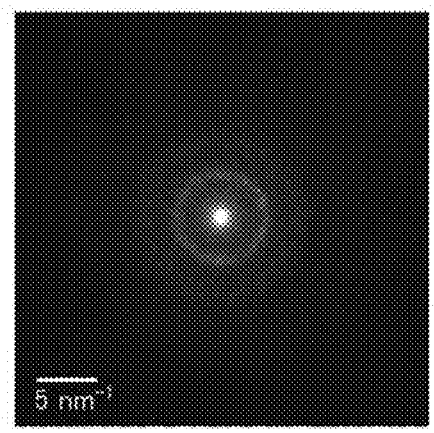
FIGS. 50A to 50D show electron diffraction patterns and a cross-sectional TEM image of an nc-OS.
Figure 50B:
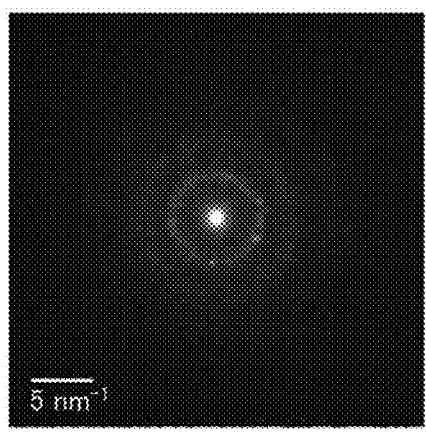

For example, when an electron beam with a probe diameter of 50 nm is incident on a 34-nm-thick region of a thinned nc-OS including an InGaZnO$_4$ crystal in a direction parallel to the formation surface, a ring-shaped diffraction pattern (nanobeam electron diffraction pattern) shown in FIG. 50A is observed. FIG. 50B shows a diffraction pattern obtained when an electron beam with a probe diameter of 1 nm is incident on the same sample. As shown in FIG. 50B, a plurality of spots are observed in a ring-like region. In other words, ordering in an nc-OS is not observed with an electron beam with a probe diameter of 50 nm but is observed with an electron beam with a probe diameter of 1 nm.

Figure 50C:
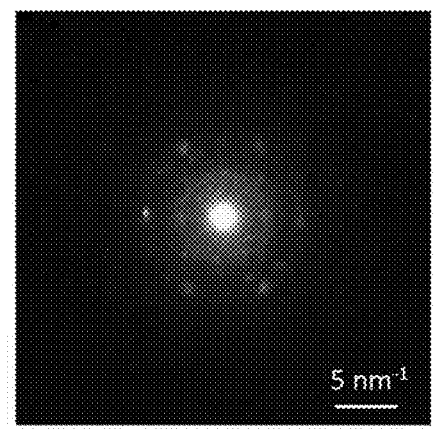

Furthermore, an electron diffraction pattern in which spots are arranged in an approximately regular hexagonal shape is observed in some cases as shown in FIG. 50C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 50D:
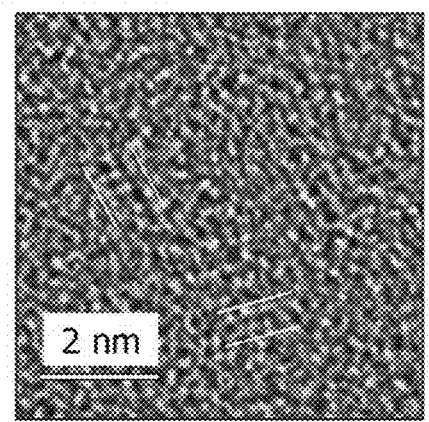

FIG. 50D shows a Cs-corrected high-resolution TEM image of a cross section of an nc-OS observed from the direction substantially parallel to the formation surface. In a high-resolution TEM image, an nc-OS has a region in which a crystal part is observed, such as a part indicated by additional lines in FIG. 50D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS might be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity than an amorphous oxide semiconductor. Thus, the nc-OS has a lower density of defect states than the a-like OS and the amorphous oxide semiconductor. Note that there is no regularity of crystal orientation between different pellets in the nc-OS; thus, the nc-OS has a higher density of defect states than the CAAC-OS.

<a-Like OS>

An a-like OS is an oxide semiconductor having a structure between the nc-OS and the amorphous oxide semiconductor.

FIGS. 51A and 51B are high-resolution cross-sectional TEM images of an a-like OS. FIG. 51A is the high-resolution cross-sectional TEM image of the a-like OS at the start of electron irradiation. FIG. 51B is the high-resolution cross-sectional TEM image of a-like OS after electron ($e^-$) irradiation at $4.3 \times 10^8$ $e^-/nm^2$. FIGS. 51A and 51B show that stripe-like bright regions extending vertically are observed in the a-like OS from the start of electron irradiation. It can be also found that the shape of the bright region changes after electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as a d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 52:
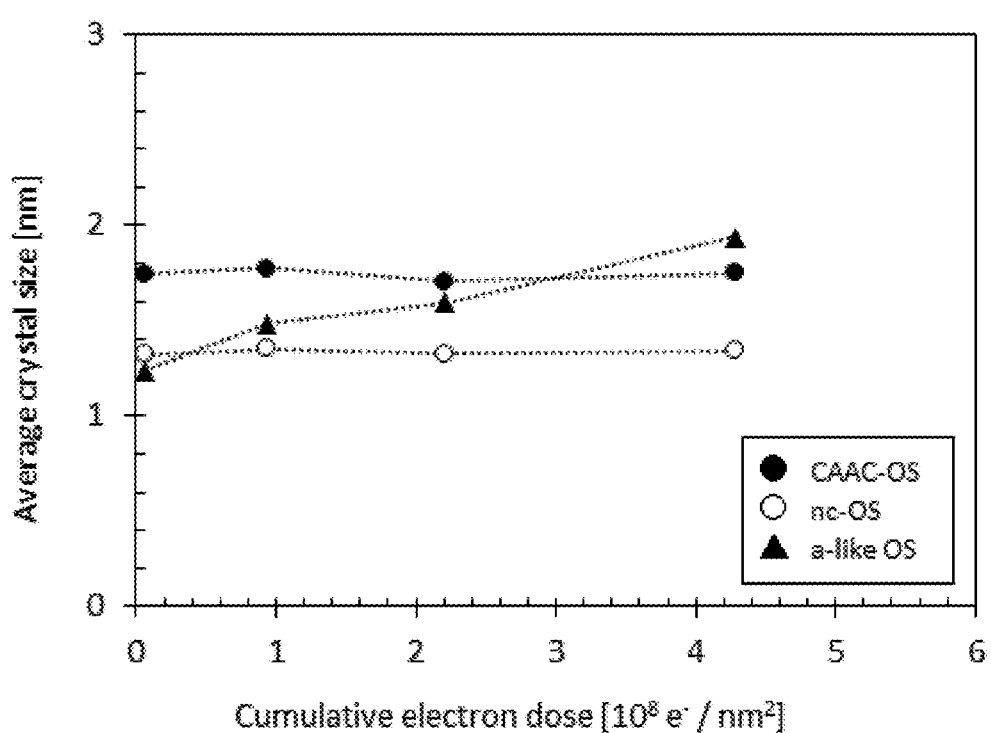
FIG. 52 shows changes in crystal parts of In—Ga—Zn oxides induced by electron irradiation.

FIG. 52 shows a change in the average size of crystal parts (at 22 to 30 points) in each sample. Note that the crystal part size corresponds to the length of the lattice fringe. FIG. 52 indicates that the crystal part size in the a-like OS increases with an increase in the cumulative electron dose in obtaining TEM images, for example. As shown in FIG. 52, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part sizes in the nc-OS and the CAAC-OS show little change from the start of electron irradiation to a cumulative electron dose of $4.2 \times 10^8$ $e^-/nm^2$. As shown in FIG. 52, the crystal part sizes in the nc-OS and the CAAC-OS are approximately 1.3 nm and approximately 1.8 nm, respectively, regardless of the cumulative electron dose. For electron beam irradiation and TEM observation, a Hitachi H-9000NAR transmission electron microscope was used. The conditions of electron beam irradiation were as follows: accelerating voltage was 300 kV; current density was $6.7 \times 10^5 e^-/(nm^2 \cdot s)$; and the diameter of an irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor with an atomic ratio of In:Ga:Zn=1:1:1, the density of an a-like OS is higher than or equal to 5.0 g/cm$^3$ and lower than 5.9 g/cm$^3$. In addition, for example, in the case of the oxide semiconductor with an atomic ratio of In:Ga:Zn=1:1:1, the density of an nc-OS or a CAAC-OS is higher than or equal to 5.9 g/cm$^3$ and lower than 6.3 g/cm$^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example.

The structure described above in this embodiment can be combined with any of the structures described in the other embodiments as appropriate.

(Embodiment 6)

In this embodiment, examples of a package and a camera module each including an image sensor chip are described. For the image sensor chip, the structure of an imaging device in one embodiment of the present invention can be used.

Figure 53A:
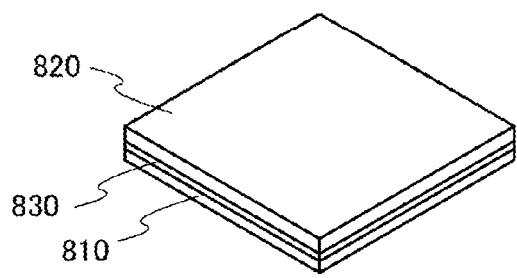
FIGS. 53A to 53D are perspective views and a cross-sectional view illustrating a package including an imaging device.

FIG. 53A is an external perspective view showing the top surface side of a package including an image sensor chip. The package includes a package substrate 810 to which an image sensor chip 850 is fixed, a cover glass 820, an adhesive 830 for bonding the package substrate 810 to the cover glass 820, and the like.

Figure 53B:
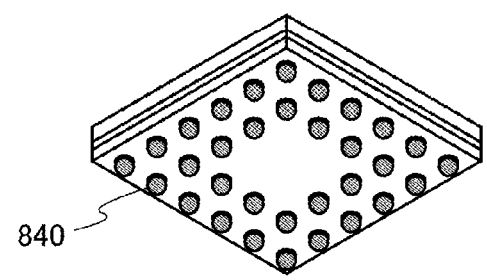

FIG. 53B is an external perspective view showing the bottom surface side of the package. On the bottom surface of the package, ball grid array (BGA) including solder balls as bumps 840 is formed. Although BGA is employed here, land grid array (LGA), pin grid array (PGA), or the like may be alternatively employed.

Figure 53C:
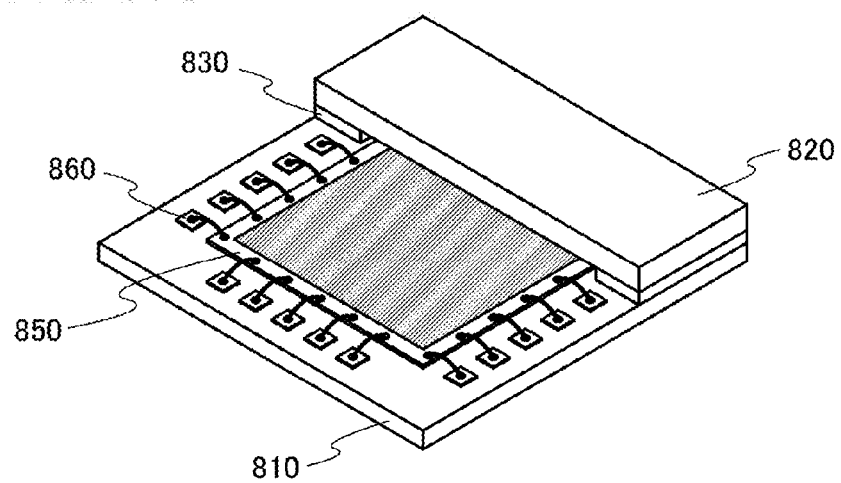
Figure 53D:
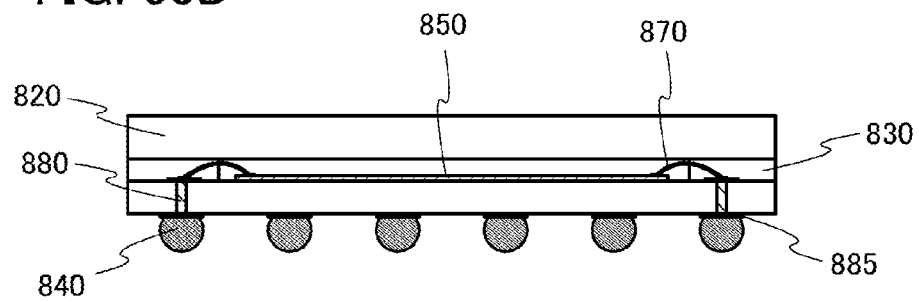

FIG. 53C is a perspective view of the package, in which the cover glass 820 and the adhesive 830 are partly illustrated. FIG. 53D is a cross-sectional view of the package. Electrode pads 860 are formed over the package substrate 810, and electrically connected to the bumps 840 through through-holes 880 and lands 885. The electrode pads 860 are electrically connected to electrodes of the image sensor chip 850 through wires 870.

Figure 54A:
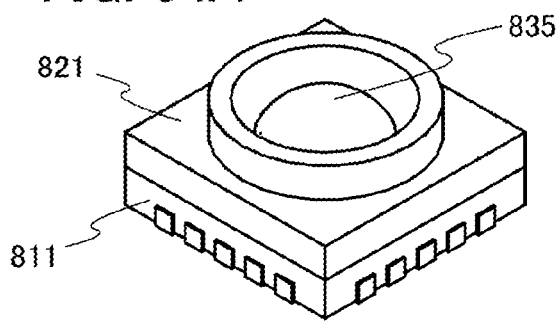
FIGS. 54A to 54D are perspective views and a cross-sectional view illustrating a package including an imaging device.

FIG. 54A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 that functions as a driver circuit, a signal conversion circuit, and the like of an imaging device is provided between the package substrate 811 and the image sensor chip 851. Thus, a system in package (SiP) is formed.

Figure 54B:
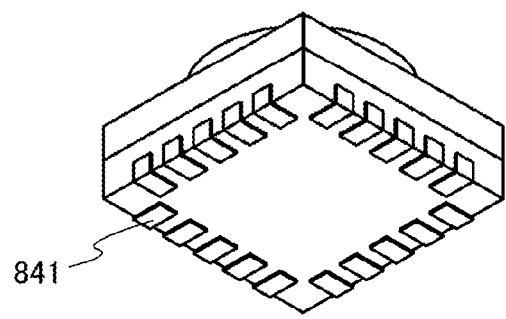

FIG. 54B is an external perspective view showing the bottom surface side of the camera module. On the bottom surface and four side surfaces of the package substrate 811, mounting lands 841 are provided; this structure is called a quad flat no-lead package (QFN). Although QFN is employed here, a quad flat package (QFP), the BGA, or the like may be alternatively employed.

Figure 54C:
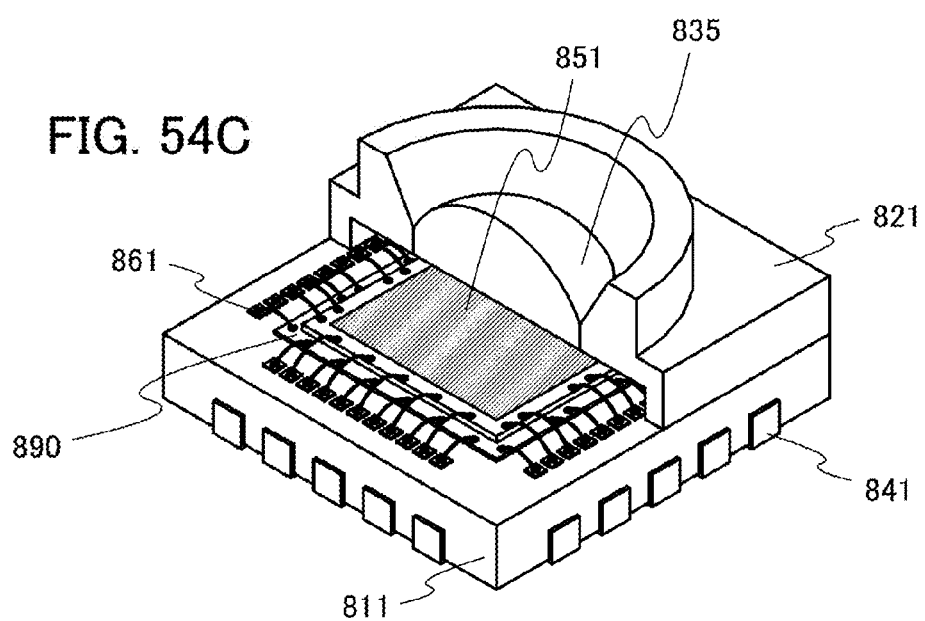
Figure 54D:
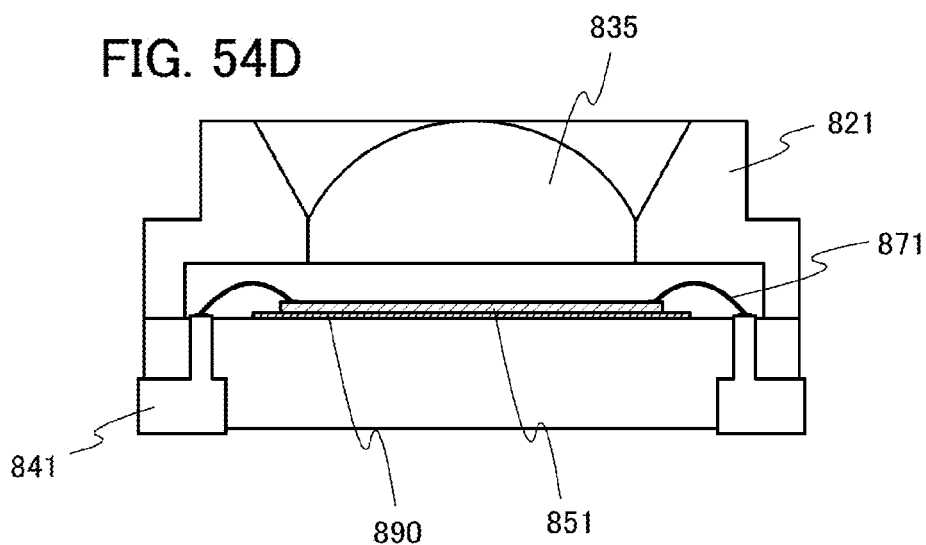

FIG. 54C is a perspective view of the module, in which the lens cover 821 and the lens 835 are partly illustrated. FIG. 54D is a cross-sectional view of the camera module. The lands 841 are partly used as electrode pads 861. The electrode pads 861 are electrically connected to electrodes of the image sensor chip 851 and the IC chip 890 through wires 871.

The image sensor chip can be easily mounted on a printed circuit board or the like by being provided in the package with the above structure, and can be incorporated into a variety of semiconductor devices or electronic devices.

The structure described above in this embodiment can be combined with any of the structures described in the other embodiments as appropriate.

(Embodiment 7)

Examples of an electronic device that can use the imaging device in one embodiment of the present invention or a semiconductor device including the imaging device include display devices, personal computers, image storage devices or image reproducing devices provided with storage media, cellular phones, game machines (including portable game machines), portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 55A to 55F illustrate specific examples of these electronic devices.

Figure 55A:
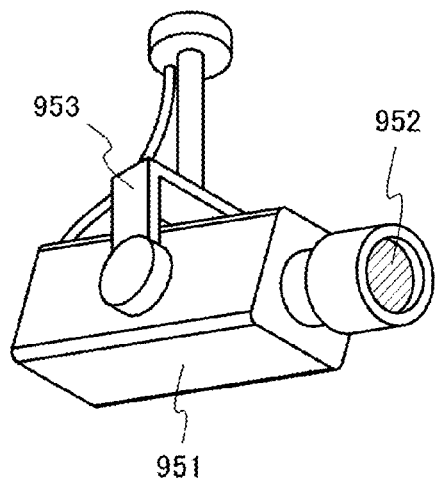
FIGS. 55A to 55F illustrate electronic devices.

FIG. 55A illustrates a monitoring camera, which includes a housing 951, a lens 952, a support 953, and the like. The imaging device in one embodiment of the present invention can be included as a component for obtaining an image in the monitoring camera. Note that a "monitoring camera" is a common name and does not limit the use. For example, a device that functions a monitoring camera can also be called a camera or a video camera.

Figure 55B:
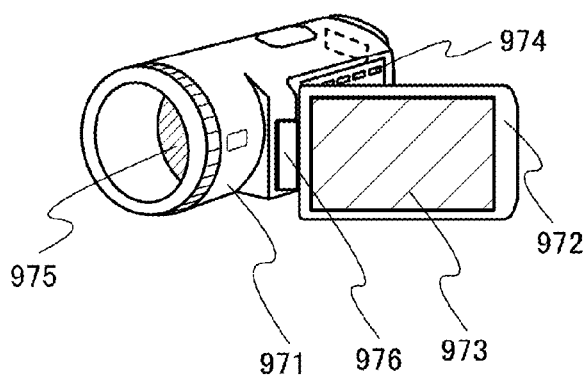

FIG. 55B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The imaging device in one embodiment of the present invention can be included as a component for obtaining an image in the video camera.

Figure 55C:
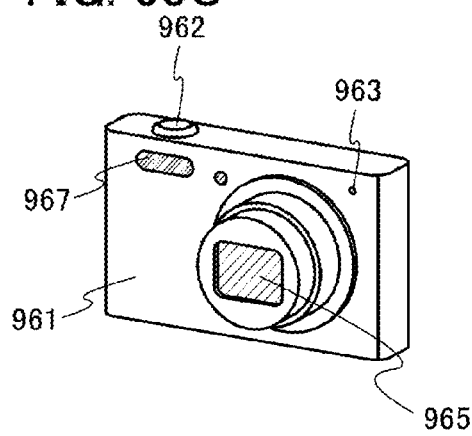

FIG. 55C illustrates a digital camera, which includes a housing 961, a shutter button 962, a microphone 963, a light-emitting portion 967, a lens 965, and the like. The imaging device in one embodiment of the present invention can be included as a component for obtaining an image in the digital camera.

Figure 55D:
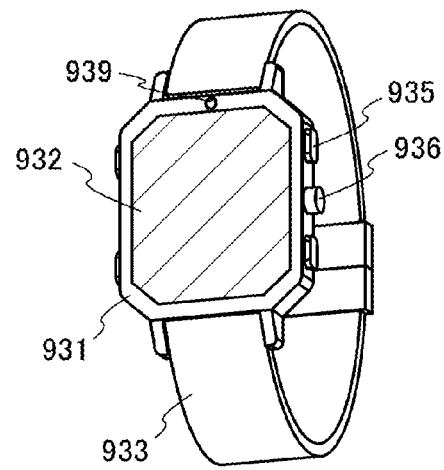

FIG. 55D illustrates a wrist-watch-type information terminal, which includes a housing 931, a display portion 932, a wristband 933, operation buttons 935, a winder 936, a camera 939, and the like. The display portion 932 may be a touch panel. The imaging device in one embodiment of the present invention can be included as a component for obtaining an image in the information terminal.

Figure 55E:
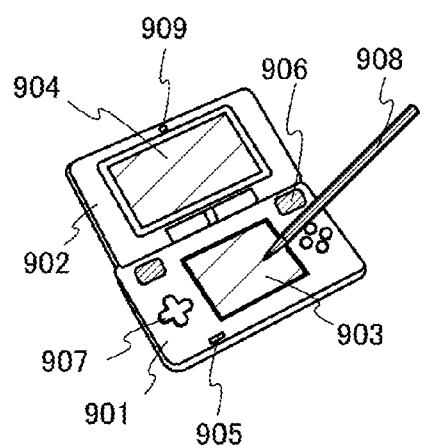

FIG. 55E illustrates a portable game machine, which includes housings 901 and 902, display portions 903 and 904, a microphone 905, speakers 906, an operation key 907, a stylus 908, a camera 909, and the like. Although the portable game machine in FIG. 55E has the two display portions 903 and 904, the number of display portions included in the portable game machine is not limited thereto. The imaging device in one embodiment of the present invention can be included as a component for obtaining an image in the portable game machine.

Figure 55F:
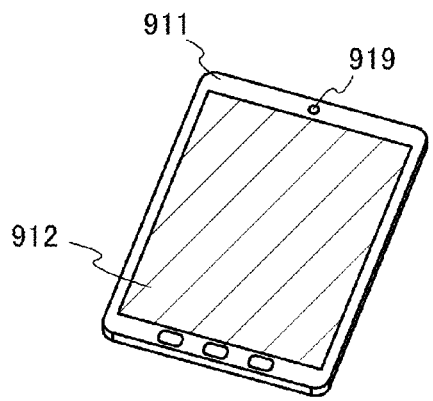

FIG. 55F illustrates a portable data terminal, which includes a housing 911, a display portion 912, a camera 919, and the like. A touch panel function of the display portion 912 enables input and output of information. The imaging device in one embodiment of the present invention can be included as a component for obtaining an image in the portable data terminal.

This embodiment can be combined with any of the other embodiments described in this specification as appropriate.

This application is based on Japanese Patent Application serial No. 2015-201066 filed with Japan Patent Office on Oct. 9, 2015, the entire contents of which are hereby incorporated by reference.

What is claimed is:

1. An imaging device comprising:
   a first transistor including a first oxide semiconductor in a region where a channel is formed;
   a second transistor including a second oxide semiconductor in a region where a channel is formed;
   a third transistor including a third oxide semiconductor in a region where a channel is formed;
   a fourth transistor;
   a fifth transistor;
   a first capacitor;
   a second capacitor, and
   a photoelectric conversion element, one electrode of the photoelectric conversion element being directly connected to one of a source and a drain of the first transistor and electrically connected to one electrode of the first capacitor, and the other electrode of the photoelectric conversion element is electrically connected to one of a source and a drain of the second transistor;
   wherein the other of the source and the drain of the first transistor is electrically connected to one of a source and a drain of the third transistor and one electrode of the second capacitor, and directly connected to a gate of the fourth transistor,
   wherein one of a source and a drain of the fourth transistor is electrically connected to one of a source and a drain of the fifth transistor, and
   wherein the photoelectric conversion element contains selenium or a compound containing selenium in a photoelectric conversion layer.

2. The imaging device according to claim 1, wherein the fourth transistor and the fifth transistor each include an oxide semiconductor in a region where a channel is formed.

3. The imaging device according to claim 1, wherein each of the first oxide semiconductor, the second oxide semiconductor, and the third oxide semiconductor includes In, Zn, and M, where M is Al, Ga, Y, or Sn.

4. A module comprising:
the imaging device according to claim 1; and
a lens.

5. An electronic device comprising:
the imaging device according to claim 1; and
a display device.

6. The imaging device according to claim 1, wherein the one electrode of the photoelectric conversion element is directly connected to the one electrode of the first capacitor.

7. The imaging device according to claim 1, wherein the other of the source and the drain of the first transistor is directly connected to the one electrode of the second capacitor.

8. An imaging device comprising:
a first pixel including a first transistor, a second transistor, a third transistor, a fourth transistor, a fifth transistor, a first photoelectric conversion element, a first capacitor, and a second capacitor; and
a second pixel including a sixth transistor, a seventh transistor, the third transistor, the fourth transistor, the fifth transistor, a second photoelectric conversion element, a third capacitor, and the second capacitor,
wherein one electrode of the first photoelectric conversion element is electrically connected to one of a source and a drain of the first transistor and one electrode of the first capacitor,
wherein the other electrode of the first photoelectric conversion element is electrically connected to one of a source and a drain of the second transistor,
wherein the other of the source and the drain of the first transistor is electrically connected to one of a source and a drain of the third transistor, one electrode of the second capacitor, and a gate of the fourth transistor,
wherein one of a source and a drain of the fourth transistor is electrically connected to one of a source and a drain of the fifth transistor,
wherein one electrode of the second photoelectric conversion element is electrically connected to one of a source and a drain of the sixth transistor and one electrode of the third capacitor,
wherein the other electrode of the second photoelectric conversion element is electrically connected to one of a source and a drain of the seventh transistor,
wherein the other of the source and the drain of the sixth transistor is electrically connected to one of a source and a drain of the third transistor, the one electrode of the second capacitor, and the gate of the fourth transistor, and
wherein the first transistor, the second transistor, the third transistor, the sixth transistor, and the seventh transistor each include an oxide semiconductor in a region where a channel is formed.

9. The imaging device according to claim 8, wherein a gate of the second transistor is electrically connected to a gate of the seventh transistor.

10. The imaging device according to claim 8, wherein the first photoelectric conversion element and the second photoelectric conversion element each contain selenium or a compound containing selenium in a photoelectric conversion layer.

11. The imaging device according to claim 8, wherein the fourth transistor and the fifth transistor each include an oxide semiconductor in a region where a channel is formed.

12. The imaging device according to claim 8, wherein the oxide semiconductor includes In, Zn, and M, where M is Al, Ga, Y, or Sn.

13. A module comprising:
the imaging device according to claim 8; and
a lens.

14. An electronic device comprising:
the imaging device according to claim 8; and
a display device.

15. An imaging device comprising:
a first pixel including a first transistor, a second transistor, a third transistor, a fourth transistor, a first photoelectric conversion element, a first capacitor, and a second capacitor; and
a second pixel including a fifth transistor, a sixth transistor, the third transistor, the fourth transistor, a second photoelectric conversion element, a third capacitor, and the second capacitor,
wherein one electrode of the first photoelectric conversion element is electrically connected to one of a source and a drain of the first transistor and one electrode of the first capacitor,
wherein the other electrode of the first photoelectric conversion element is electrically connected to one of a source and a drain of the second transistor,
wherein the other of the source and the drain of the first transistor is electrically connected to one electrode of the second capacitor and a gate of the third transistor,
wherein one of a source and a drain of the third transistor is electrically connected to one of a source and a drain of the fourth transistor,
wherein one electrode of the second photoelectric conversion element is electrically connected to one of a source and a drain of the fifth transistor and one electrode of the third capacitor,
wherein the other electrode of the second photoelectric conversion element is electrically connected to one of a source and a drain of the sixth transistor,
wherein the other of the source and the drain of the fifth transistor is electrically connected to the one electrode of the second capacitor and the gate of the third transistor, and
wherein the first transistor, the second transistor, the fifth transistor, and the sixth transistor each include an oxide semiconductor in a region where a channel is formed.

16. The imaging device according to claim 15, wherein the first photoelectric conversion element and the second photoelectric conversion element each contain selenium or a compound containing selenium in a photoelectric conversion layer.

17. The imaging device according to claim 15, wherein the third transistor and the fourth transistor each include an oxide semiconductor in a region where a channel is formed.

18. The imaging device according to claim 15, wherein the oxide semiconductor includes In, Zn, and M, where M is Al, Ga, Y, or Sn.

19. A module comprising:
the imaging device according to claim 15; and
a lens.

20. An electronic device comprising:
the imaging device according to claim 15; and
a display device.

* * * * *